(12) United States Patent
Tanaka et al.

(10) Patent No.: US 11,121,149 B2
(45) Date of Patent: Sep. 14, 2021

(54) THREE-DIMENSIONAL MEMORY DEVICE CONTAINING DIRECT CONTACT DRAIN-SELECT-LEVEL SEMICONDUCTOR CHANNEL PORTIONS AND METHODS OF MAKING THE SAME

(71) Applicant: SANDISK TECHNOLOGIES LLC, Addison, TX (US)

(72) Inventors: Hiroyuki Tanaka, Yokkaichi (JP); Sayako Nagamine, Yokkaichi (JP); Akihisa Sai, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 66 days.

(21) Appl. No.: 16/211,387

(22) Filed: Dec. 6, 2018

(65) Prior Publication Data
US 2020/0051995 A1   Feb. 13, 2020

Related U.S. Application Data

(60) Provisional application No. 62/715,887, filed on Aug. 8, 2018.

(51) Int. Cl.
| | |
|---|---|
| *H01L 27/11582* | (2017.01) |
| *H01L 29/06* | (2006.01) |
| *H01L 27/11524* | (2017.01) |
| *H01L 27/1157* | (2017.01) |
| *H01L 29/423* | (2006.01) |

(Continued)

(52) U.S. Cl.
CPC .... *H01L 27/11582* (2013.01); *H01L 27/1157* (2013.01); *H01L 27/11524* (2013.01);
(Continued)

(58) Field of Classification Search
CPC ........ H01L 27/11582; H01L 27/11556; H01L 29/40117; H01L 29/4234; H01L 27/11524; H01L 27/1157; H01L 29/0649
See application file for complete search history.

(56) References Cited

U.S. PATENT DOCUMENTS

| | | | |
|---|---|---|---|
| 5,915,167 A | 6/1999 | Leedy | |
| 9,679,907 B1 * | 6/2017 | Kaneko | ............ H01L 21/31111 |
| 2016/0111437 A1 * | 4/2016 | Pang | ................. H01L 21/76877 |
| | | | 257/324 |

OTHER PUBLICATIONS

U.S. Appl. No. 15/888,714, filed Feb. 5, 2018, SanDisk Technologies LLC.

(Continued)

*Primary Examiner* — Amar Movva
(74) *Attorney, Agent, or Firm* — The Marbury Law Group PLLC

(57) ABSTRACT

An alternating stack of insulating layers and word-line-level spacer material layers is formed over a substrate. Memory opening fill structures including a respective memory film, a respective word-line-level semiconductor channel portion, a respective word-line-level dielectric core laterally, and a respective sacrificial dielectric material portion are formed through the alternating stack. Drain-select-level material layers are formed over the alternating stack and the memory opening fill structures. Drain-select-level openings are formed through the drain-select-level material layers and over the memory opening fill structures. The sacrificial dielectric material portions are removed selective to the word-line-level semiconductor channel portions underneath the drain-select-level openings. Drain-select-level semiconductor channel portions are formed directly on a respective one of the word-line-level semiconductor channel portions.

11 Claims, 47 Drawing Sheets

(51) Int. Cl.
*H01L 27/11556* (2017.01)
*H01L 21/28* (2006.01)
*H01L 21/02* (2006.01)

(52) U.S. Cl.
CPC .... *H01L 27/11556* (2013.01); *H01L 29/0649* (2013.01); *H01L 29/40117* (2019.08); *H01L 29/4234* (2013.01); *H01L 21/0217* (2013.01); *H01L 21/0228* (2013.01); *H01L 21/02271* (2013.01)

(56) References Cited

OTHER PUBLICATIONS

U.S. Appl. No. 15/906,109, filed Feb. 27, 2018, SanDisk Technologies LLC.
U.S. Appl. No. 16/019,821, filed Jun. 27, 2018, SanDisk Technologies LLC.
U.S. Appl. No. 16/019,856, filed Jun. 27, 2018, SanDisk Technologies LLC.
U.S. Appl. No. 16/023,289, filed Jun. 29, 2018, SanDisk Technologies LLC.
U.S. Appl. No. 16/023,866, filed Jun. 29, 2018, SanDisk Technologies LLC.
U.S. Appl. No. 16/024,048, filed Jun. 29, 2018, SanDisk Technologies LLC.
U.S. Appl. No. 16/142,875, filed Sep. 26, 2018, SanDisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

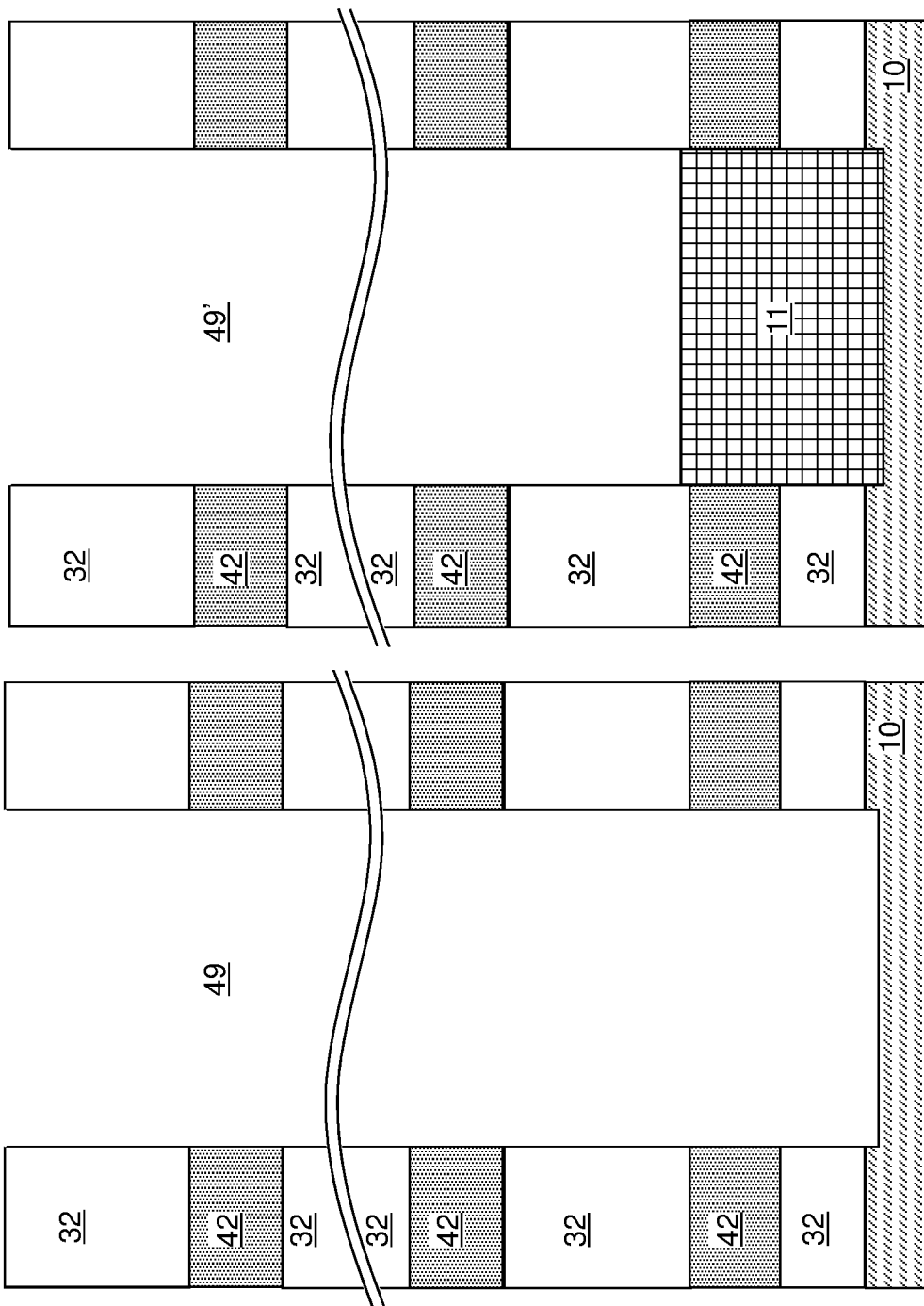

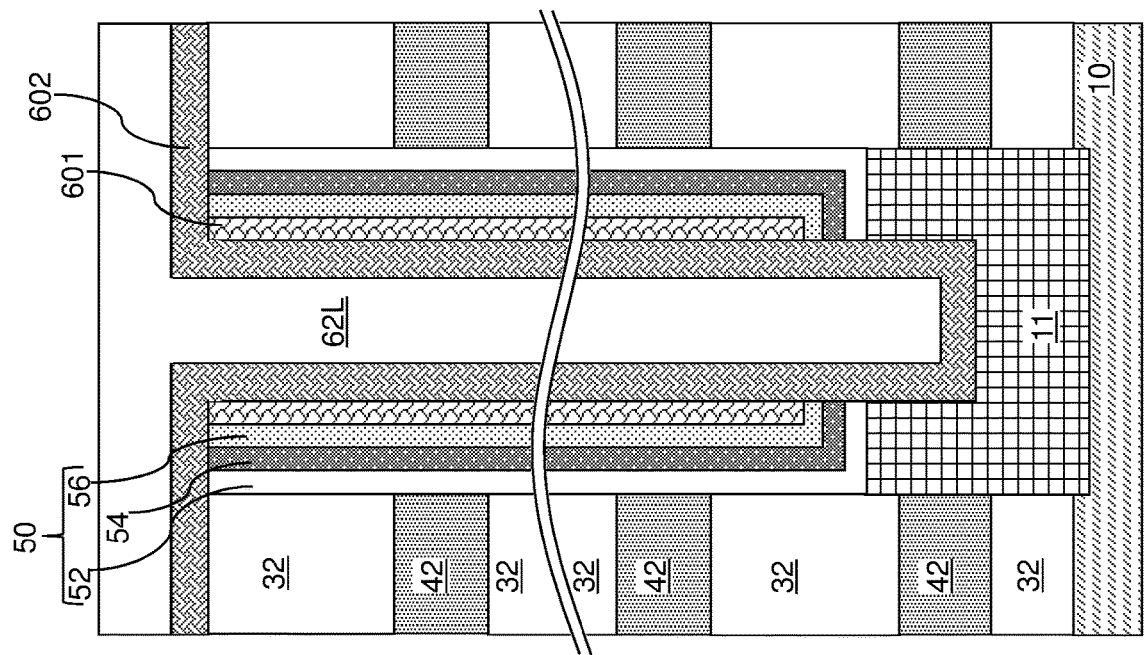
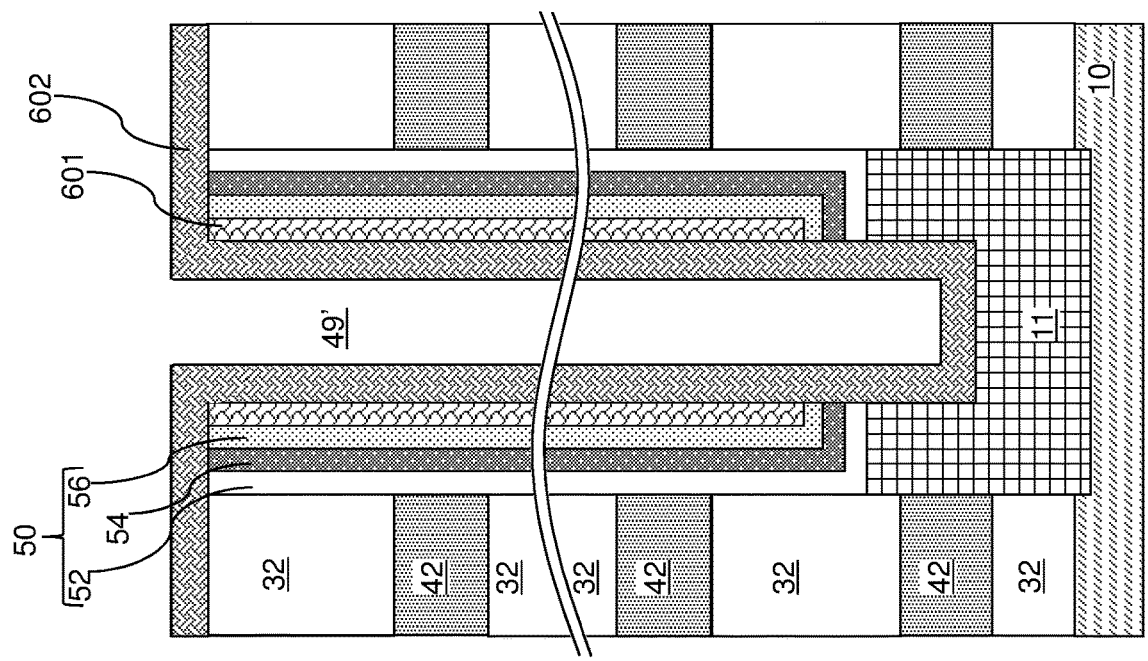

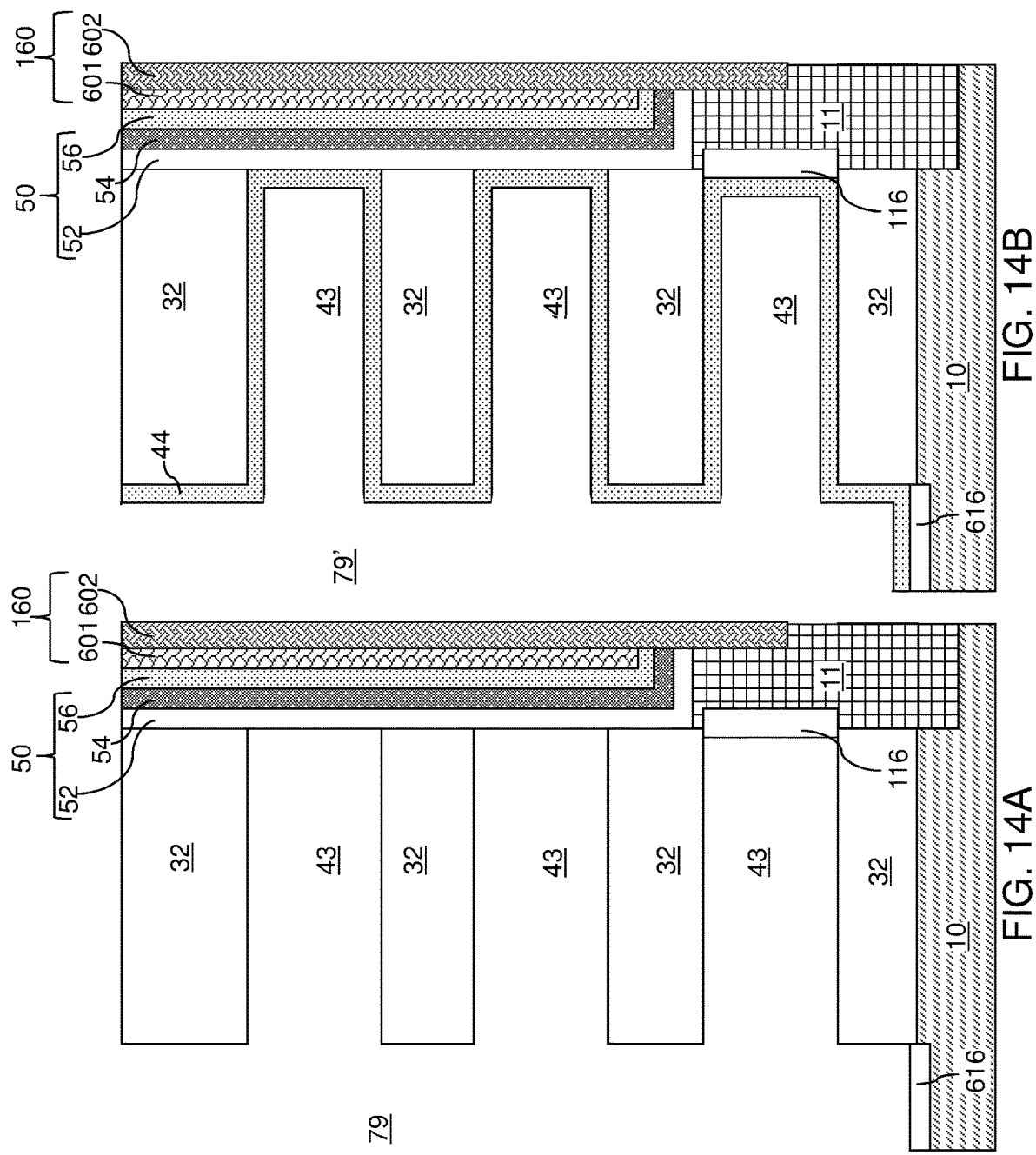

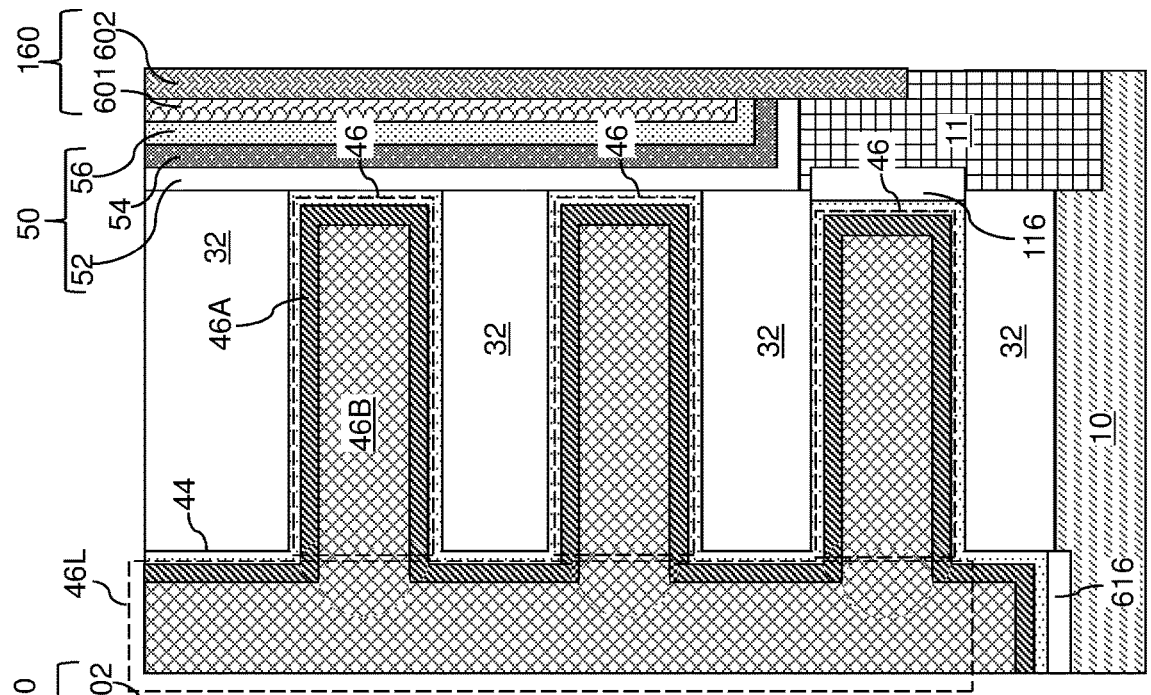
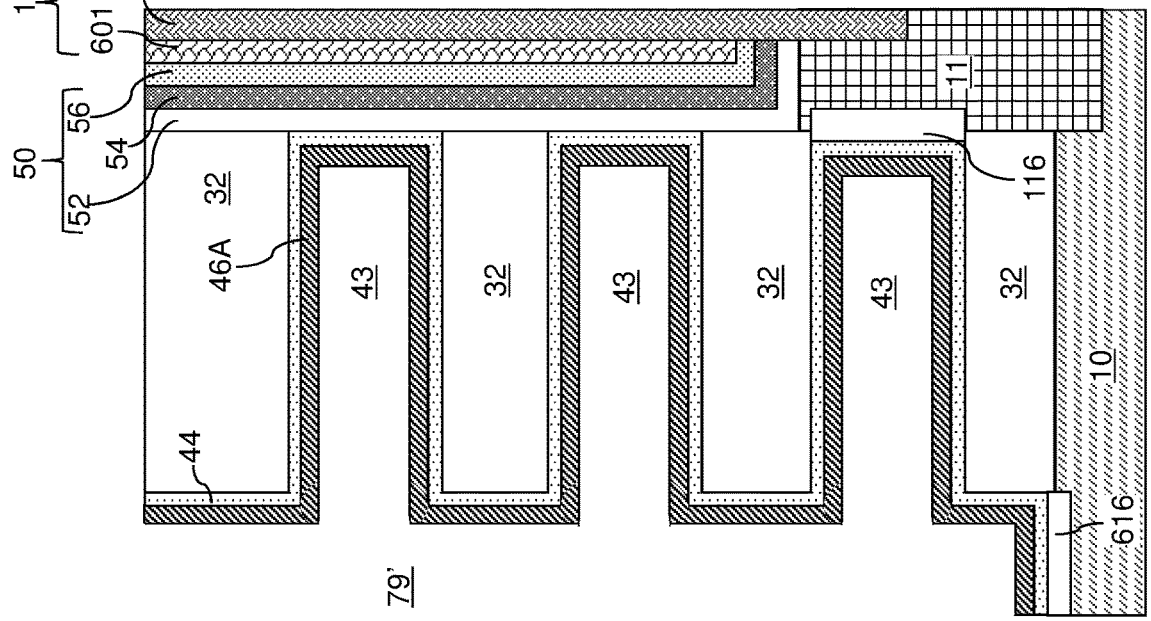

THREE-DIMENSIONAL MEMORY DEVICE CONTAINING DIRECT CONTACT DRAIN-SELECT-LEVEL SEMICONDUCTOR CHANNEL PORTIONS AND METHODS OF MAKING THE SAME

RELATED APPLICATIONS

The present application claims the benefit of priority of U.S. Provisional Application Ser. No. 62/715,887 filed on Aug. 8, 2018, the entire contents of which are incorporated herein by reference.

FIELD

The present disclosure relates generally to the field of semiconductor devices, and particular to a three-dimensional memory device including drain-select-level semiconductor channel portions directly contacting word-line-level semiconductor channel portions and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an aspect of the present disclosure, a three-dimensional memory device is provided, which comprises: an alternating stack of insulating layers and word-line-level electrically conductive layers located over a substrate; a memory opening vertically extending through the alternating stack; a memory opening fill structure located within the memory opening and comprising a memory film, a word-line-level semiconductor channel portion laterally surrounded by the memory film, and a word-line-level dielectric core laterally surrounded by the word-line-level semiconductor channel portion; and a drain-select-level pillar structure overlying the memory opening fill structure and comprising a cylindrical gate electrode, a gate dielectric, and a drain-select-level semiconductor channel portion, wherein an interface between the drain-select-level semiconductor channel portion and the word-line-level semiconductor channel portion is vertically coincident with an interface between the word-line-level semiconductor channel portion and the word-line-level dielectric core.

According to another aspect of the present disclosure, a method of forming a three-dimensional memory device is provided, which comprises: forming an alternating stack of insulating layers and word-line-level spacer material layers over a substrate, wherein the word-line-level spacer material layers are formed as, or are subsequently replaced with, word-line-level electrically conductive layers; forming a memory opening through the alternating stack; forming a memory opening fill structure in the memory opening, wherein the memory opening fill structure comprises a memory film, a word-line-level semiconductor channel portion laterally surrounded by the memory film, a word-line-level dielectric core laterally surrounded by the word-line-level semiconductor channel portion, and a sacrificial dielectric material portion; forming drain-select-level material layers over the alternating stack and the memory opening fill structure; forming a drain-select-level cavity extending through the drain-select-level material layers and over the memory opening fill structure; removing the sacrificial dielectric material portion selective to the word-line-level semiconductor channel portions underneath the drain-select-level opening; and forming a drain-select-level semiconductor channel portion directly on the word-line-level semiconductor channel portion.

BRIEF DESCRIPTION OF THE DRAWINGS

FIGS. 5A-5H are sequential schematic vertical cross-sectional views of a memory opening within the exemplary structure during formation of a memory opening fill structure according to an embodiment of the present disclosure.

FIGS. 14A-14D are sequential vertical cross-sectional views of a region of the exemplary structure during formation of electrically conductive layers according to an embodiment of the present disclosure.

DETAILED DESCRIPTION

Figure 1:
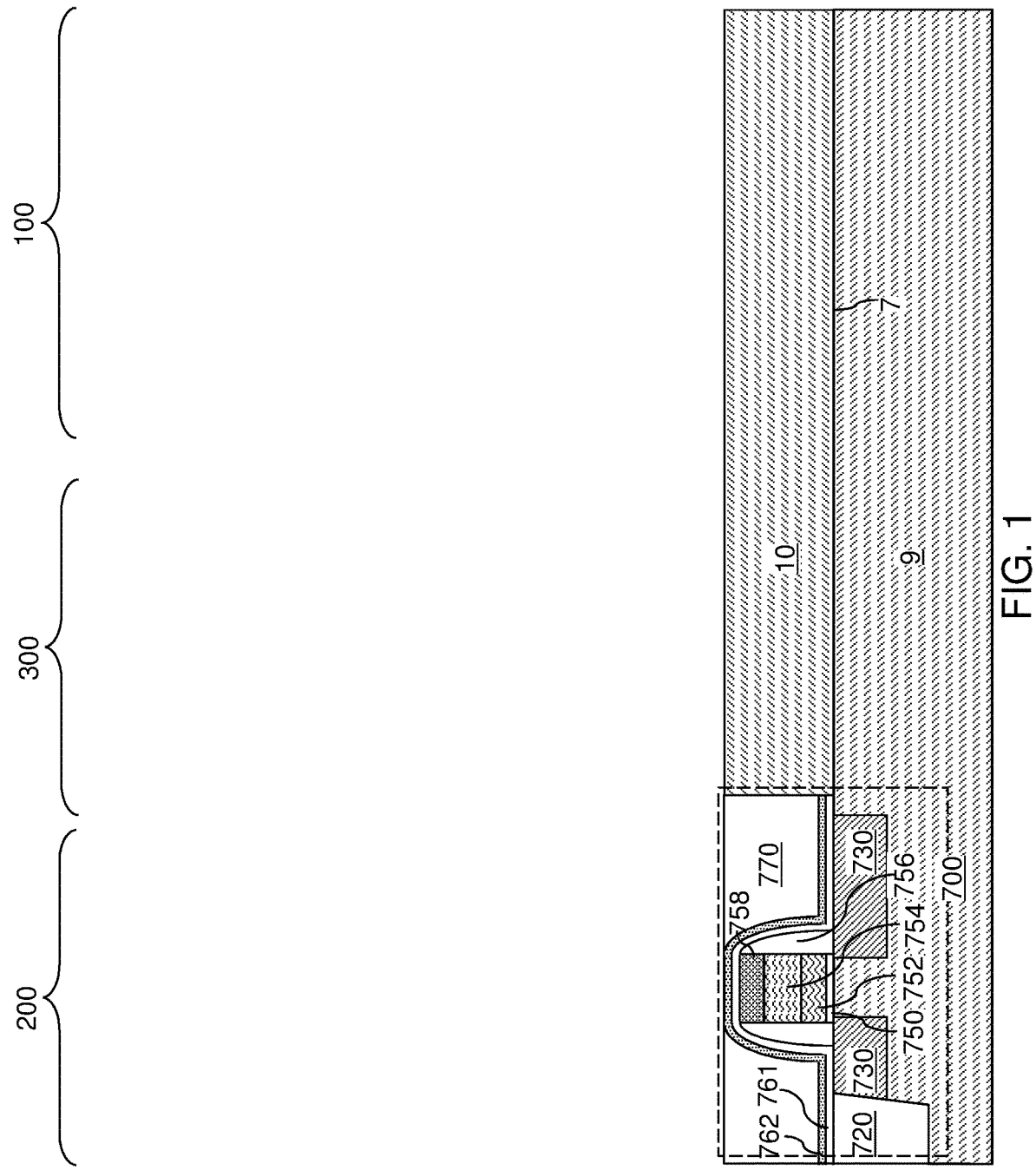
FIG. 1 is a schematic vertical cross-sectional view of an exemplary structure after formation of at least one peripheral device, and a semiconductor material layer according to an embodiment of the present disclosure.

As discussed above, the present disclosure is directed to a three-dimensional memory device including drain-select-level semiconductor channel portions directly contacting word-line-level semiconductor channel portions and methods of manufacturing the same, the various aspects of which are described below. The multi-level self-aligned drain select level isolation structures can provide a compact device layout and reduce a chip size without the need to allocate an extra dedicated area to the drain-select-level isolation structure, as well as providing a simpler self aligned fabrication process. Direct contact between the two channel portions reduces contact resistance and increases the cell current for the vertical field effect transistor. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The three-dimensional memory devices of various embodiments of the present disclosure include a monolithic three-dimensional NAND string memory device, and can be fabricated using the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of word-line-level electrically conductive layers can be provided between the memory array region 100 and the peripheral device region 200.

Figure 2:
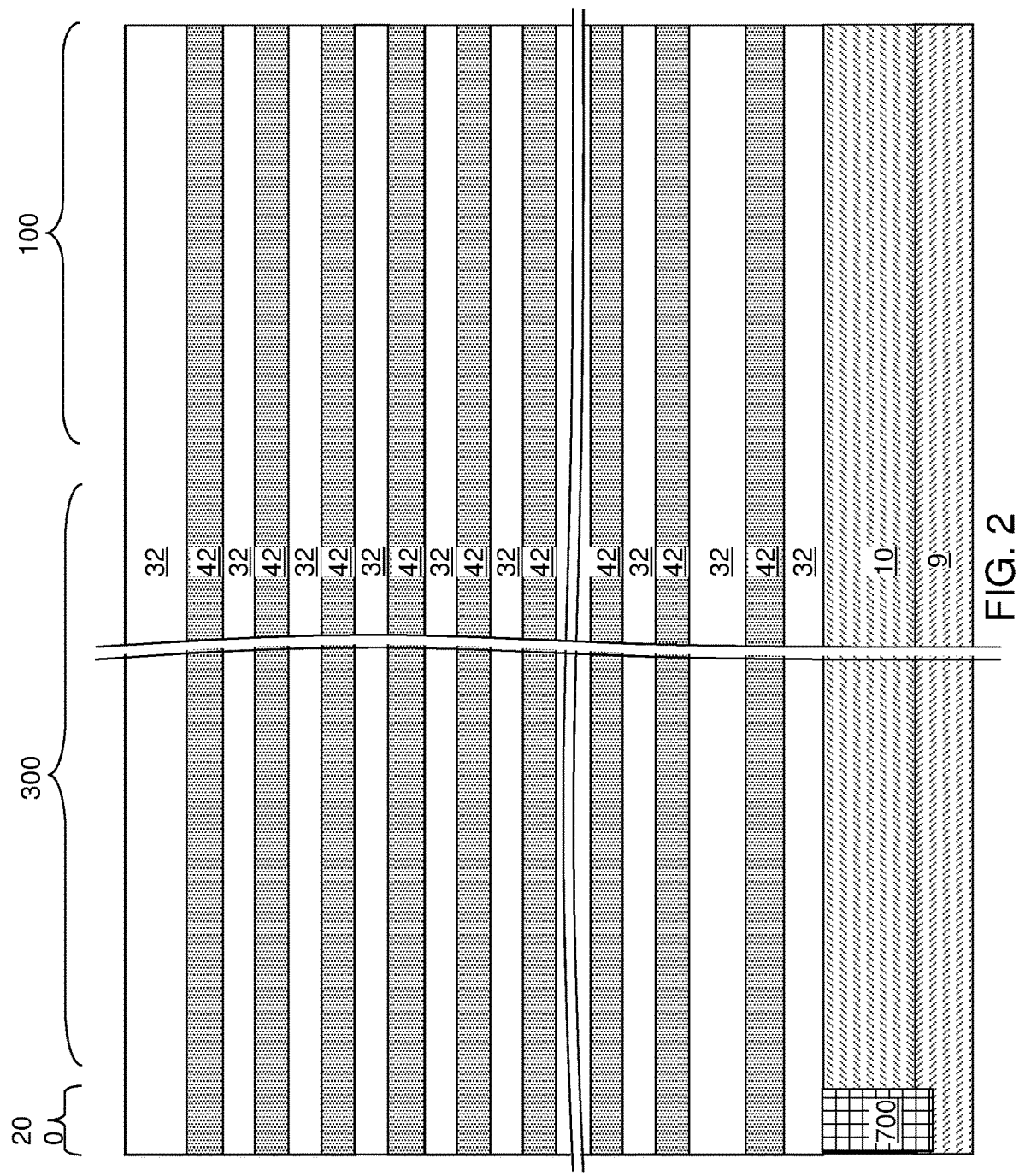
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layers) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While embodiments of the present disclosure are described using an example embodiment in which the spacer material layers are sacrificial material layers 42 that are subsequently replaced with word-line-level electrically conductive layers, in other embodiments the sacrificial material layers are formed as electrically conductive layers, which include word-line-level electrically conductive layers that are formed at word line levels, i.e., at the levels of word lines. In such embodiments, steps for replacing the spacer material layers with electrically conductive layers can be omitted.

Figure 3:
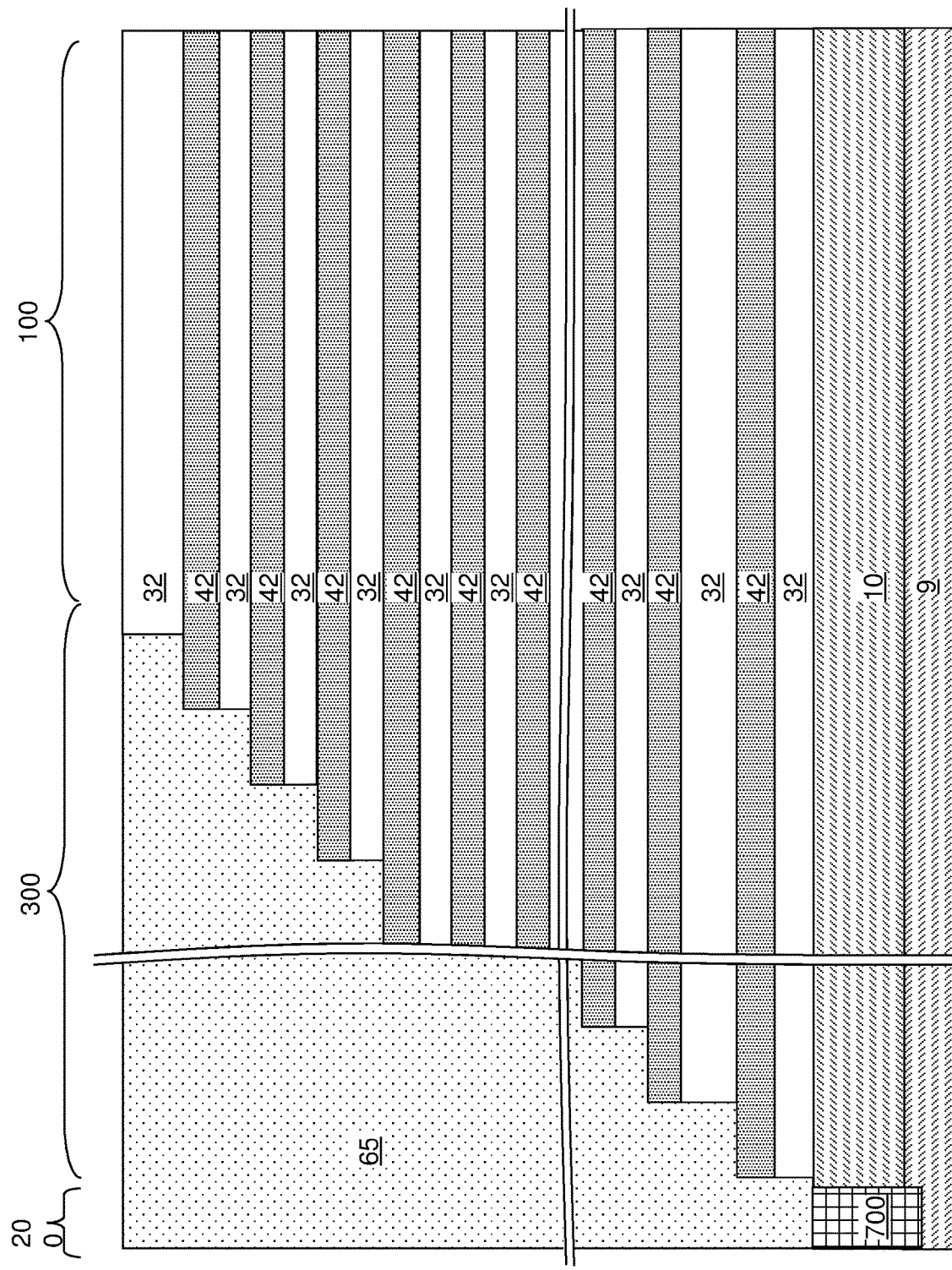
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Figure 4A:
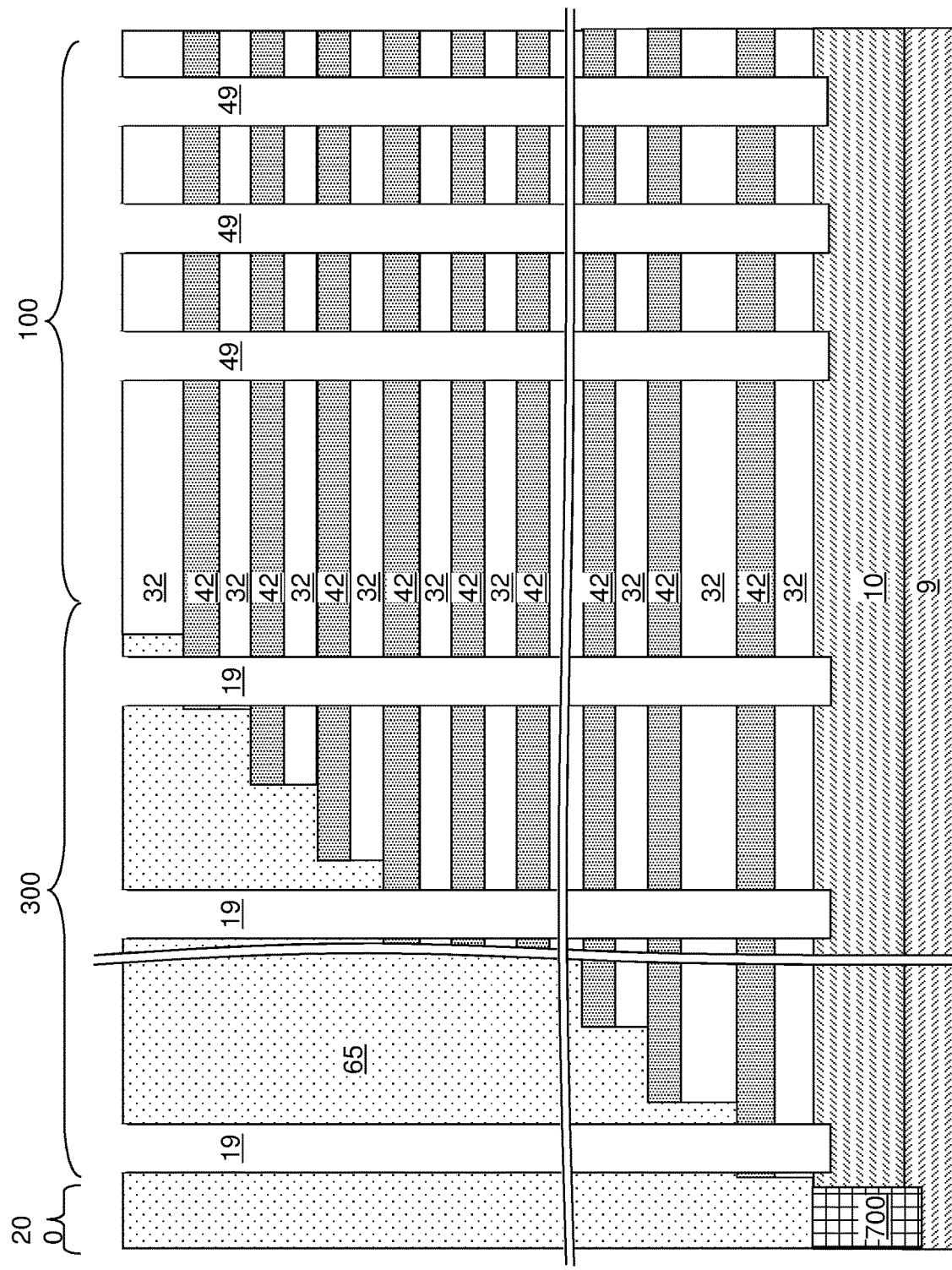
FIG. 4A is a schematic vertical cross-sectional view of the exemplary structure after formation of memory openings and support openings according to an embodiment of the present disclosure.
Figure 4B:
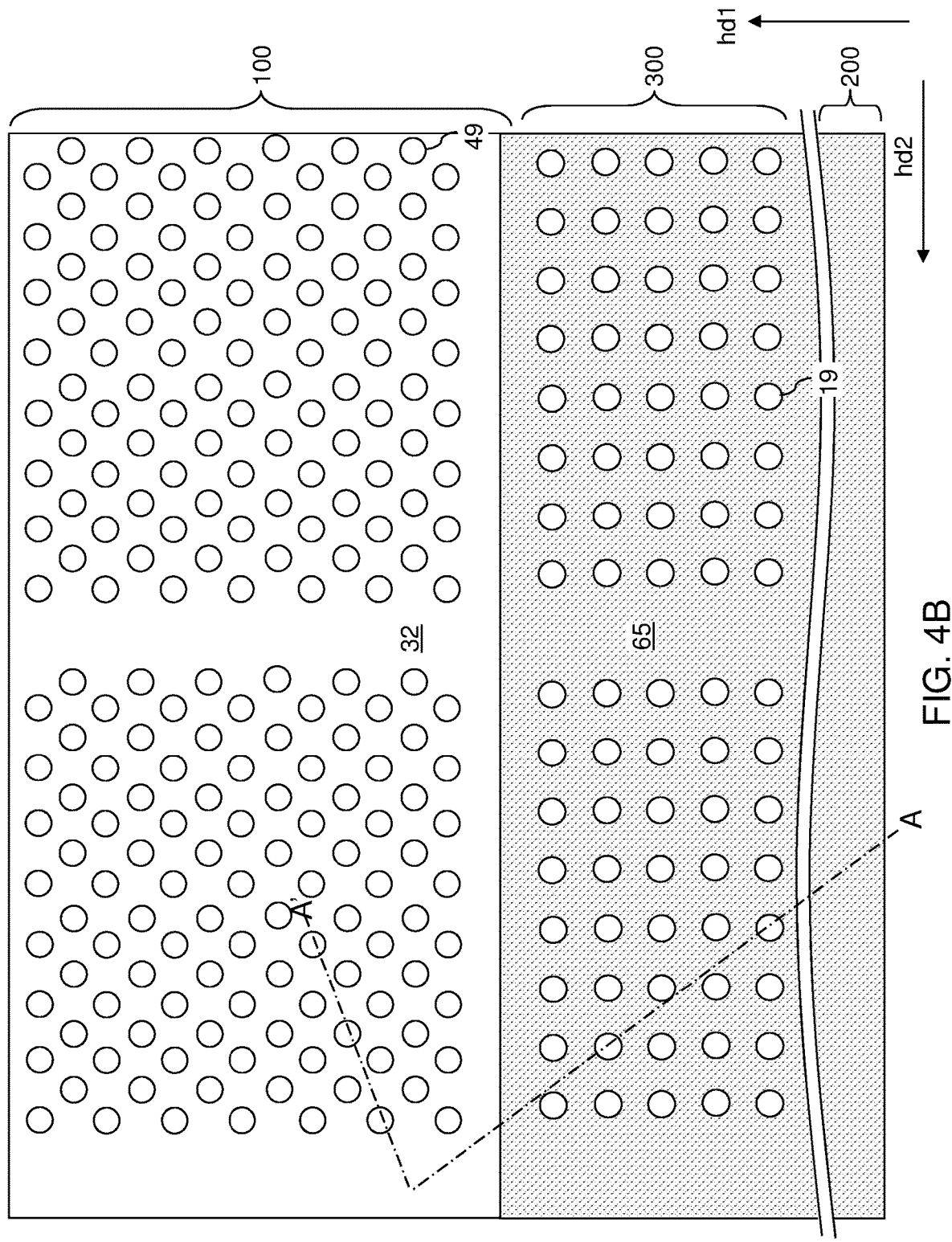
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the topmost insulating layer 32 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the alternating stack (32, 42) and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11.

In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5C:
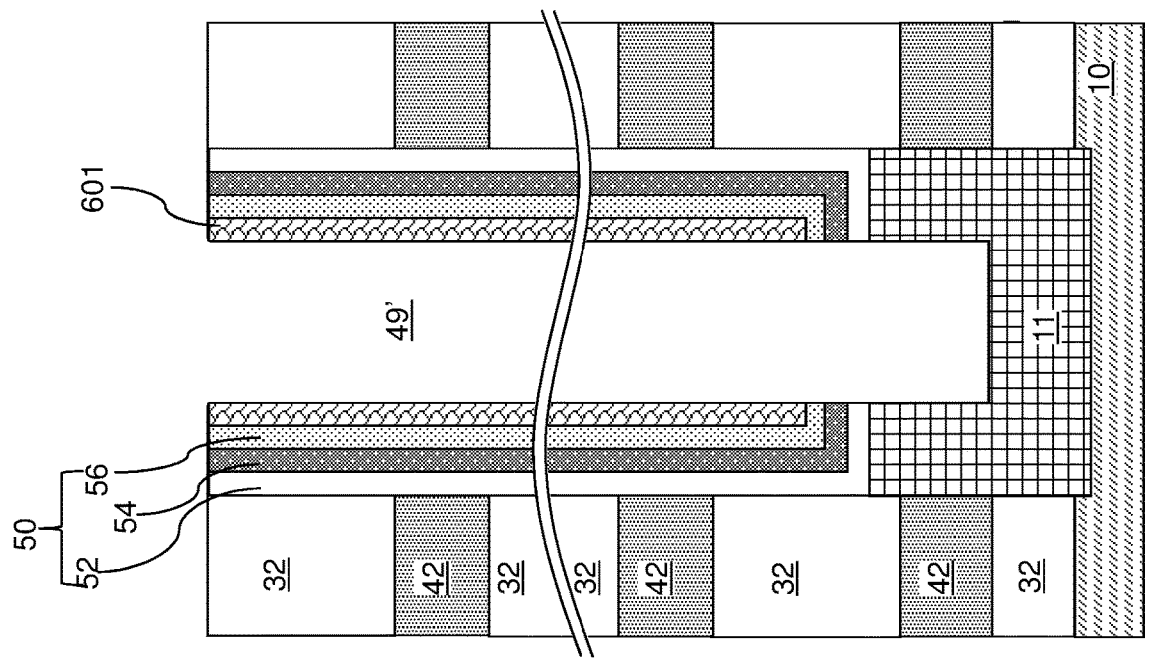

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While various embodiments of the present disclosure are described using an example embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Figure 5D:
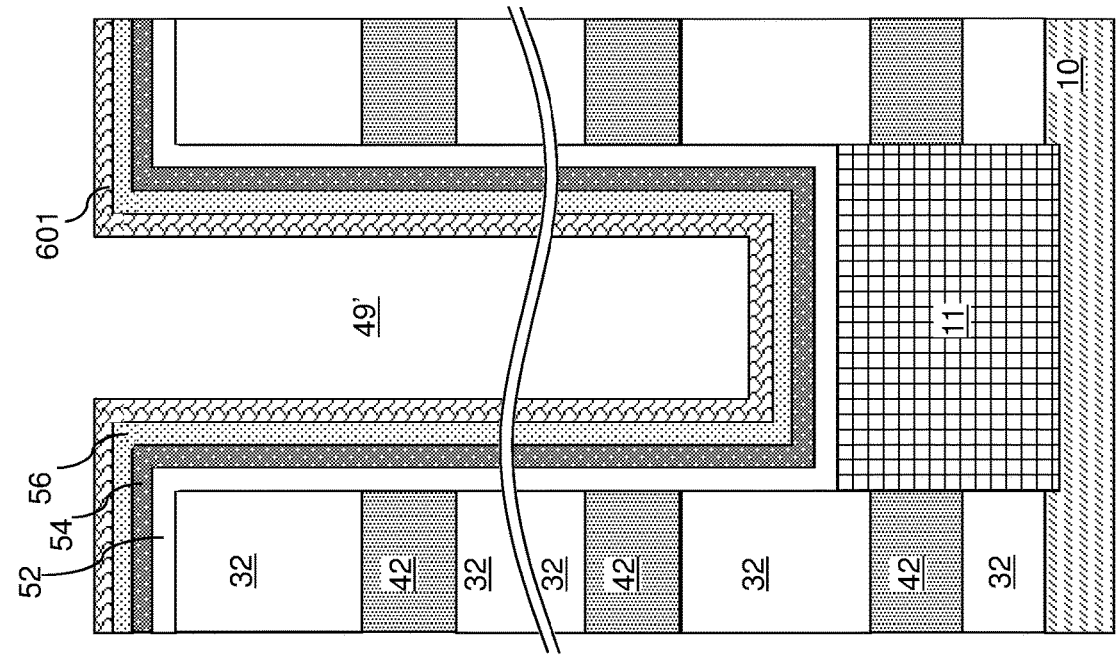

Referring to FIG. 5D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the topmost insulating layer 32 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (e.g., the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a word-line-level dielectric core layer 62L can be deposited in the memory cavity 49' to fill any remaining portion of the memory cavity 49' within each memory opening. The word-line-level dielectric core layer 62L includes a dielectric material such as silicon oxide or organosilicate glass. The word-line-level dielectric core layer 62L can be deposited by a conformal deposition method such as low pressure chemical vapor deposition (LPCVD), or by a self-planarizing deposition process such as spin coating.

Figure 5G:
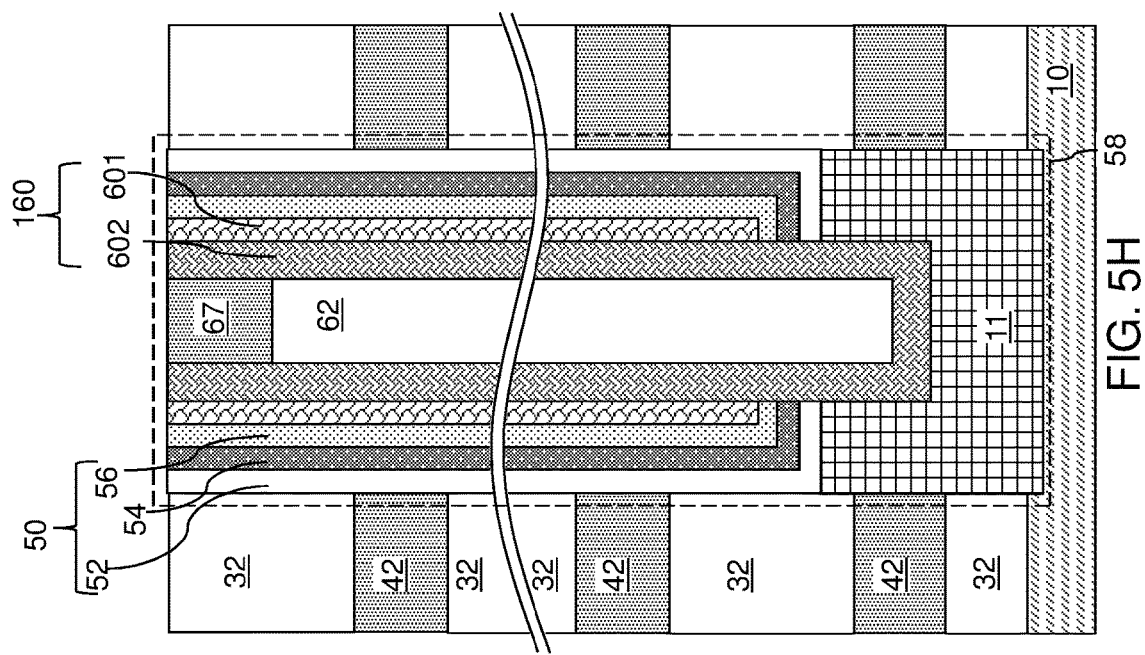

Referring to FIG. 5G, the horizontal portion of the word-line-level dielectric core layer 62L can be removed, for example, by a recess etch from above the top surface of the topmost insulating layer 32. Each remaining portion of the word-line-level dielectric core layer 62L constitutes a word-line-level dielectric core 62. Further, the horizontal portion of the second semiconductor channel layer 602 located above the top surface of the topmost insulating layer 32 can be removed by a planarization process, which can use a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a word-line-level semiconductor channel portion 160 through which electrical current can flow when a vertical NAND device including the word-line-level semiconductor channel portion 160 is turned on. A tunneling dielectric layer 56 is surrounded by a charge storage layer 54, and laterally surrounds a portion of the word-line-level semiconductor channel portion 160. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
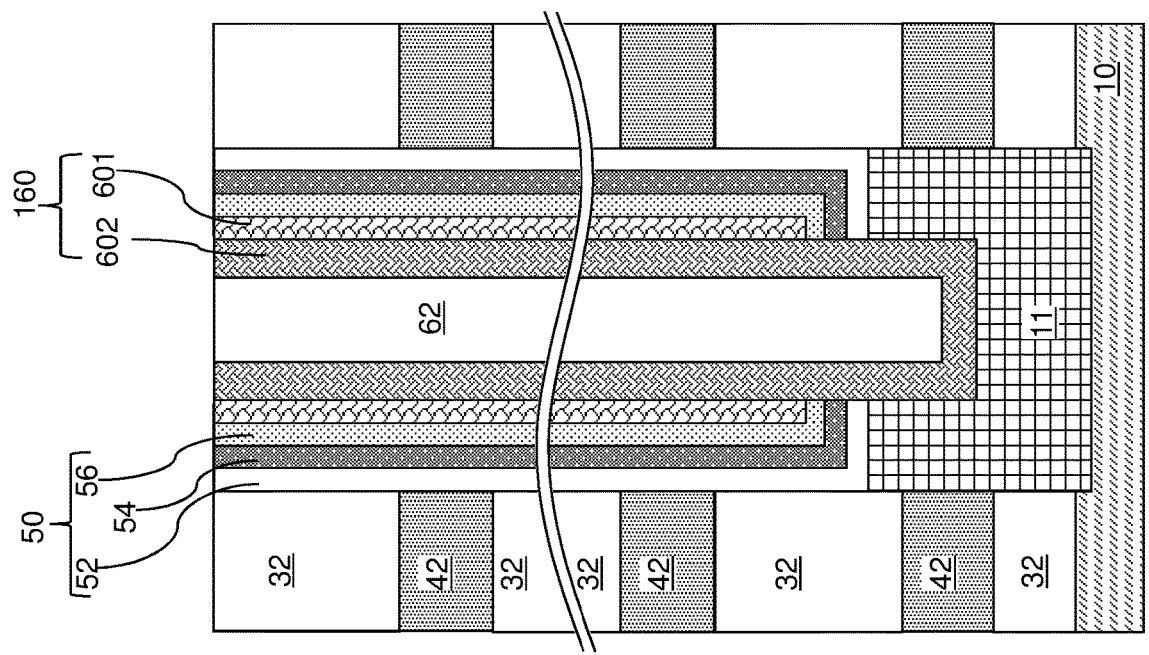

Referring to FIG. 5H, the top surface of each word-line-level dielectric core 62 can be further recessed within each memory opening, for example, by a recess etch to a depth that is located between the top surface of the topmost insulating layer 32 and the bottom surface of the topmost insulating layer 32. A sacrificial dielectric material layer is deposited in the recesses overlying the word-line-level dielectric cores 62. The sacrificial dielectric material layer includes a dielectric material that is different from the dielectric material of the word-line-level dielectric cores 62. In one embodiment, the sacrificial dielectric material layer includes silicon nitride. The horizontal portion of the sacrificial dielectric material layer overlying horizontal portions of the memory film 50 can be removed by a planarization process. For example, a recess etch may be performed to remove the horizontal portion of the sacrificial dielectric material layer. Each remaining portions of the sacrificial dielectric material layer constitutes a sacrificial dielectric material portion 67. Each sacrificial dielectric material portion 67 can have a substantially cylindrical shape. The interface between a cylindrical sidewall of a sacrificial dielectric material portion 67 and a word-line-level semiconductor channel portion 160 can be vertically coincident with an interface between a word-line-level dielectric core 62 and the word-line-level semiconductor channel portion 160.

Each combination of a pedestal channel portion 11 (if present), a memory film 50, a word-line-level semiconductor channel portion 160, a word-line-level dielectric core 62, and a sacrificial dielectric material portion 67 within a memory opening 49 constitutes a memory opening fill structure 58. Each combination of a pedestal channel portion 11 (if present), a memory film 50, a word-line-level semiconductor channel portion 160, a word-line-level dielectric core 62, and a sacrificial dielectric material portion 67 within each support opening 19 fills the respective support openings 19, and constitutes a support pillar structure.

Figure 6:
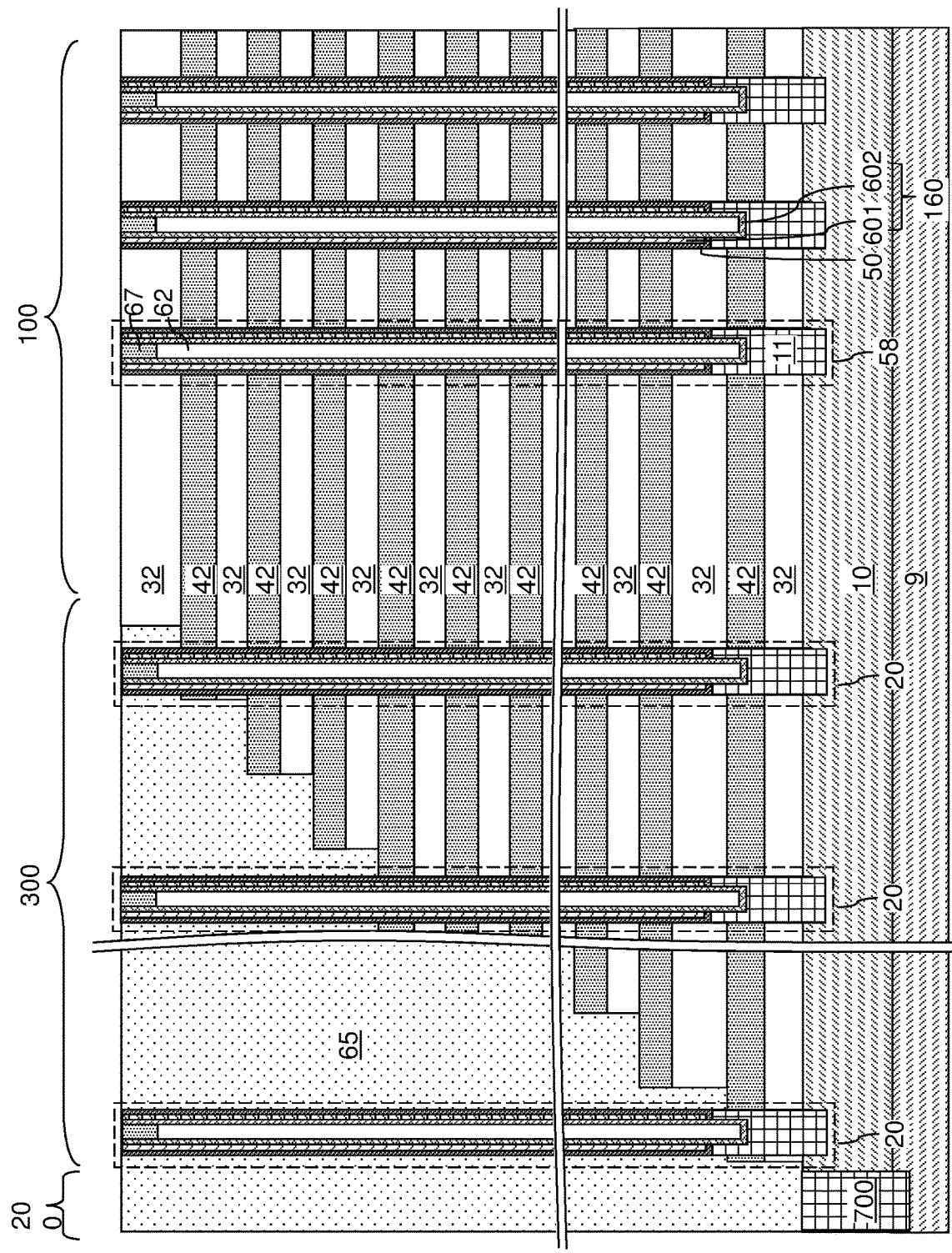
FIG. 6 is a schematic vertical cross-sectional view of the exemplary structure after formation of opening fill structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 7:
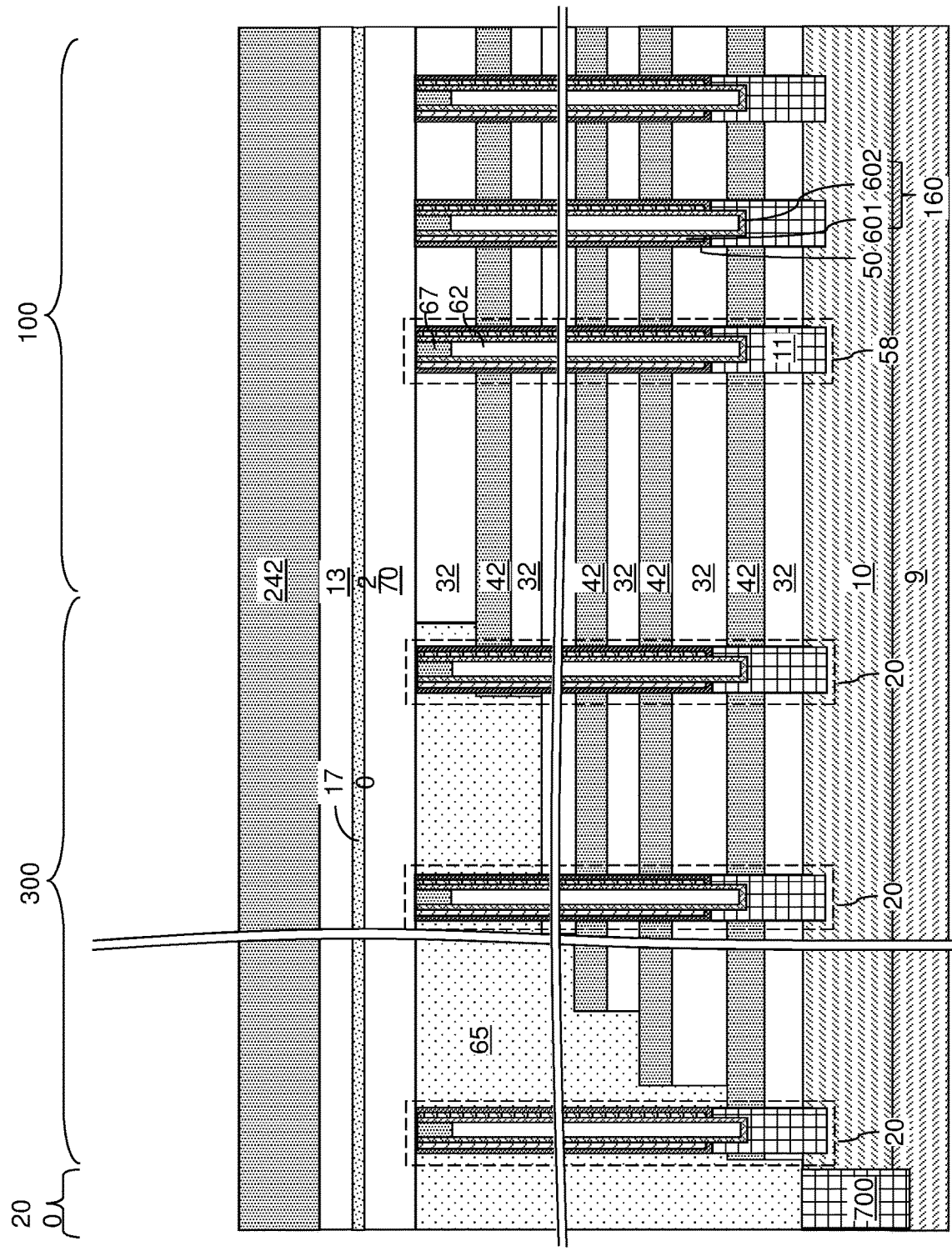
FIG. 7 is a schematic vertical cross-sectional view of the exemplary structure after formation of an insulating cap layer, a dielectric etch stop material layer, a drain-select-level insulating layer, and a drain-select-level sacrificial material layer according to an embodiment of the present disclosure.

Referring to FIG. 7, an insulating cap layer 70, a dielectric etch stop material layer 170, a drain-select-level insulating layer 132, and a drain-select-level sacrificial material layer 242 can be sequentially deposited over the topmost insulating layer 32. The insulating cap layer 170 can include a silicon oxide-based dielectric material, such as undoped silicate glass or a doped silicate glass. In one embodiment, the insulating cap layer 70 can include a dielectric material having a higher etch rate in dilute hydrofluoric acid than the dielectric material of the insulating layers 32. For example, the insulating cap layer 70 can include borosilicate glass. The thickness of the insulating cap layer 170 can be in a range from 30 nm to 200 nm, although lesser and greater thicknesses can also be used.

The dielectric etch stop material layer 170 includes a dielectric material that is selective to an anisotropic etch chemistry for silicon oxide. For example, the dielectric etch stop material layer 170 can include a dielectric metal oxide material, such as aluminum oxide. The thickness of the dielectric etch stop material layer 170 can be in a range from 5 nm to 30 nm, although lesser and greater thicknesses can also be used.

The drain-select-level insulating layer 132 includes a dielectric material that is different from the dielectric material of the dielectric etch stop material layer 170. For example, the drain-select-level insulating layer 132 can include undoped silicate glass. In one embodiment, the drain-select-level insulating layer 132 can include the same dielectric material as the insulating layers 32. The thickness of the drain-select-level insulating layer 132 can be in a range from 10 nm to 100 nm, although lesser and greater thicknesses can also be used.

The drain-select-level sacrificial material layer 242 can include the same dielectric material as the sacrificial material layers 42. For example, the drain-select-level sacrificial material layer 242 and the sacrificial material layers 42 can include silicon oxide. The thickness of the drain-select-level sacrificial material layer 242 can be in a range from 30 nm to 200 nm, although lesser and greater thicknesses can also be used. The set of the insulating cap layer 70, the dielectric etch stop material layer 170, the drain-select-level insulating layer 132, and the drain-select-level sacrificial material layer 242 is herein referred to as drain-select-level material layers (70, 170, 132, 242).

Figure 8A:
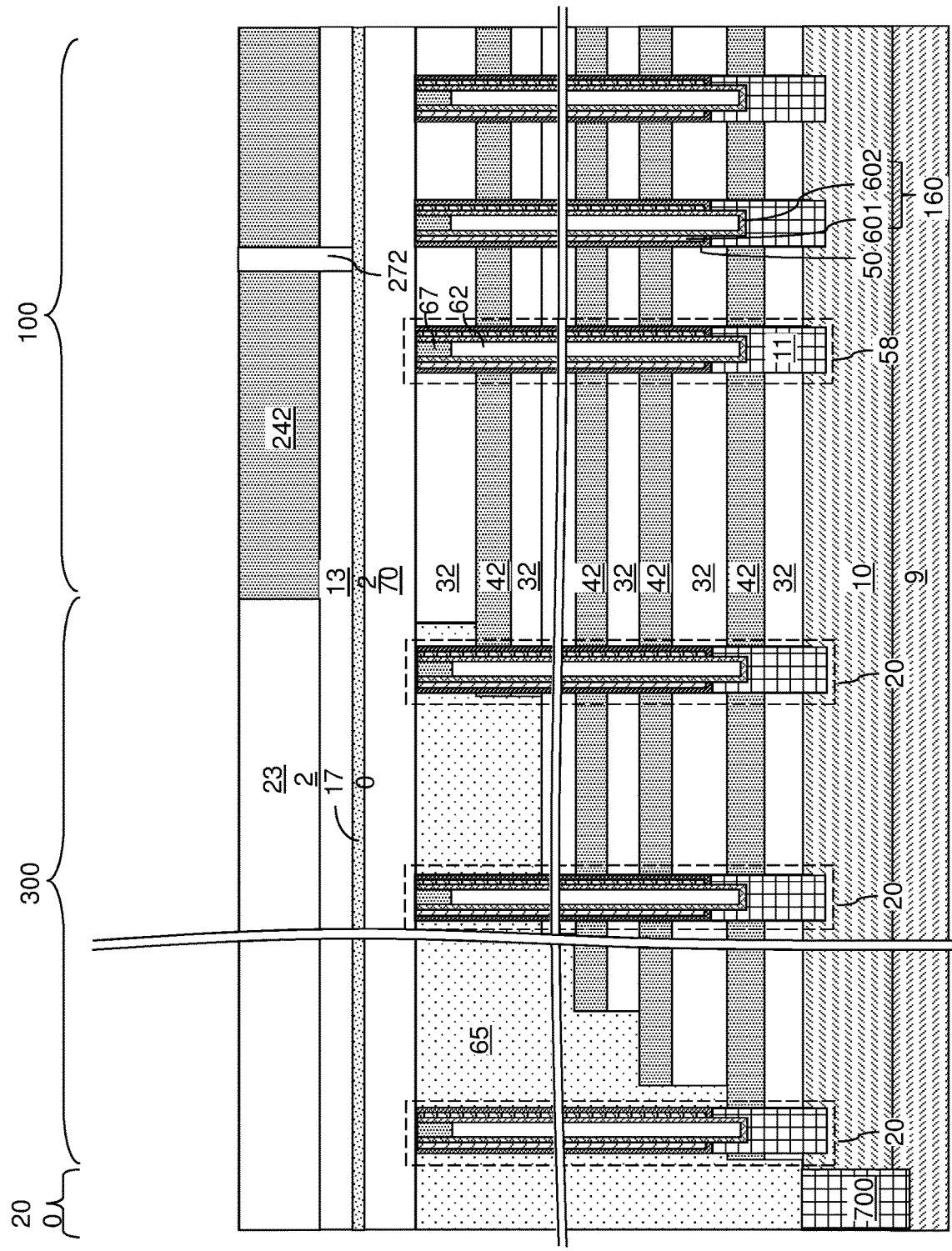
FIG. 8A is a schematic vertical cross-sectional view of the exemplary structure after formation of drain select level isolation structures according to an embodiment of the present disclosure.
Figure 8B:
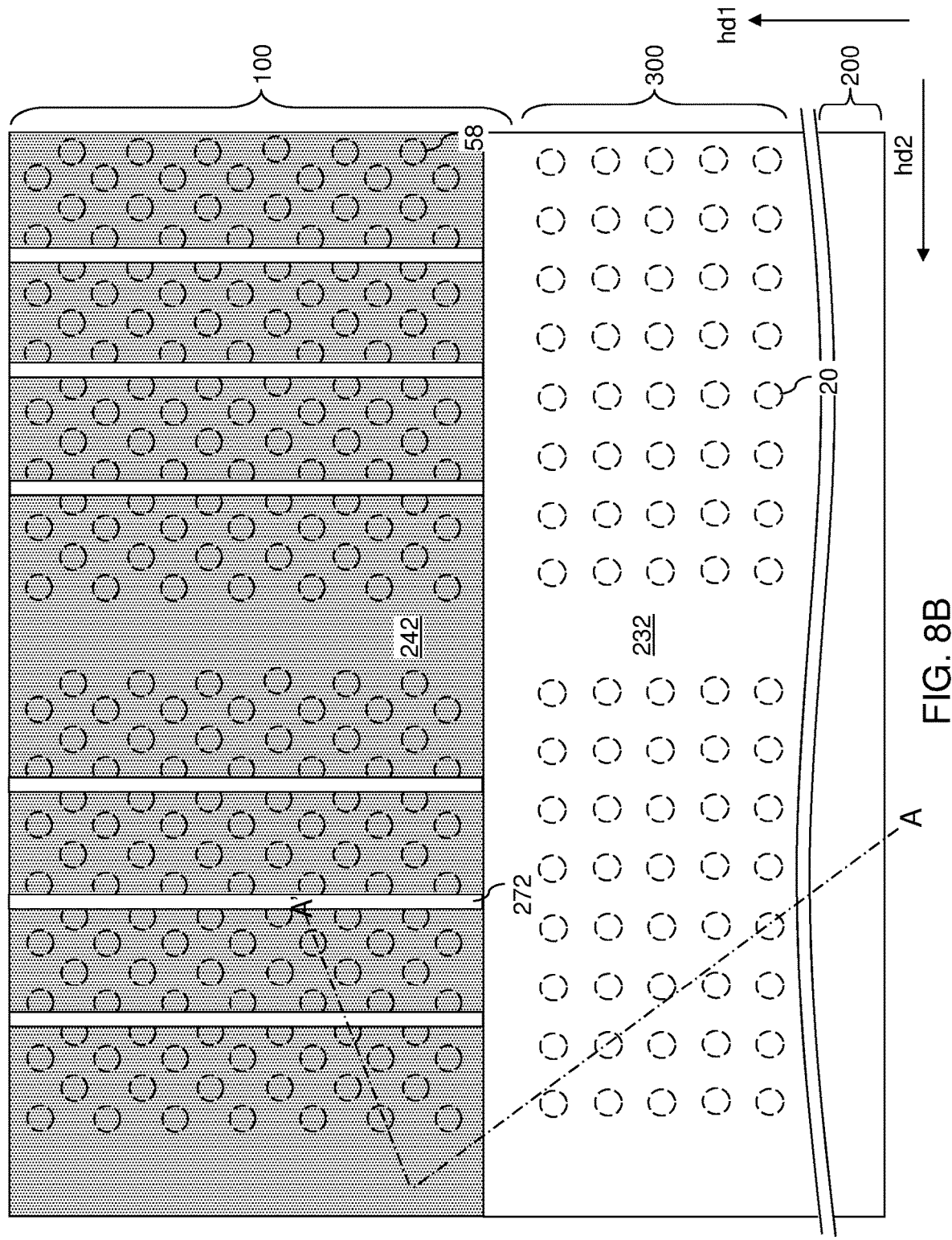
FIG. 8B is a top-down view of the exemplary structure of FIG. 8A. The hinged vertical plane A-A' is the plane of the schematic vertical cross-sectional view of FIG. 8A.

Referring to FIGS. 8A and 8B, a dielectric isolation layer 232 and drain-select-level isolation structures 272 can be formed through the drain-select-level sacrificial material layer 242 and optionally through the drain-select-level insulating layer 132. The dielectric isolation layer 232 is formed within the contact region 300 and the peripheral device region 200 as a continuous material layer. The drain-select-level isolation structures 272 can laterally extend along the first horizontal direction hd1. A patterned photoresist layer including line-shaped opening can be formed over the drain-select-level sacrificial material layer 242. The drain-select-level sacrificial material layer 242 can be removed from the contact region 300 and the peripheral device region 200 to physically expose a top surface of the drain-select-level insulating layer 132. Line trenches can be formed at least through the drain-select-level sacrificial material layer 242 using an anisotropic etch process. In one embodiment, the dielectric etch stop material layer 170 can be used as an etch stop layer during formation of the line trenches, which vertically extend through the drain-select-level sacrificial material layer 242 and through the drain-select-level insulating layer 132. The patterned photoresist layer can be subsequently removed, for example, by ashing. A dielectric material such as silicon oxide can be deposited in the line trenches, and excess portions of the dielectric material can be removed from above the drain-select-level sacrificial material layer 242 to form the drain-select-level isolation structures 272 and the dielectric isolation layer 232.

Each drain-select-level isolation structure 272 can have a uniform vertical cross-sectional profile along vertical planes that are perpendicular to the first horizontal direction hd1 that is invariant with translation along the first horizontal direction hd1. Multiple rows of memory opening fill structures 58 can underlie each area between a neighboring pair of drain-select-level isolation structures 272. Each row of memory opening fill structures 58 can laterally extend along the first horizontal direction hd1, and can be laterally spaced apart one from another along the second horizontal direction. In one embodiment, each drain-select-level isolation structure 272 can have an areal overlap with peripheral portions of memory opening fill structures 58 located within two neighboring rows of memory opening fill structures 58.

Figure 9A:
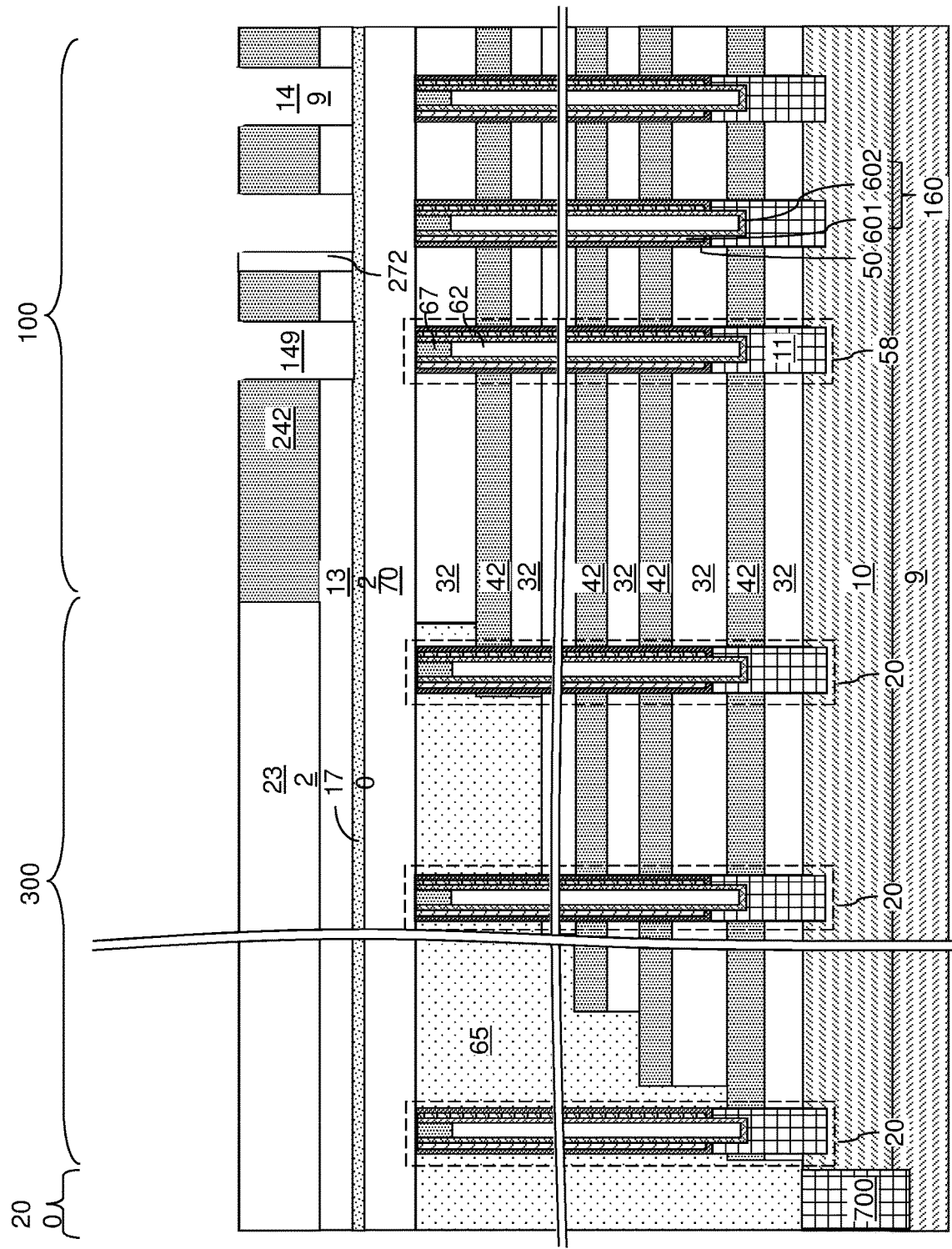
FIG. 9A is a schematic vertical cross-sectional view of the exemplary structure after formation of drain-select-level openings according to an embodiment of the present disclosure.
Figure 9B:
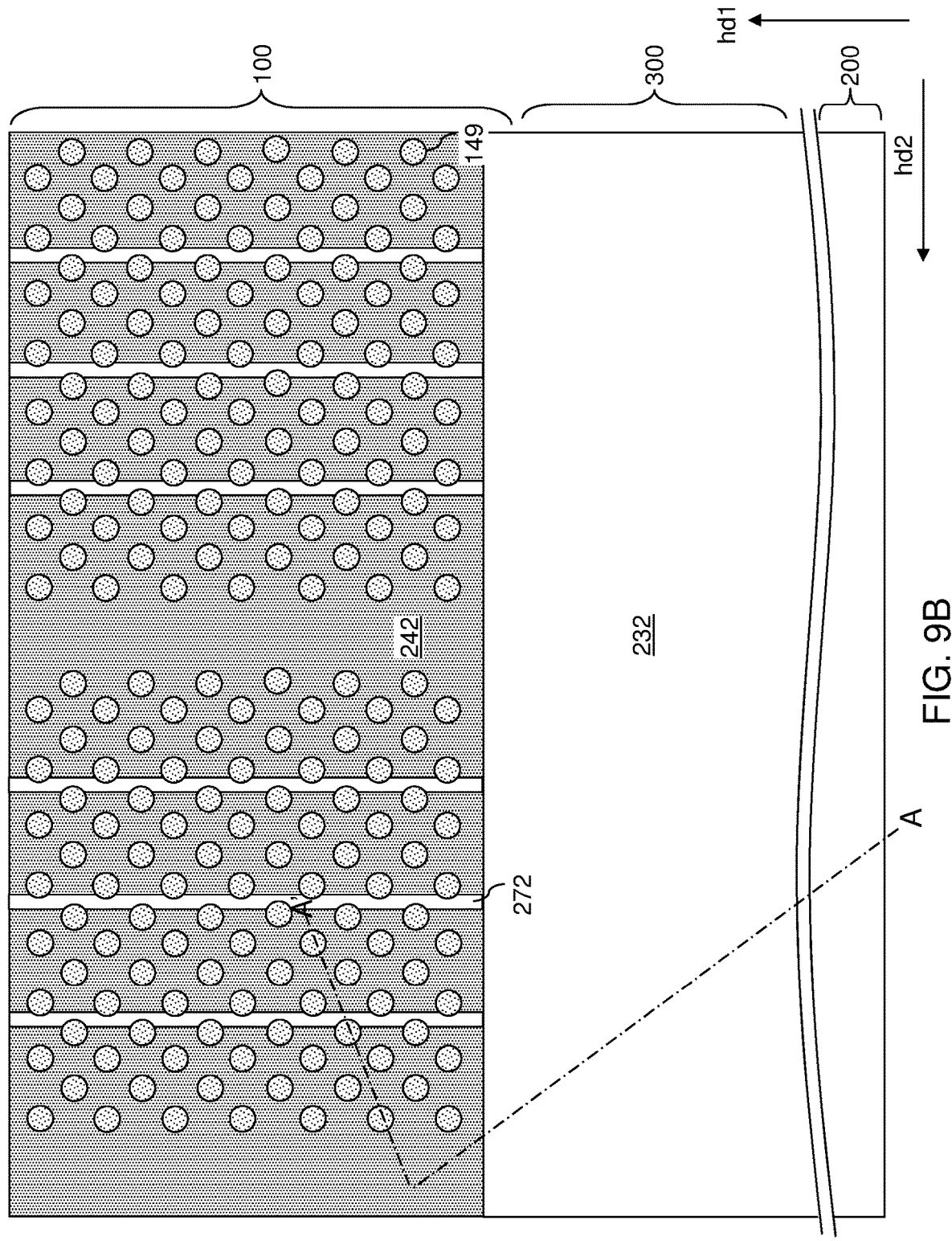
FIG. 9B is a top-down view of the exemplary structure of FIG. 9A. The hinged vertical plane A-A' is the plane of the schematic vertical cross-sectional view of FIG. 9A.
Figure 10A:
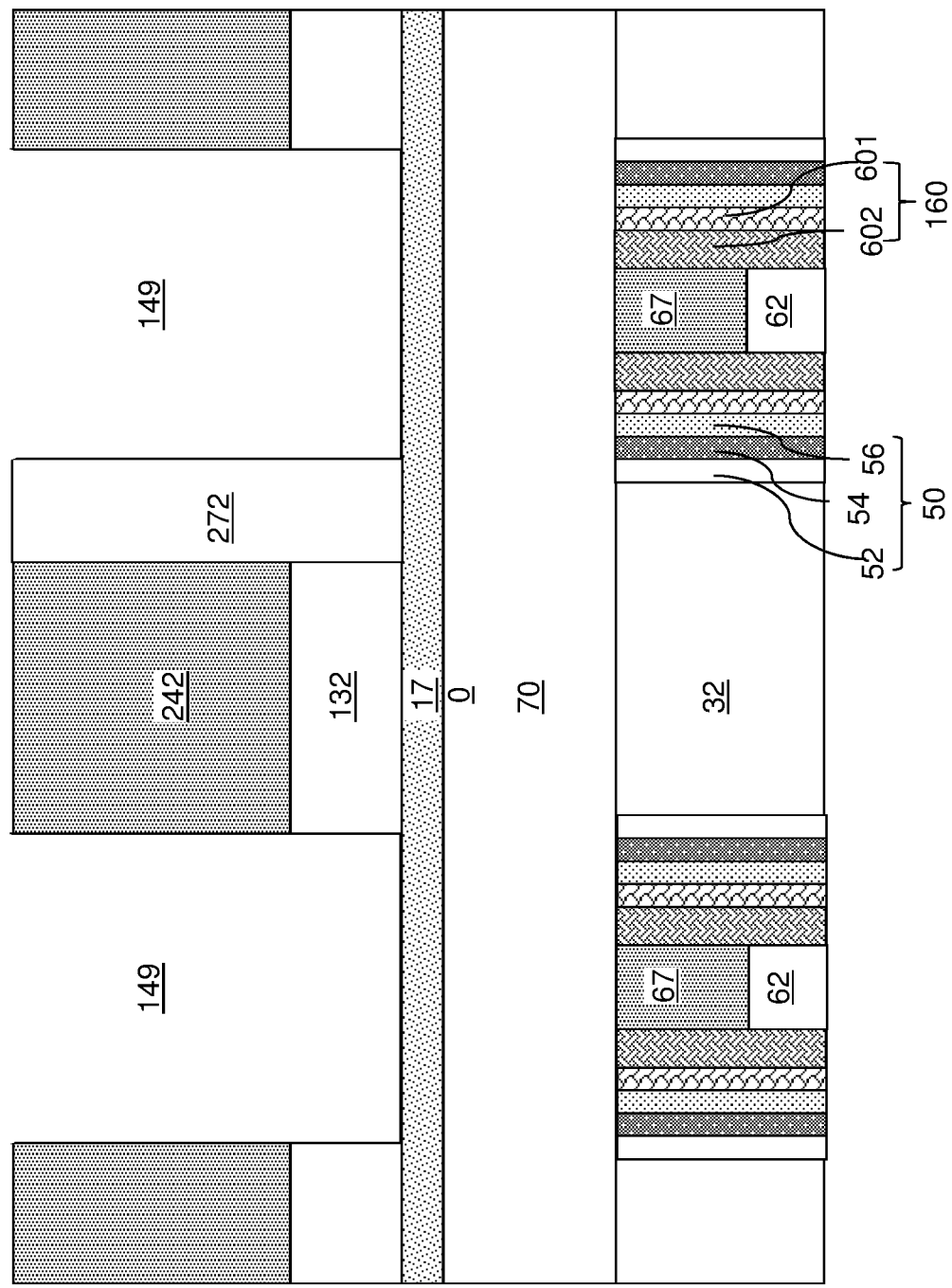
FIGS. 10A-10J are sequential vertical cross-sectional views of a region including a pair of drain-select-level openings during formation of drain-select-level pillar structures according to an embodiment of the present disclosure.

Referring to FIGS. 9A, 9B, and 10A, drain-select-level openings 149 are formed at least through an upper portion of the drain-select-level material layers (70, 170, 132, 242). For example, a photoresist layer (not shown) can be applied over the drain-select-level sacrificial material layer 242 and the drain-select-level isolation structures 272, and can be lithographically patterned to form openings having the same pattern as the memory openings 49. The size of the openings in the photoresist layer may be the same as, larger than, or smaller than, the size of the underlying memory opening fill structures 58. An anisotropic etch process can be performed to transfer the pattern of the photoresist layer through the drain-select-level sacrificial material layer 242 and the drain-select-level insulating layer 132. In one embodiment, the dielectric etch stop material layer 170 can be used as an etch stop structure during the anisotropic etch process. In this case, a bottom surface of each drain-select-level opening 149 can include a surface portion of the dielectric etch stop material layer 170. Drain-select-level openings 149 that replicate the pattern of the openings in the photoresist layer can be formed through the drain-select-level sacrificial material layer 242 and the drain-select-level insulating layer 132. Each drain-select-level opening 149 has an areal overlap with an underlying one of the memory opening fill structures 58. The photoresist layer can be subsequently removed, for example, by ashing.

Lengthwise edges of each drain-select-level isolation structure 272 that laterally extend along the first horizontal direction hd1 can be perforated by a pair of rows of drain-select-level openings 149 that laterally extend along the first horizontal direction hd1. Each drain-select-level isolation structure 272 can include a pair of lengthwise sidewalls such that each lengthwise sidewall includes a laterally alternating sequence of planar vertical sidewall segments and concave vertical sidewall segments. Multiple rows of drain-select-level openings 149 can be provided between each neighboring pair of drain-select-level isolation structures 272. For example, four rows of drain-select-level openings 149 can be provided between a pair of drain-select-level openings 149.

Each drain-select-level opening 149 laterally abutting a drain-select-level isolation structure 272 can be formed through a portion of the drain-select-level isolation structure 272, a portion of the drain-select-level sacrificial layer 242, and a portion of the drain-select-level insulating layer 132. Each drain-select-level opening 149 that is laterally spaced from the drain-select-level isolation structures 272 can have a sidewall that includes a cylindrical surface of the drain-select-level sacrificial layer 242 and a cylindrical surface of the drain-select-level insulating layer 132.

Figure 10B:
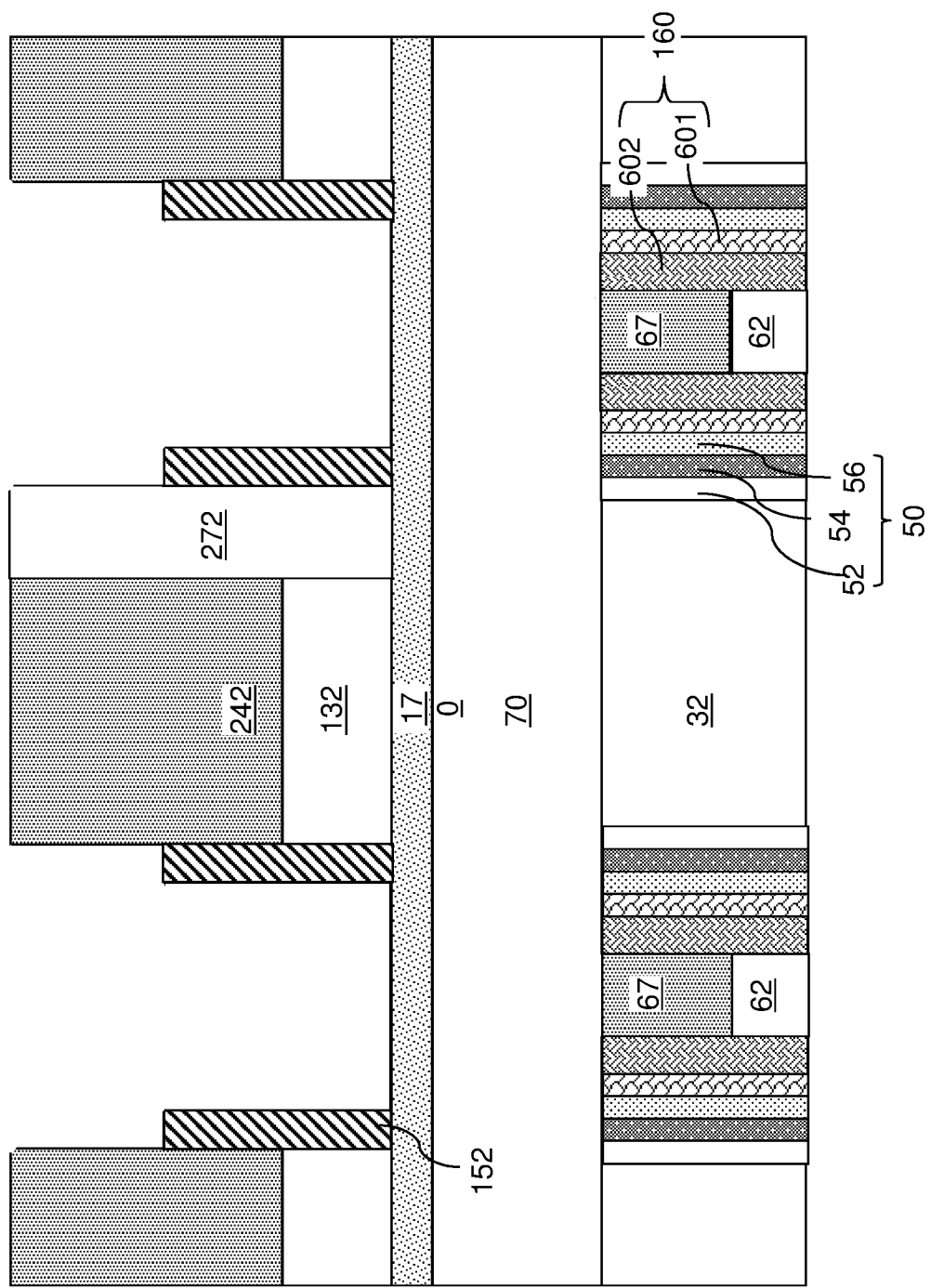

Referring to FIG. 10B, a cylindrical gate electrode 152 can be formed at a periphery of each drain-select-level opening 149 by conformal deposition of a heavily doped semiconductor material (such as heavily doped amorphous silicon or heavily doped polysilicon) or a metallic material (such as TiN), and an anisotropic etch process that removes horizontal portions of the heavily doped semiconductor material or the metallic material. As used herein, a "cylindrical" element is topologically homeomorphic to a torus, and has a vertical or substantially vertical inner sidewall, a vertical or substantially vertical outer sidewall, and an opening vertically extending through the vertical or substantially vertical inner sidewall. The top surface of each cylindrical gate electrode 152 can be vertically recessed from the top surface of the drain-select-level sacrificial material layer 242. The lateral thickness of each cylindrical gate electrode 152 (i.e., the lateral distance between the inner sidewall and the outer sidewall of each cylindrical gate electrode 152) can be in a range from 3 nm to 30 nm, such as from 4 nm to 12 nm, although lesser and greater lateral thicknesses can also be used.

Figure 10C:
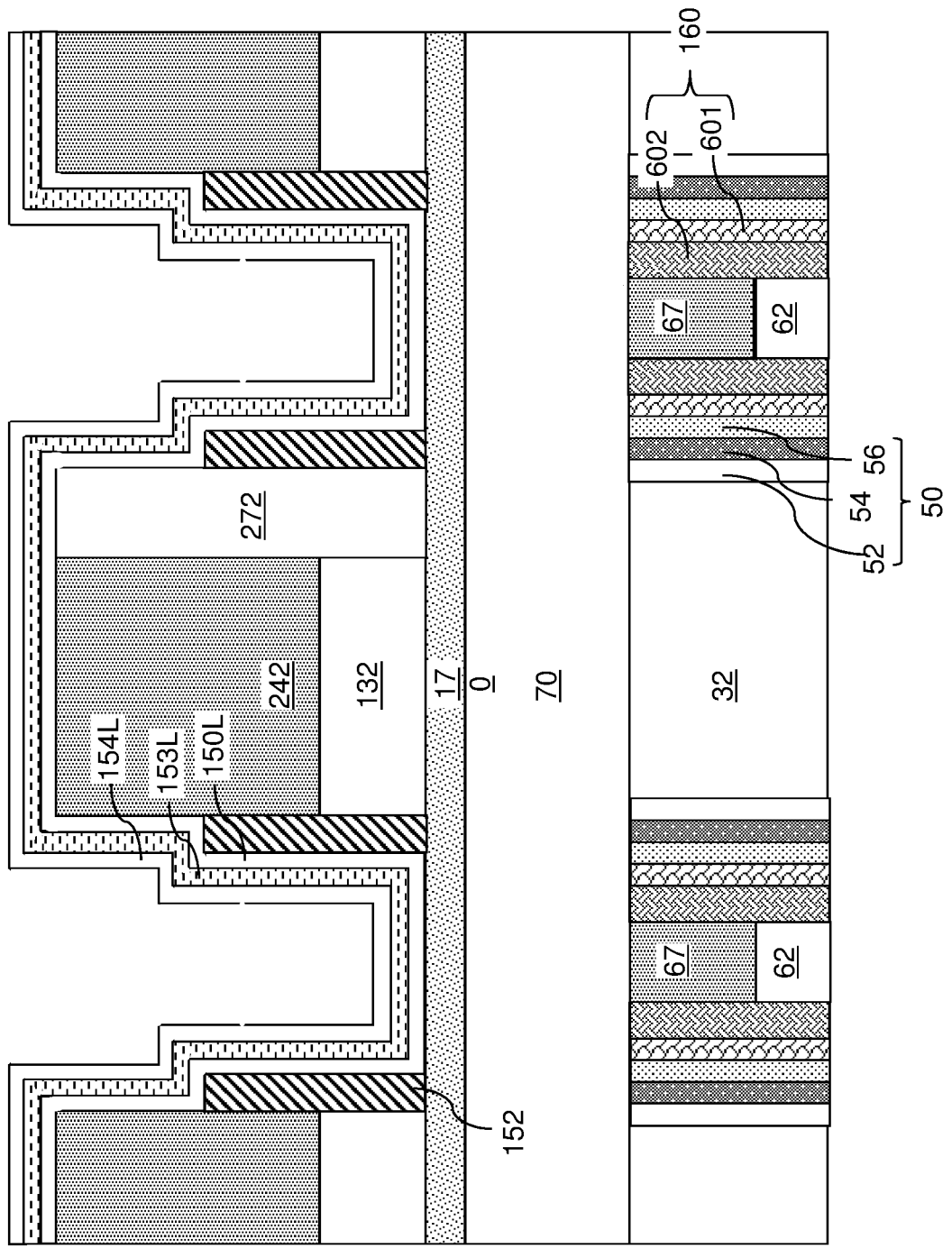

Referring to FIG. 10C, continuous material layers (150L, 153L, 154L) can be sequentially deposited in the drain-select-level openings 149 and over the drain-select-level sacrificial material layer 242. The continuous material layers (150L, 153L, 154L) can include a gate dielectric layer 150L, a cover semiconductor channel material layer 153L, and a cover dielectric material layer 154L.

The gate dielectric layer 150L can include a silicon oxide layer and/or a dielectric metal oxide layer. The entirety or a component layer of the gate dielectric layer 150L can be conformally deposited on the cylindrical gate electrodes 152. Alternatively or additionally, the gate dielectric layer 150L can be formed by in-situ steam generation oxidation of surface portions of the cylindrical gate electrodes 152 if the cylindrical gate electrodes 152 comprise a doped semiconductor material, such as doped polysilicon or doped amorphous silicon. Each portion vertical portion of the gate dielectric layer 150L located within a respective one of the memory openings 149 constitutes a gate electric. Thus, the gate dielectric layer 150L includes a plurality of gate dielectrics, a horizontal top portion that overlies the drain-select-level sacrificial layer 152, and horizontal bottom portions located at the bottom of the drain-select-level openings 149.

The cover semiconductor channel material layer 153L can be conformally deposited over the gate dielectric layer 150L. The cover semiconductor material layer 153L includes a doped semiconductor material such as doped polysilicon or doped amorphous silicon. The cover semiconductor channel material layer 153L can be formed with in-situ doping of the first conductivity type, or may be subsequently doped with dopants of the first conductivity type.

The cover dielectric material layer 154L can be conformally deposited over the cover semiconductor channel material layer 153L. In one embodiment, the cover dielectric material layer 154L can include a silicon oxide-based material such as undoped silicate glass.

Figure 10D:
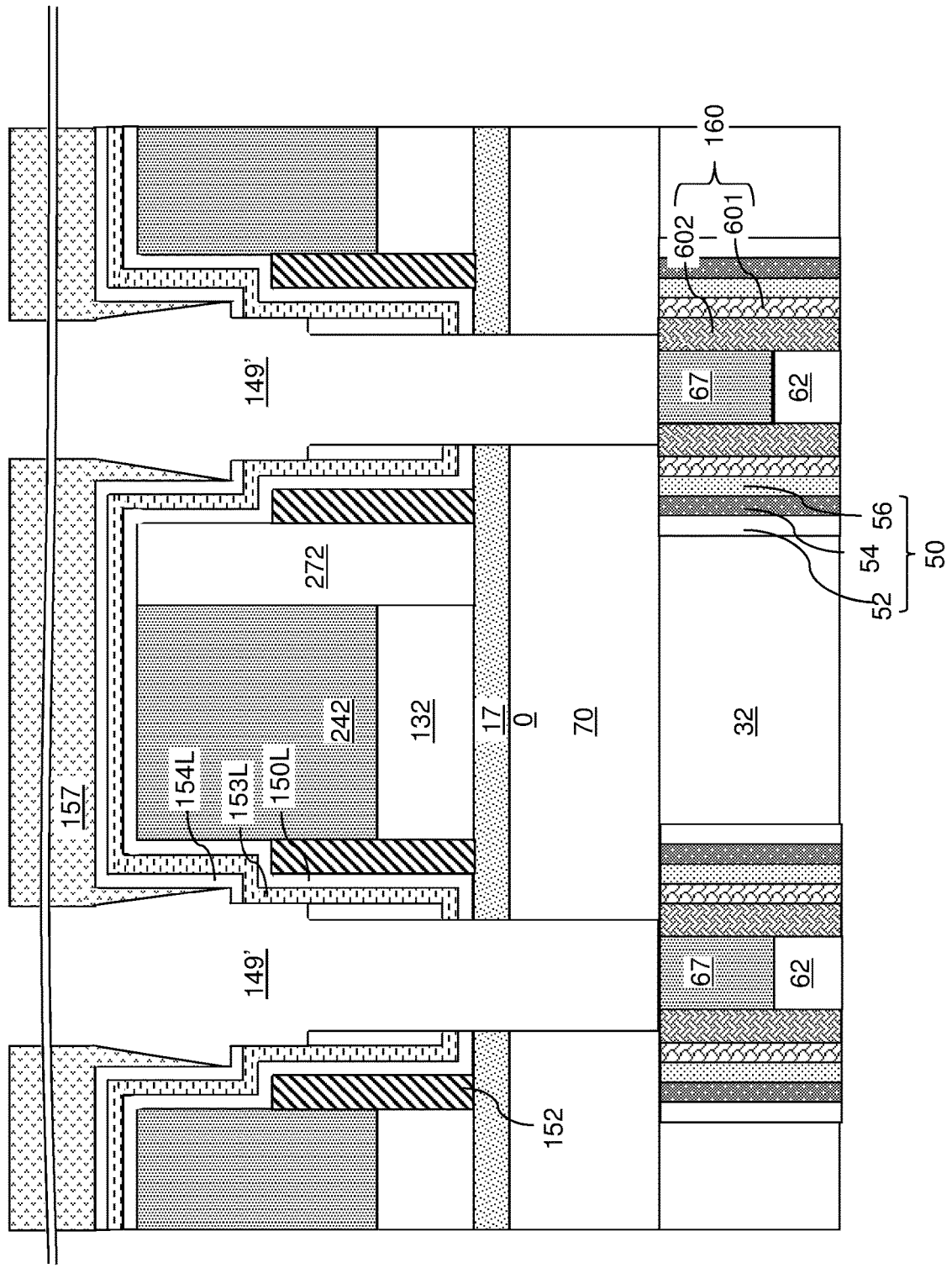

Referring to FIG. 10D, a patterning film 157 can be anisotropically deposited over the exemplary structure. The patterning film 157 can be deposited by a non-conformal deposition process such as plasma enhanced chemical vapor deposition. The maximum thickness of the patterning film 157 at the bottom of each drain-select-level opening 149 can be less than 80%, such as less than 50%, of the thickness of the patterning film 157 over the top surface of the drain-select-level sacrificial material layer 242. The maximum lateral thickness of the patterning film 157 on the sidewall of each drain-select-level opening 149 can be less than 80%, such as less than 50%, of the thickness of the patterning film 157 over the top surface of the drain-select-level sacrificial material layer 242. The lateral thickness of the patterning film 157 on the sidewall of each drain-select-level opening 149 can decrease with the depth from the horizontal plane including the top surface of the drain-select-level sacrificial material layer 242. For example, the patterning film 157 can include the Advanced Patterning Film (APF)™ that is commercially available from Applied Materials, Inc.

Each void laterally surrounded by a gate dielectric (i.e., a vertical portion of the gate dielectric layer 150L) can be vertically extended through the dielectric etch stop material layer 170 and the insulating cap layer 70 using an anisotropic etch process to form a drain-select-level cavity. An anisotropic etch process is performed to etch through material portions of the patterning film 157, the cover dielectric material layer 154L, the cover semiconductor channel material layer 153L, and the gate dielectric layer 150L located at the bottom of the drain-select-level openings 149. The anisotropic etch process includes a first step that etches through the portions of the patterning film 157 located at the bottom of the drain-select-level openings 149, a second step that etches through the portions of the cover dielectric material layer 154L at the bottom of the drain-select-level openings 149 selective to the material of the patterning film 157, a third step that etches through the portions of the cover semiconductor channel material layer 153L selective to the material of the patterning film 157, a fourth step that etches through the material of the gate dielectric layer 150L at the bottom of the drain-select-level openings 149 selective to the material of the patterning film 157, a fifth step that etches through the material of the dielectric etch stop material layer 170 underneath the drain-select-level openings 149 selective to the material of the patterning film 157, and a sixth step that etches through the material of the insulating cap layer 70 underneath the drain-select-level openings 149 selective to the material of the patterning film 157.

Each void laterally surrounded by the layer stack of the gate dielectric layer 150L, the cover semiconductor channel material layer 153L, and the cover dielectric material layer 154L is vertically extended to form a drain-select-level cavity 149'. A memory opening fill structure 58 is physically exposed at the bottom of each drain-select-level cavity 149'. A top surface of a sacrificial dielectric material portion 67 is physically exposed underneath each drain-select-level cavity 149'. Each drain-select-level cavity 149' comprises a void that is laterally surrounded by a gate dielectric. In one embodiment, the cover dielectric material layer 154L may be divided into multiple discrete portions depending on the thickness of the cover dielectric material layer 154L and a taper angle of sidewalls of the cover dielectric material layer 154L. The patterning film 157 may be consumed during the anisotropic etch process, or may be removed after the anisotropic etch process, for example, by ashing.

Figure 10E:
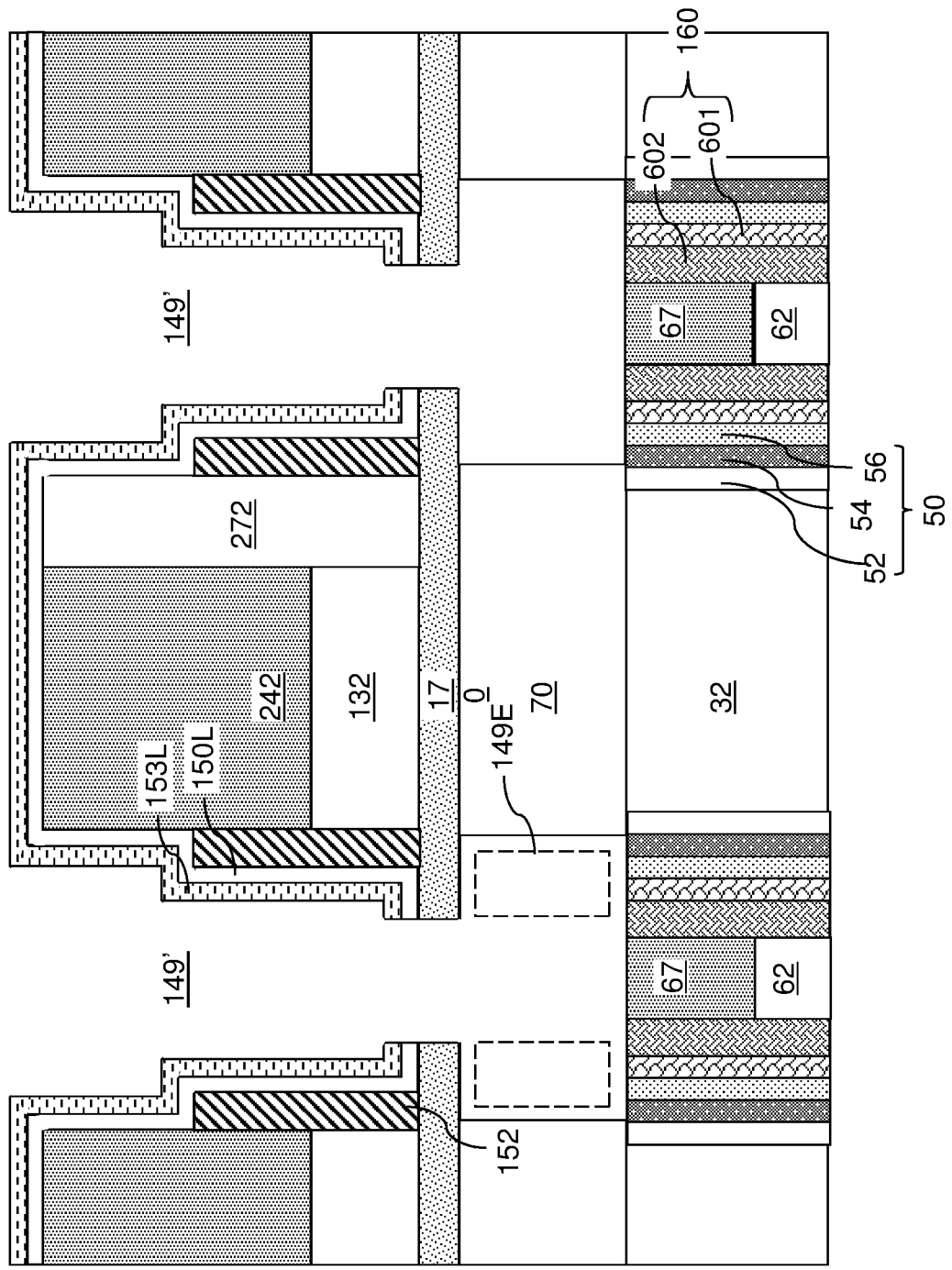

Referring to FIG. 10E, an isotropic etch process can be performed to laterally recess cylindrical sidewalls of the drain-select-level cavities 149'. Remaining portions of the cover dielectric material layer 154L can be collaterally removed during the isotropic etch process. For example, if the insulating cap layer 70 includes a silicon-oxide based material such as borosilicate glass, phosphosilicate glass, or undoped silicate glass, a wet etch using dilute hydrofluoric acid can be performed to laterally recess the vertical cylindrical sidewalls of the drain-select-level cavities 149'. Each drain-select-level cavity 149' includes a laterally expanded annular portion 149E that is formed by removal of an annular portion of the insulating cap layer 70 around the volume of a respective drain-select-level cavity 149' as provided at the processing steps of FIG. 10D. In one embodiment, removal of the material of the insulating cap layer 70 may be selective to the materials of the sacrificial dielectric material portions 67 and the dielectric etch stop material layer 170. Surfaces of the cover semiconductor channel material layer 153L can be physically exposed after removal of the cover dielectric material layer 154L.

Figure 10F:
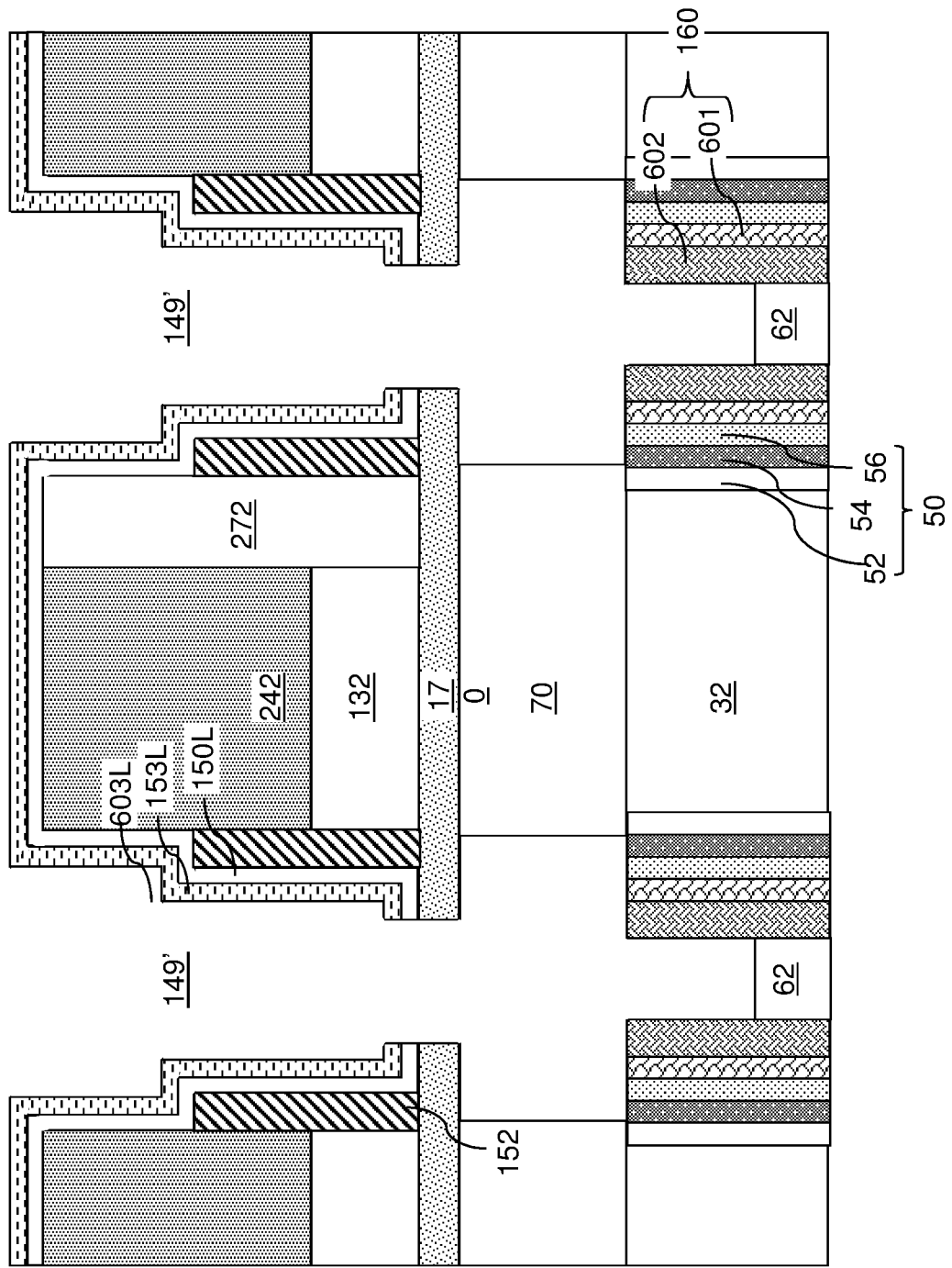

Referring to FIG. 10F, the sacrificial dielectric material portions 67 are removed from underneath the drain-select-level cavities 149' selective to the materials of the word-line-level semiconductor channel portions 160, the cover semiconductor channel material layer 153L, the insulating cap layer 70, and the dielectric etch stop material layer 170 underneath the drain-select-level openings. For example, if the sacrificial dielectric material portions 67 include silicon nitride, a wet etch process using hot phosphoric acid can be used to remove the sacrificial dielectric material portions 67 selective to the materials of the word-line-level semiconductor channel portions 160, the cover semiconductor channel material layer 153L, the insulating cap layer 70, and the dielectric etch stop material layer 170.

Figure 10G:
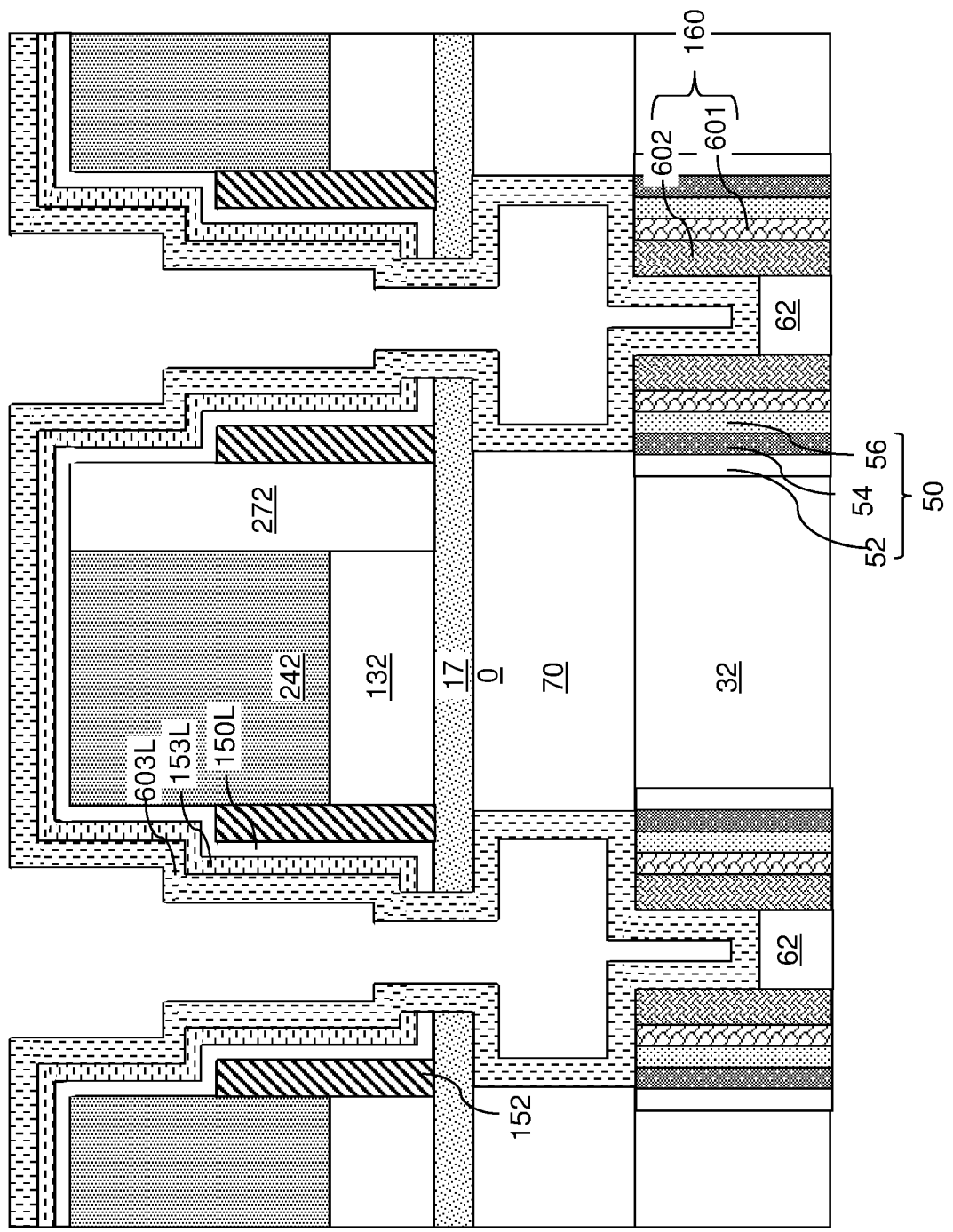

Referring to FIG. 10G, a drain-select-level semiconductor channel layer 603L can be deposited at the periphery of each drain-select-level cavity 149' by a conformal deposition process such as low pressure chemical vapor deposition (LPCVD). The drain-select-level semiconductor channel layer 603L can include any semiconductor material that can be used for the first semiconductor channel layer 601 or for the second semiconductor channel layer 602. The drain-select-level semiconductor channel layer 603L includes a semiconductor material having a doping of the first conductivity type. The drain-select-level semiconductor channel layer 603L is deposited directly on the inner sidewall of each word-line-level semiconductor channel portion 160, and can be formed on an annular top surface of each word-line-level semiconductor channel portion 160. The thickness of the drain-select-level semiconductor channel layer 603L can be in a range from 3 nm to 60 nm, such as from 6 nm to 30 nm, although lesser and greater thicknesses can also be used.

Figure 10H:
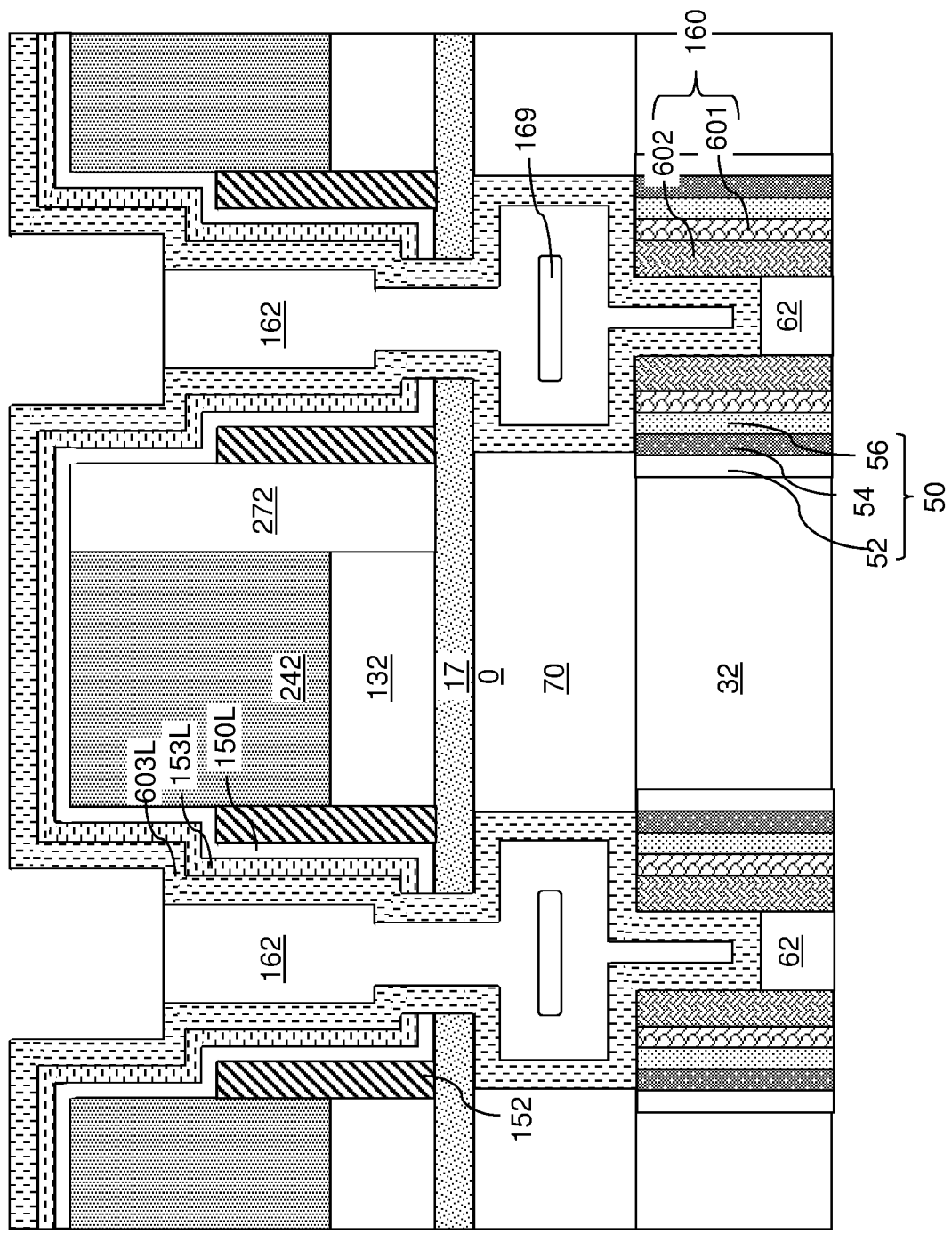

Referring to FIG. 10H, a drain-select-level dielectric core layer can be deposited in remaining volumes of the drain-select-level cavities 149'. The drain-select-level dielectric core layer includes a dielectric material such as silicon oxide or organosilicate glass. The drain-select-level dielectric core layer can be deposited by a conformal deposition method such as low pressure chemical vapor deposition (LPCVD), or by a self-planarizing deposition process such as spin coating. The material of the drain-select-level dielectric core layer can be recessed selective to the material of the drain-select-level semiconductor channel layer 603L below the horizontal plane including the top surface of the drain-select-level sacrificial material layer 242. An isotropic etch process or an anisotropic etch process can be used to recess the material of the drain-select-level dielectric core layer. Each remaining portion of the drain-select-level dielectric core layer constitutes a drain-select-level dielectric core 162. In some embodiments, an encapsulated void 169 may be formed within each drain-select-level dielectric core 162.

Each encapsulated void 169 is a volume that is not filled with the dielectric material of the drain-select-level dielectric core layer, and is free of any solid or liquid. A drain-select-level dielectric core 162 may, or may not, include an encapsulated void therein.

Figure 10I:
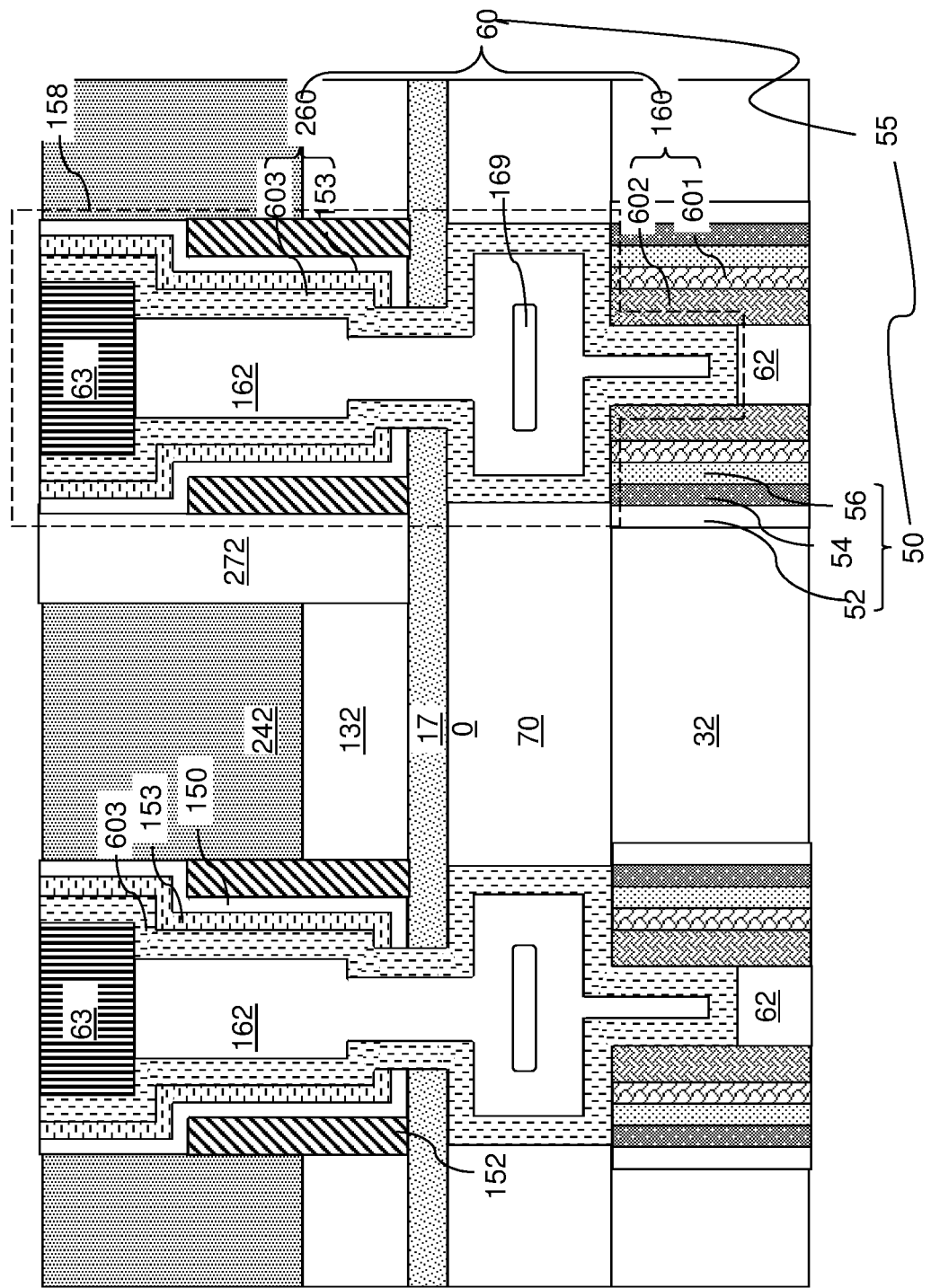

Referring to FIG. 10I, a heavily doped semiconductor material having a doping of the second conductivity type can be deposited in recessed volumes overlying the drain-select-level dielectric cores 162. A drain region 63 having a doping of the second conductivity type can be formed within a recess region overlying each drain-select-level dielectric core 162. Portions of the deposited doped semiconductor material having the doping of the second conductivity type, the drain-select-level semiconductor channel layer 603L, the cover semiconductor channel material layer 153L, and the gate dielectric layer 150L can be removed from above the horizontal plane including the top surface of the drain-select-level sacrificial material layer 242 by a planarization process. The planarization process can use chemical mechanical planarization (CMP) and/or a recess etch. Each remaining portion of the drain-select-level semiconductor channel layer 603L constitutes an outer drain-select-level semiconductor channel portion 603. Each remaining portion of the cover semiconductor channel material layer 153L constitutes an inner drain-select-level semiconductor channel material portion 153. Each contiguous combination of an outer drain-select-level semiconductor channel portion 603 and an inner drain-select-level semiconductor channel portion 153 constitutes a drain-select-level semiconductor channel portion 260. Each remaining portions of the gate dielectric layer 150L constitutes a gate dielectric 150.

A cylindrical gate electrode 152 and a gate dielectric 150 are formed within each drain-select-level opening 149. Each cylindrical gate electrode 152 is formed at a periphery of a drain-select-level opening 149. Each gate dielectric 150 is formed on an inner sidewall of the cylindrical gate electrode 152. Each drain-select-level semiconductor channel portion 260 is formed directly on a word-line-level semiconductor channel portion 160, and directly on an inner sidewall of a gate dielectric 150. Each drain-select-level dielectric core 162 is formed within a volume laterally surrounded by a drain-select-level semiconductor channel portion 260. Each drain region 63 is formed at an upper end portion of the drain-select-level semiconductor channel portion 260. The drain regions 63 have a doping of an opposite conductivity type than the drain-select-level semiconductor channel portions 260 and the word-line-level semiconductor channel portions 160.

The set of all elements within a memory opening as expanded by the processing steps of FIG. 10F constitutes a drain-select-level pillar structure 158. Each drain-select-level pillar structure 158 overlies a memory opening fill structure 58. Each drain-select-level pillar structure 158 includes a cylindrical gate electrode 152, a gate dielectric 150, and a drain-select-level semiconductor channel portion 260, a drain-select-level dielectric core 162, and a drain region 63. Because each drain-select-level semiconductor channel portion 260 is formed in the volume formed by removal of a sacrificial dielectric material portion 67, each vertical interface between the drain-select-level semiconductor channel portion 260 and the word-line-level semiconductor channel portion 160 can be vertically coincident with an interface between the word-line-level semiconductor channel portion 160 and the word-line-level dielectric core 62.

The insulating cap layer 70 overlies the alternating stack (32, 42). A vertical interface between the drain-select-level semiconductor channel portion 260 and the insulating cap layer 70 is laterally offset from the vertical interface between the word-line-level semiconductor channel portion 160 and the word-line-level dielectric core 62 within each vertical stack of a memory opening fill structure 58 and drain-select-level pillar structure 158. A portion of the drain-select-level semiconductor channel portion 260 laterally surrounded by the insulating cap layer 70 has a greater lateral extent than a portion of the drain-select-level semiconductor channel layer 260 laterally surrounded by the word-line-level semiconductor channel portion 160.

The dielectric etch stop material layer 170 overlies the insulating cap layer 70. A portion of the drain-select-level semiconductor channel portion 260 laterally surrounded by the dielectric etch stop material layer 170 has a lesser lateral extent than the portion of the drain-select-level semiconductor channel portion 260 laterally surrounded by the insulating cap layer 70. The gate dielectric 152 and the cylindrical gate electrode 150 are vertically spaced from the word-line-level semiconductor channel portion 160 by the insulating cap layer 70 and the dielectric etch stop material layer 170 for each vertical stack of a memory opening fill structure 58 and drain-select-level pillar structure 158.

The dielectric etch stop material layer 170 underlies the cylindrical gate electrode 152. A region of the drain-select-level dielectric core 162 underlying the dielectric etch stop material layer 170 (and laterally surrounded by the insulating cap layer 70) has a greater lateral extent than a region of the drain-select-level dielectric core 162 that is laterally surrounded by the dielectric etch stop material layer 170.

Figure 10J:
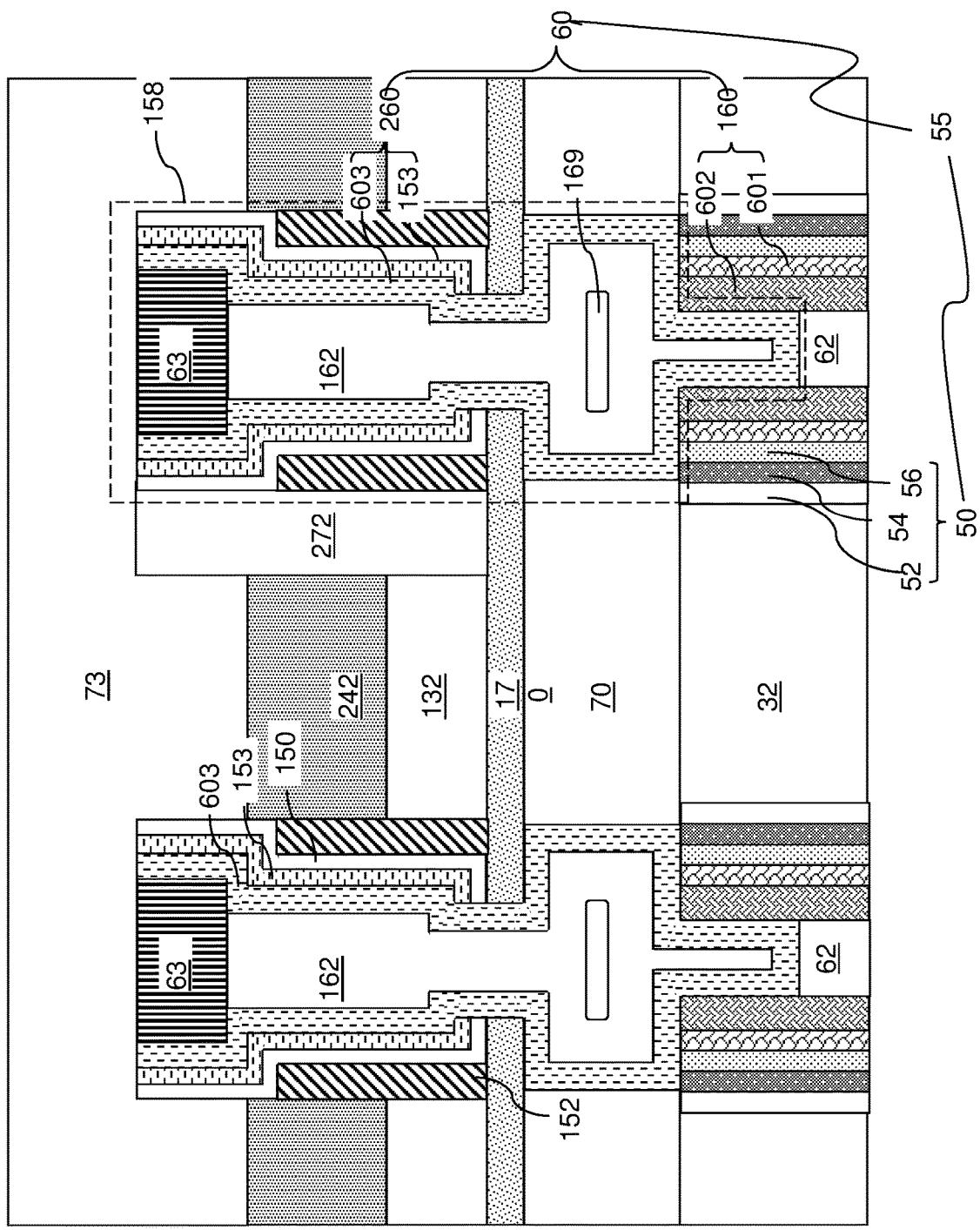
Figure 11:
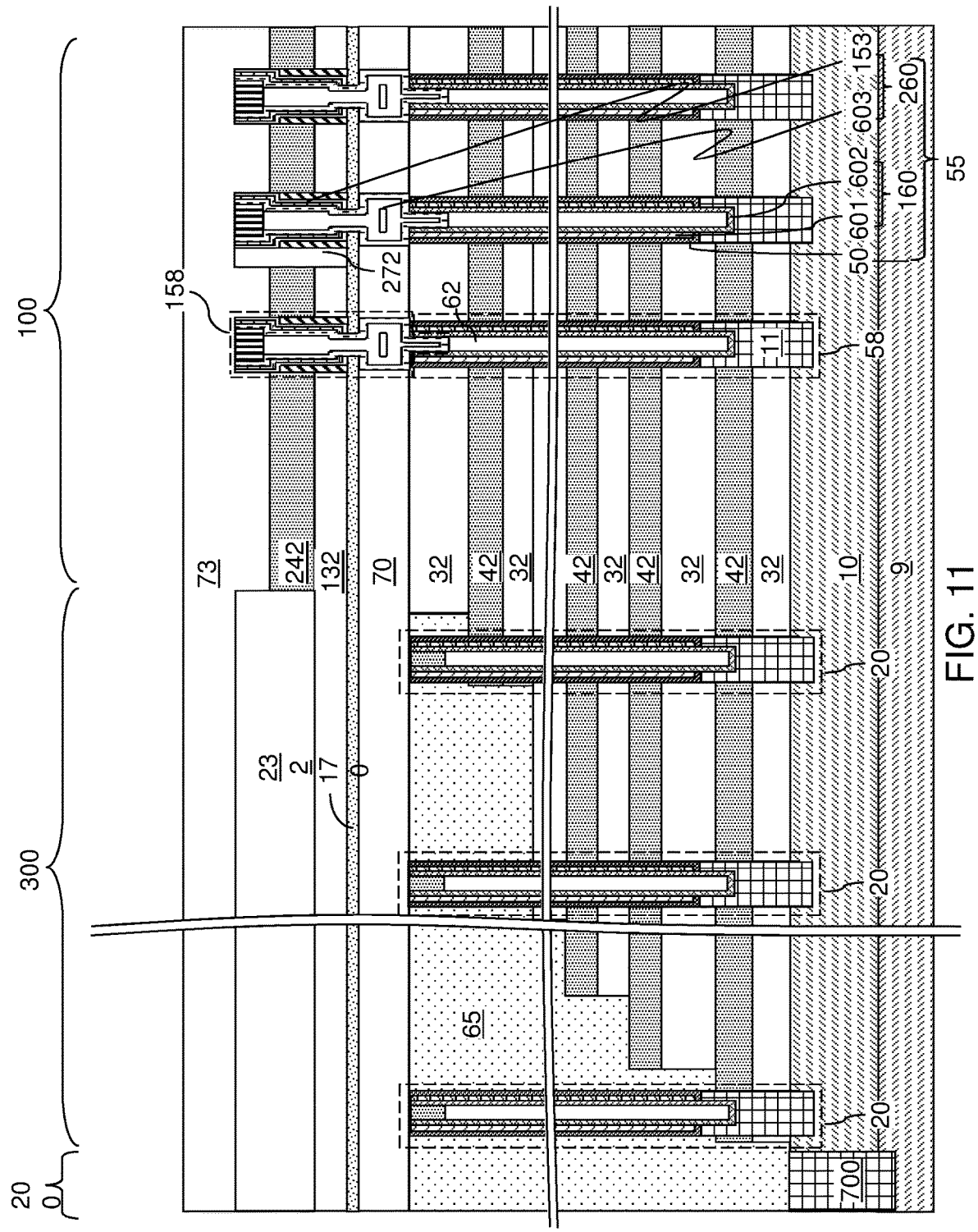
FIG. 11 is a vertical cross-sectional view of the exemplary structure at the processing step of FIG. 10J.

Referring to FIGS. 10J and 11, the drain-select-level sacrificial material layer 242 is vertically recessed by a recess etch that is selective to the materials of the drain regions 63, the drain-select-level semiconductor channel portions 260, and the gate dielectrics 150. For example, if the drain-select-level sacrificial material layer 242 includes silicon nitride, the drain-select-level sacrificial material layer 242 can be recessed by a wet etch process using hot phosphoric acid. The duration of the wet etch process can be selected such that a recessed horizontal surface of the drain-select-level sacrificial material layer 242 is located between a horizontal plane including topmost surfaces of the cylindrical gate electrodes 152 and between a horizontal plane including bottom surfaces of the drain regions 63.

A contact level dielectric layer 73 can be formed over the drain regions 63. The contact level dielectric layer 73 includes a dielectric material that is different from the dielectric material of the drain-select-level sacrificial material layer 242. For example, the contact level dielectric layer 73 can include silicon oxide. The contact level dielectric layer 73 can be formed by a self-planarizing process such as spin coating, or can be planarized after deposition, for example, by chemical mechanical planarization. The contact level dielectric layer 73 can have a thickness in a range from 50 nm to 500 nm above each drain region 63, although lesser and greater thicknesses can also be used.

Figure 12A:
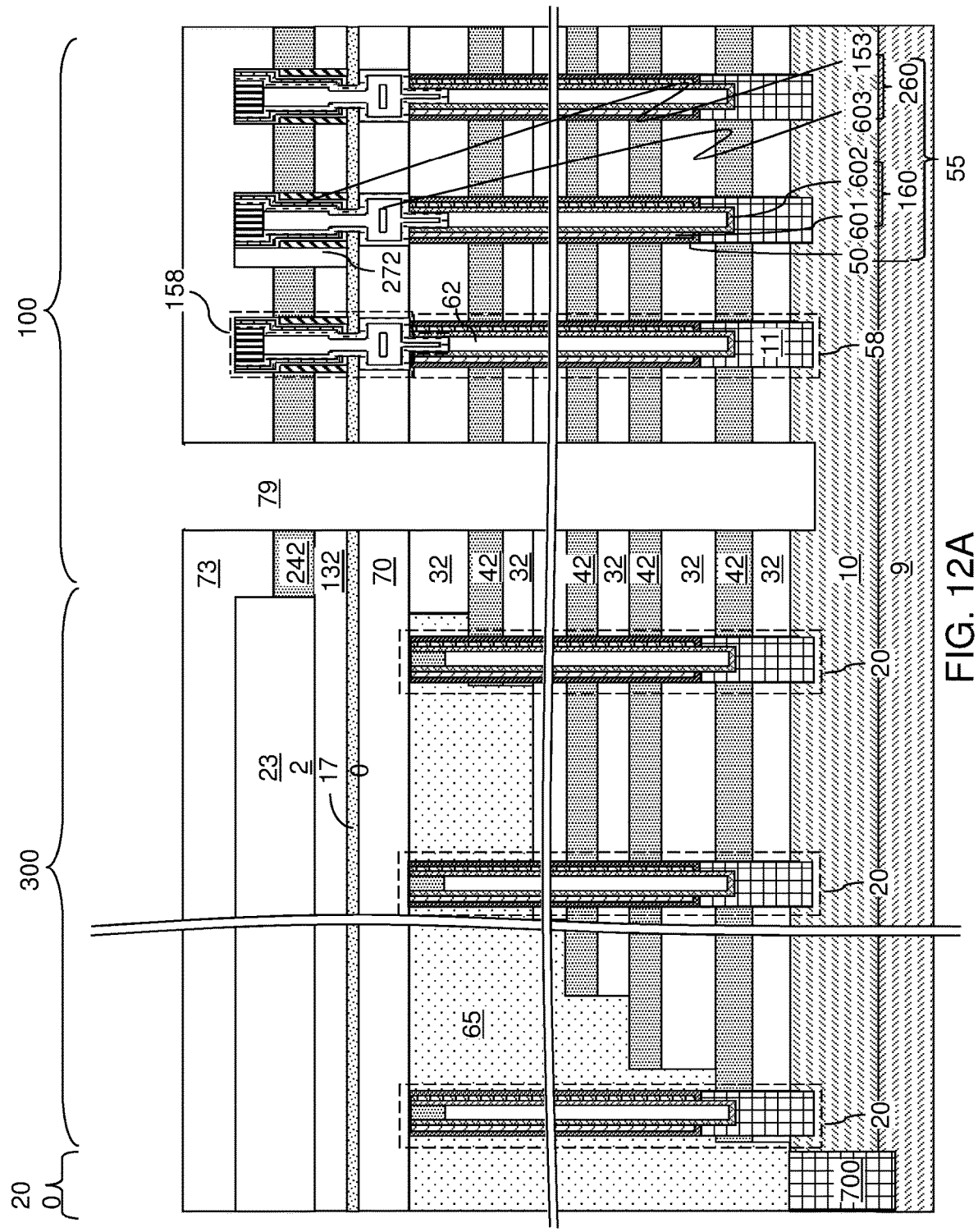
FIG. 12A is a schematic vertical cross-sectional view of the exemplary structure after formation of backside trenches according to an embodiment of the present disclosure.
Figure 12B:
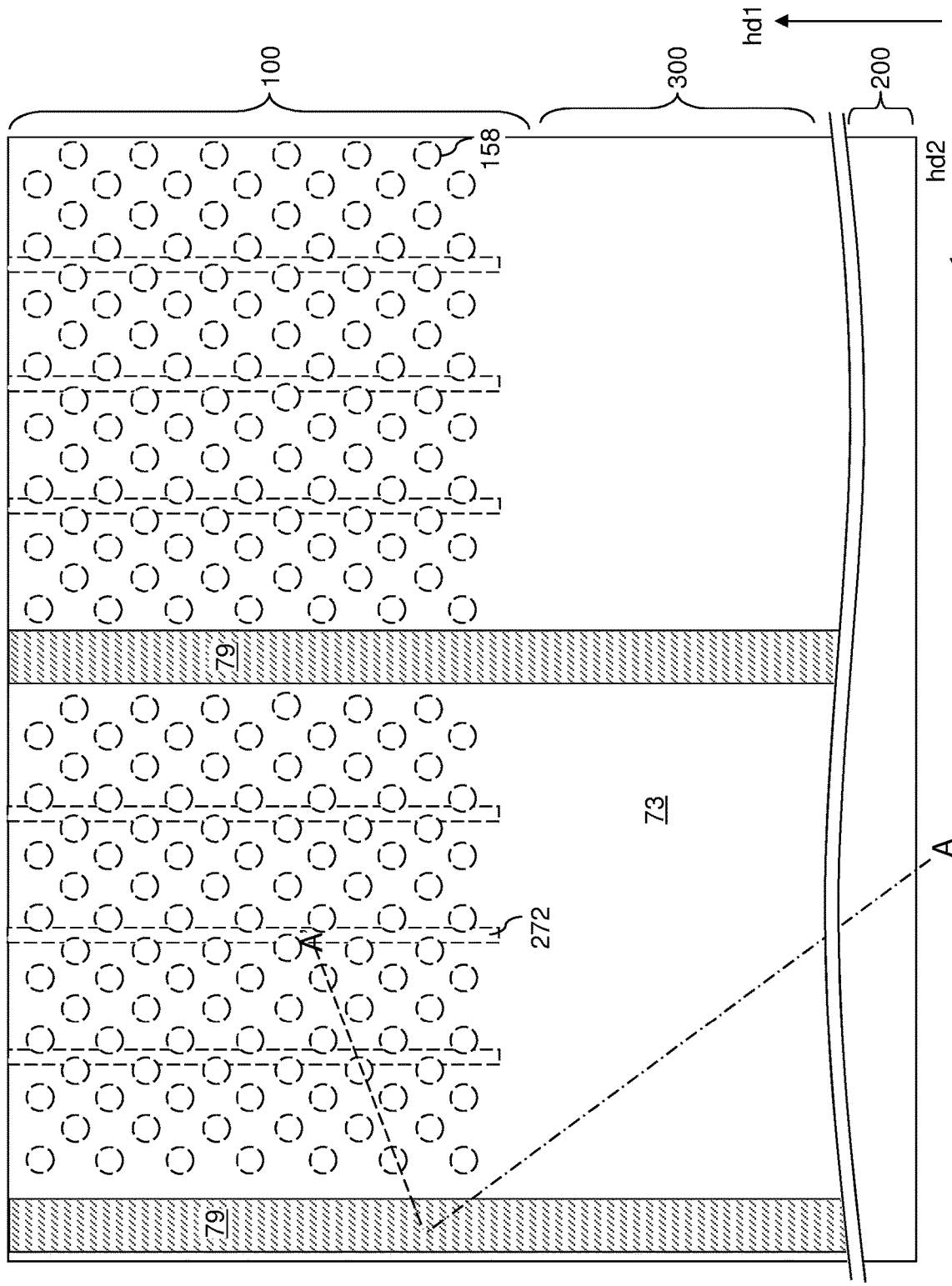
FIG. 12B is a partial see-through top-down view of the exemplary structure of FIG. 12A. The vertical plane A-A' is the plane of the schematic vertical cross-sectional view of FIG. 12A.

Referring to FIGS. 12A and 12B, a photoresist layer (not shown) can be applied over the contact level dielectric layer 73, and is lithographically patterned to form openings in areas between clusters of drain-select-level pillar structures 158. The pattern in the photoresist layer can be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart one from another along a second horizontal direction hd2 that is perpendicular to the first horizontal direction hd1. The drain-select-level pillar structures 158 (and underlying memory opening fill structures 58) can be arranged in rows that extend along the first horizontal direction hd1. The drain-select-level isolation structures 272 can laterally extend along the first horizontal direction hd1. Each backside trench 79 can have a uniform width that is invariant along the lengthwise direction (i.e., along the first horizontal direction hd1). In one embodiment, the backside trenches 79 can include a source contact opening in which a source contact via structure can be subsequently formed. The photoresist layer can be removed, for example, by ashing.

Figure 13:
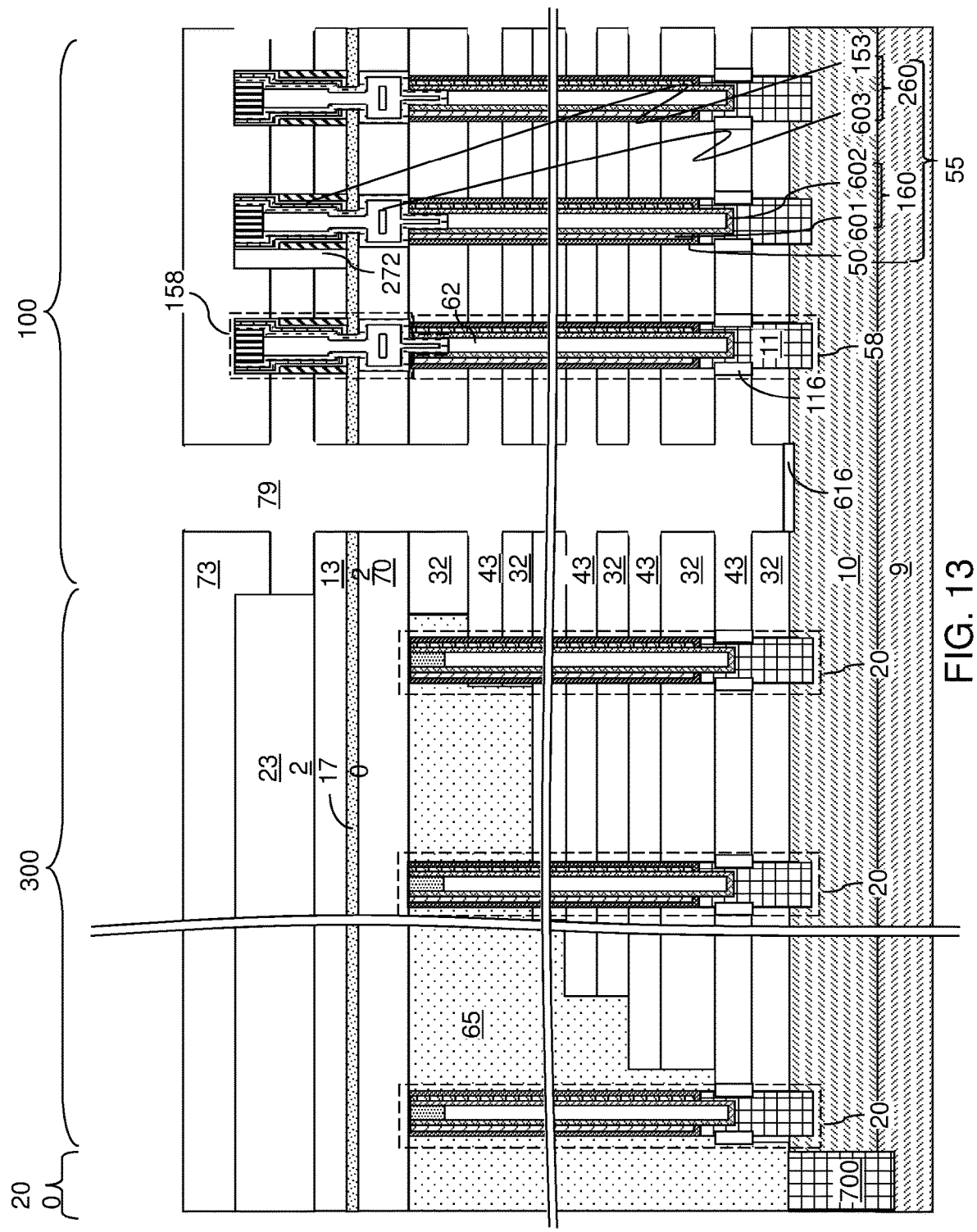
FIG. 13 is a schematic vertical cross-sectional view of the exemplary structure after formation of backside recesses according to an embodiment of the present disclosure.

Referring to FIGS. 13 and 14A, an etchant that selectively etches the second material of the sacrificial material layers 42 and the material of the drain-select-level sacrificial material layer 242 with respect to materials of the first material of the insulating layers 32, the insulating cap layer 70, the dielectric etch stop material layer 170, the drain-select-level insulating layer 132, and the contact level dielectric layer 73 can be introduced into the backside trenches 79 using an isotropic etch process. FIG. 14A illustrates a region of the exemplary structure of FIG. 13. Backside recesses 43 are formed in volumes from which the sacrificial material layers 42 are removed. Drain-select-level backside recesses are formed in volumes from which the drain-select-level sacrificial material layer 242 is removed. The removal of the second material of the sacrificial material layers 42 and the material of the drain-select-level sacrificial material layer 242 can be selective to the first material of the insulating layers 32, the material of the retro-stepped dielectric material portion 65, the materials of the insulating cap layer 70, the dielectric etch stop material layer 170, the drain-select-level insulating layer 132, and the contact level dielectric layer 73, the semiconductor material of the semiconductor material layer 10, and the material of the outermost layer of the memory films 50. In one embodiment, the sacrificial material layers 42 and the drain-select-level sacrificial material layer 242 can include silicon nitride, and the materials of the insulating layers 32, the retro-stepped dielectric material portion 65, the insulating cap layer 70, the dielectric etch stop material layer 170, the drain-select-level insulating layer 132, and the contact level dielectric layer 73 can be selected from silicon oxide and dielectric metal oxides.

In one embodiment, if the sacrificial material layers 42 and the drain-select-level sacrificial material layer 242 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and memory opening fill structures 58, and the drain-select-level pillar structures 158 provide structural support while the backside recesses 43 and the drain-select-level backside recesses are present within volumes previously occupied by the sacrificial material layers 42 and the drain-select-level sacrificial material layer 242, respectively.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each drain-select-level backside recess defines a space for receiving a respective drain-select-level gate electrode.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 14B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory opening fill structures 58 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory opening fill structures 58 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 14C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 15:
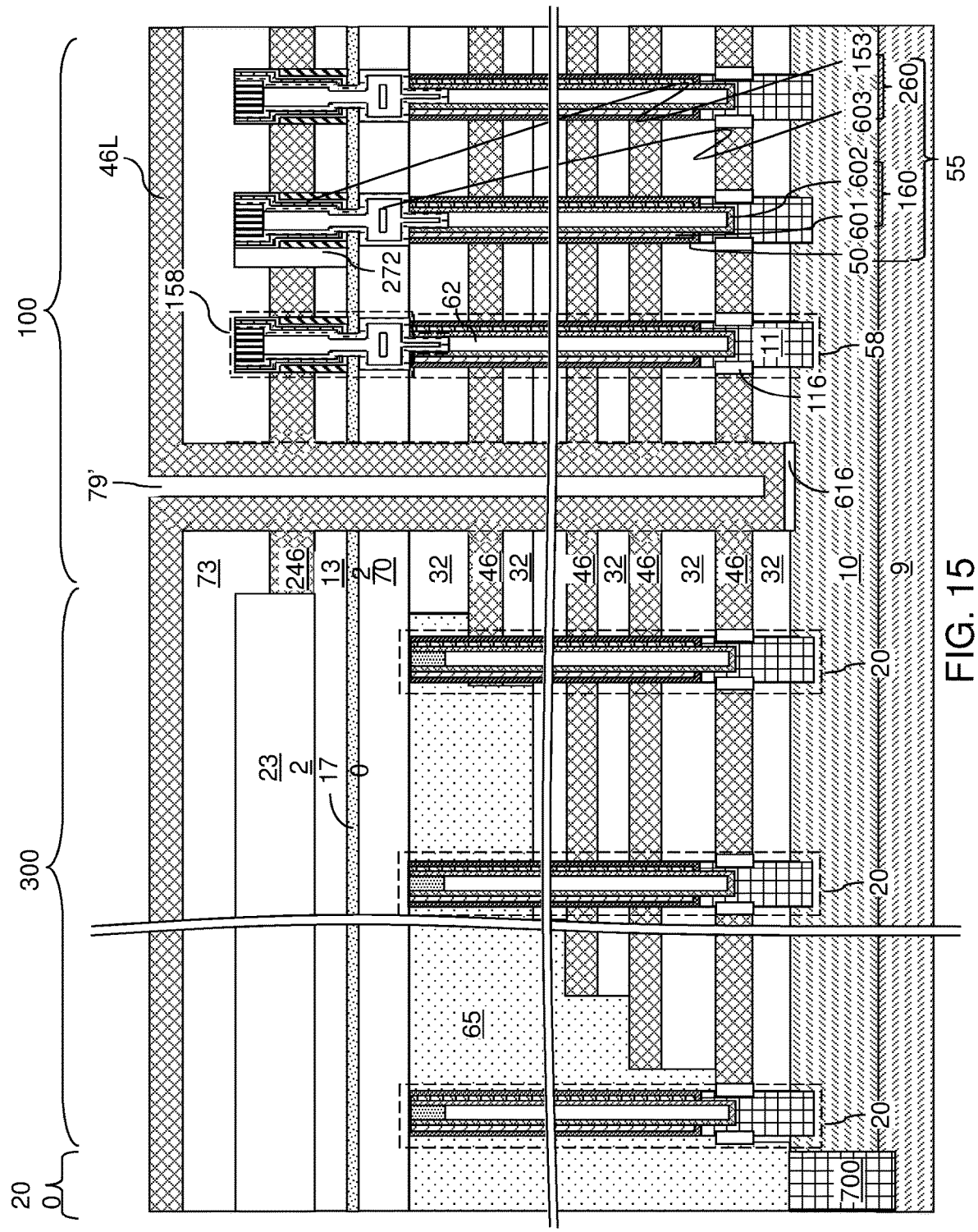
FIG. 15 is a schematic vertical cross-sectional view of the exemplary structure at the processing step of FIG. 14D.

Referring to FIGS. 14D and 15, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory opening fill structures 58 by the metallic barrier layer 46A, which is a metallic barrier layer that blocks diffusion of fluorine atoms therethrough.

A plurality of word-line-level electrically conductive layers 46 can be formed in the plurality of backside recesses 43, a plurality of drain-select-level electrically conductive layers 246 can be formed in the volumes of the drain-select-level lateral recesses that are laterally spaced apart, and a continuous metallic material layer 46L can be formed on the sidewalls of each backside trench 79 and over the contact level dielectric layer 73. Each word-line-level electrically conductive layer 46 includes a portion of the metallic barrier layer 46A and a portion of the metallic fill material layer 46B that are located between a vertically neighboring pair of dielectric material layers such as a pair of insulating layers 32. Each drain-select-level electrically conductive layer 246 includes a portion of the metallic barrier layer 46A and a portion of the metallic fill material layer 46B that are forming in a volume of the drain-select-level backside recesses. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with a word-line-level electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost word-line-level electrically conductive layer 46 laterally surrounds each tubular dielectric spacer 116 upon formation of the word-line-level electrically conductive layers 46. Each contiguous combination of a word-line-level semiconductor channel portion 160 and a drain-select-level semiconductor channel portion 260 constitutes a vertical semiconductor channel (160, 260). Each contiguous combination of a memory film 50, a word-line-level semiconductor channel portion 160, and a drain-select-level semiconductor channel portion 260 constitutes a memory stack structure 55 that includes a vertical stack of memory elements and a vertical semiconductor channel (160, 260).

Figure 16:
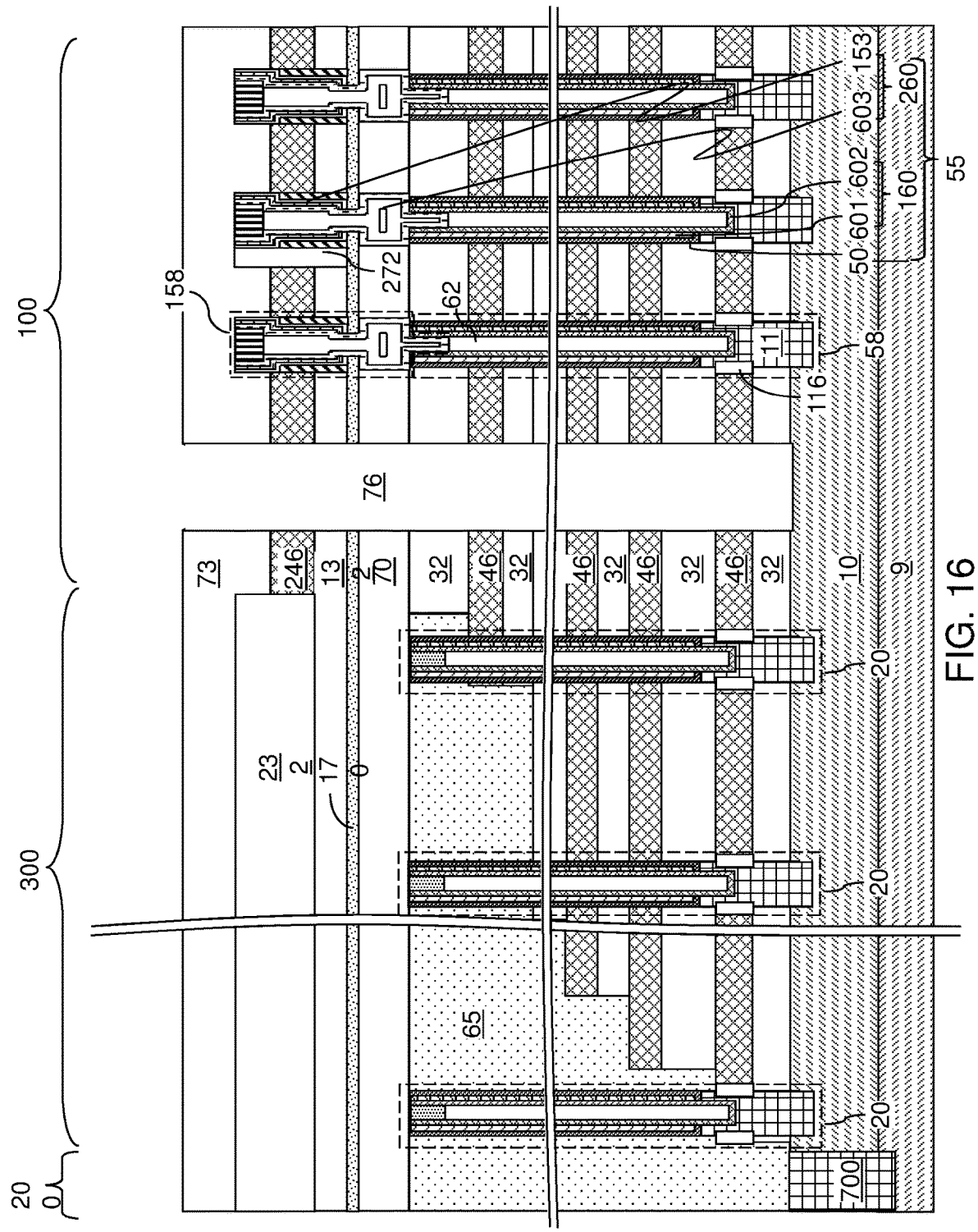
FIG. 16 is a schematic vertical cross-sectional view of the exemplary structure after removal of a deposited conductive material from within the backside trench according to an embodiment of the present disclosure.

Referring to FIG. 16, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining discrete portion of the deposited metallic material in the backside recesses 43 constitutes a word-line-level electrically conductive layer 46. Each remaining discrete portion of the deposited metallic material in the drain-select-level backside recesses constitutes a drain-select-level electrically conductive layer 246. Each word-line-level electrically conductive layer 46 can be a conductive line structure. Thus, the sacrificial material layers 42 are replaced with the word-line-level electrically conductive layers 46.

Each word-line-level electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each word-line-level electrically conductive layer 46 are the control gate electrodes for the vertical memory devices including the memory stack structures 55. In other words, each word-line-level electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

While in the embodiment described above the remaining portions of the drain-select-level sacrificial layer 242 is replaced with the drain-select-level electrically conductive layer 246 (e.g., drain select gate electrode) concurrently with replacement of the sacrificial material layer 42 with electrically conductive layers 46 (e.g., word lines), embodiments are expressly contemplated herein in which replacement of the sacrificial material layers 42 with the electrically conductive layers 46 precedes replacement of the remaining portions of the drain-select-level sacrificial layer 242 with the drain-select-level electrically conductive layer 246.

In this case, replacement of the sacrificial material layers 42 with the electrically conductive layers 46 may be performed by forming backside trenches through the insulating cap layer 70 and the alternating stack (32, 42) prior to formation of the dielectric etch stop material layer 170, by forming backside recesses 43 through removal of the sacrificial material layers 42, and by formation of the electrically conductive layers 46 through deposition of at least one conductive material in the backside recesses 43. The drain-select-level sacrificial layer 242 is replaced with the drain-select-level electrically conductive layer 246 at a later step after formation of the electrically conductive layers 46.

In an alternative embodiment, the drain-select-level sacrificial layer 242 may include a different sacrificial material than the sacrificial material layers 42. For example, the drain-select-level sacrificial layer 242 may include amorphous silicon or amorphous carbon and the sacrificial material layers 42 may include silicon nitride. In this case, two separate replacement processes may be sequentially performed to replace the drain-select-level sacrificial layer 242 with the drain-select-level electrically conductive layers 246 and to replace the sacrificial material layer 42 with electrically conductive layers 46. Replacement of the drain-select-level sacrificial layer 242 with the drain-select-level electrically conductive layer 246 may precede, or follow, replacement of the sacrificial material layers 42 with electrically conductive layers 46.

Figure 17A:
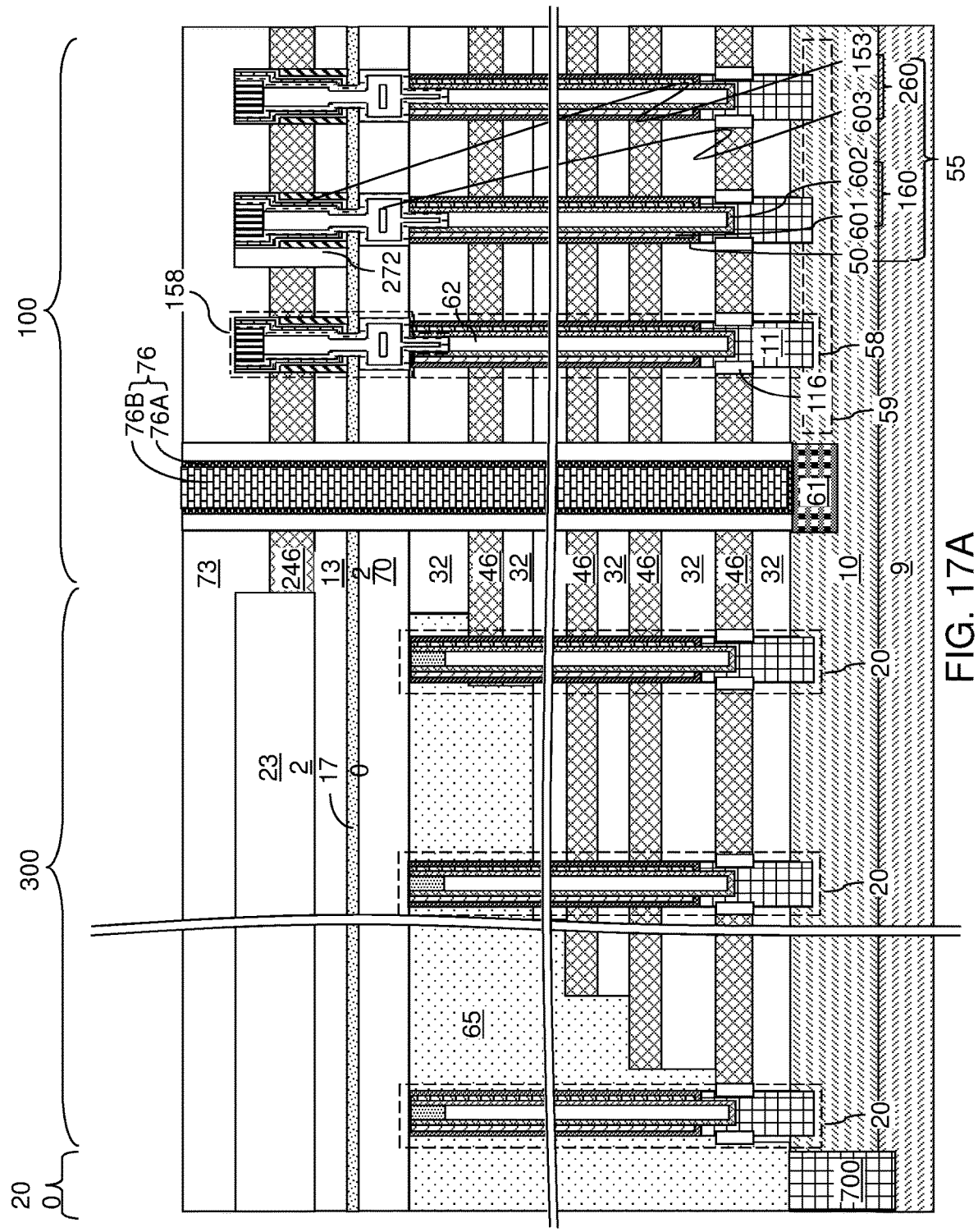
FIG. 17A is a schematic vertical cross-sectional view of the exemplary structure after formation of an insulating spacer and a backside contact structure according to an embodiment of the present disclosure.
Figure 17B:
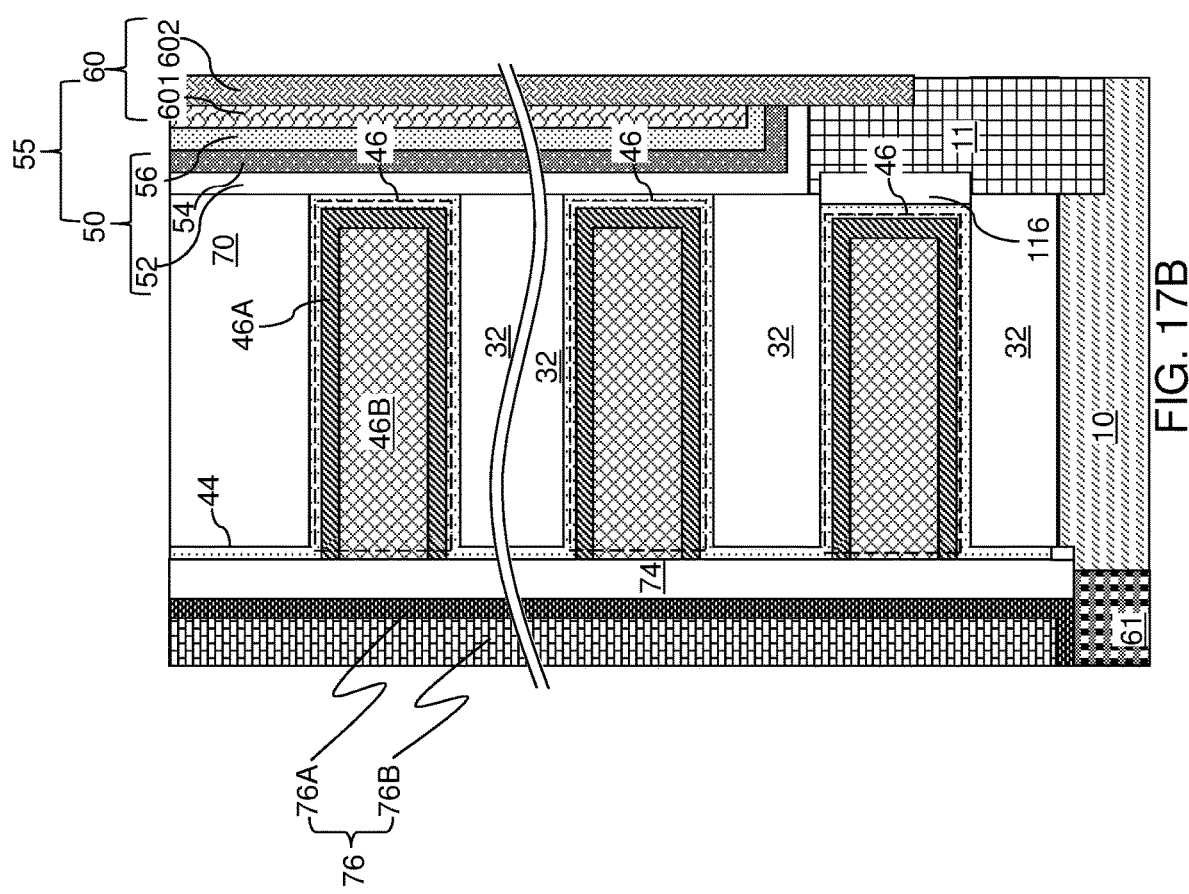
FIG. 17B is a magnified view of a region of the exemplary structure of FIG. 17A.

Referring to FIGS. 17A and 17B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the word-line-level electrically conductive layers 46. If a backside blocking dielectric layer 44 is not used, the insulating material layer can be formed directly on sidewalls of the insulating layers 32 and directly on sidewalls of the word-line-level electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels (160, 260) through respective pedestal channel portions 11. The horizontal semiconductor channel 59 contacts the source region 61 and the plurality of pedestal channel portions 11. A bottommost word-line-level electrically conductive layer 46 provided upon formation of the word-line-level electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 160, 260) extend between each source region 61 and a respective set of drain regions 63. The semiconductor channels (59, 11, 160, 260) include the vertical semiconductor channels (160, 260) of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the contact level dielectric layer 73 overlying the alternating stack (32, 46) as a stopping layer. If chemical mechanical planarization (CMP) process is used, the contact level dielectric layer 73 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

Figure 18A:
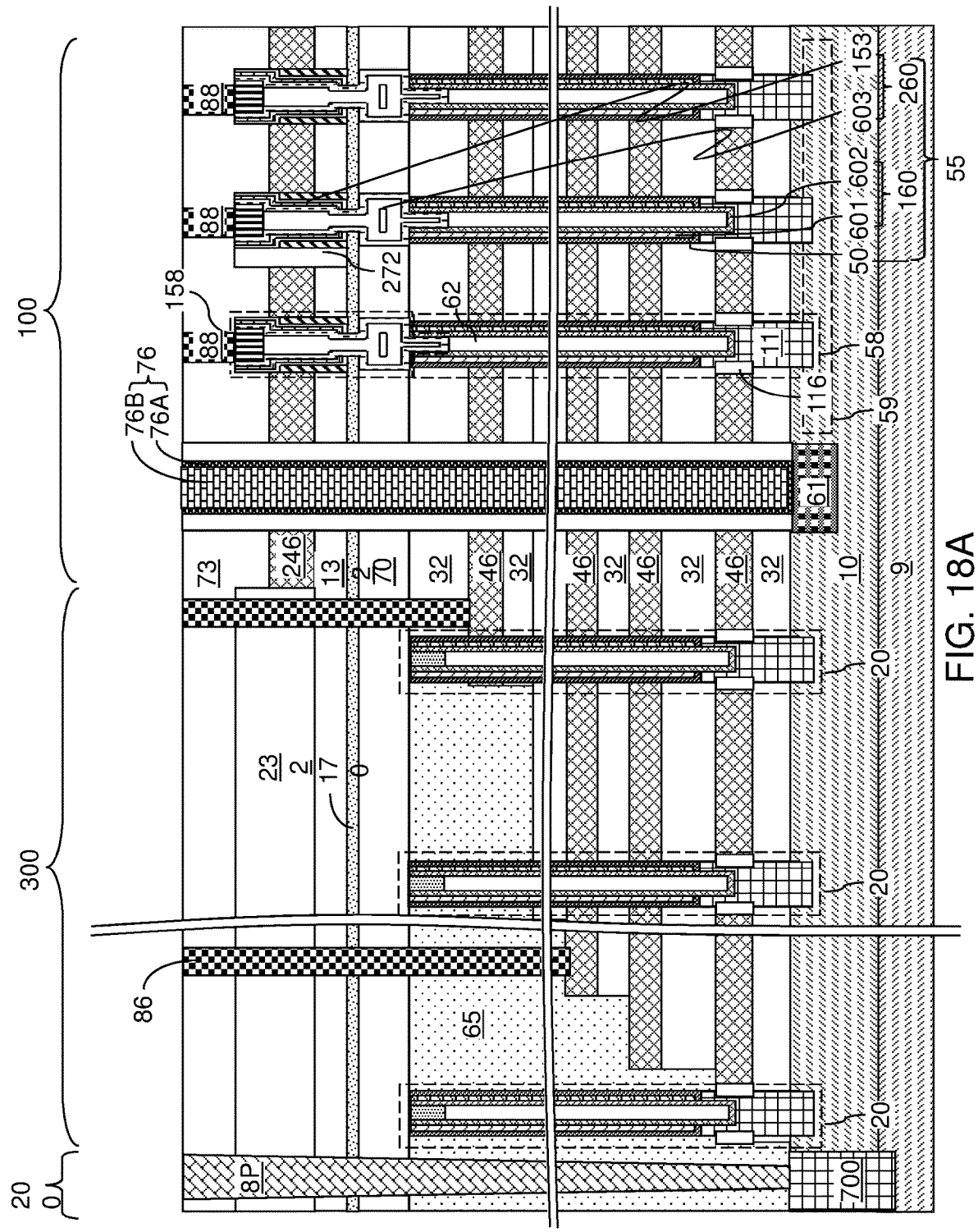
FIG. 18A is a schematic vertical cross-sectional view of the exemplary structure after formation of additional contact via structures according to an embodiment of the present disclosure.
Figure 18B:
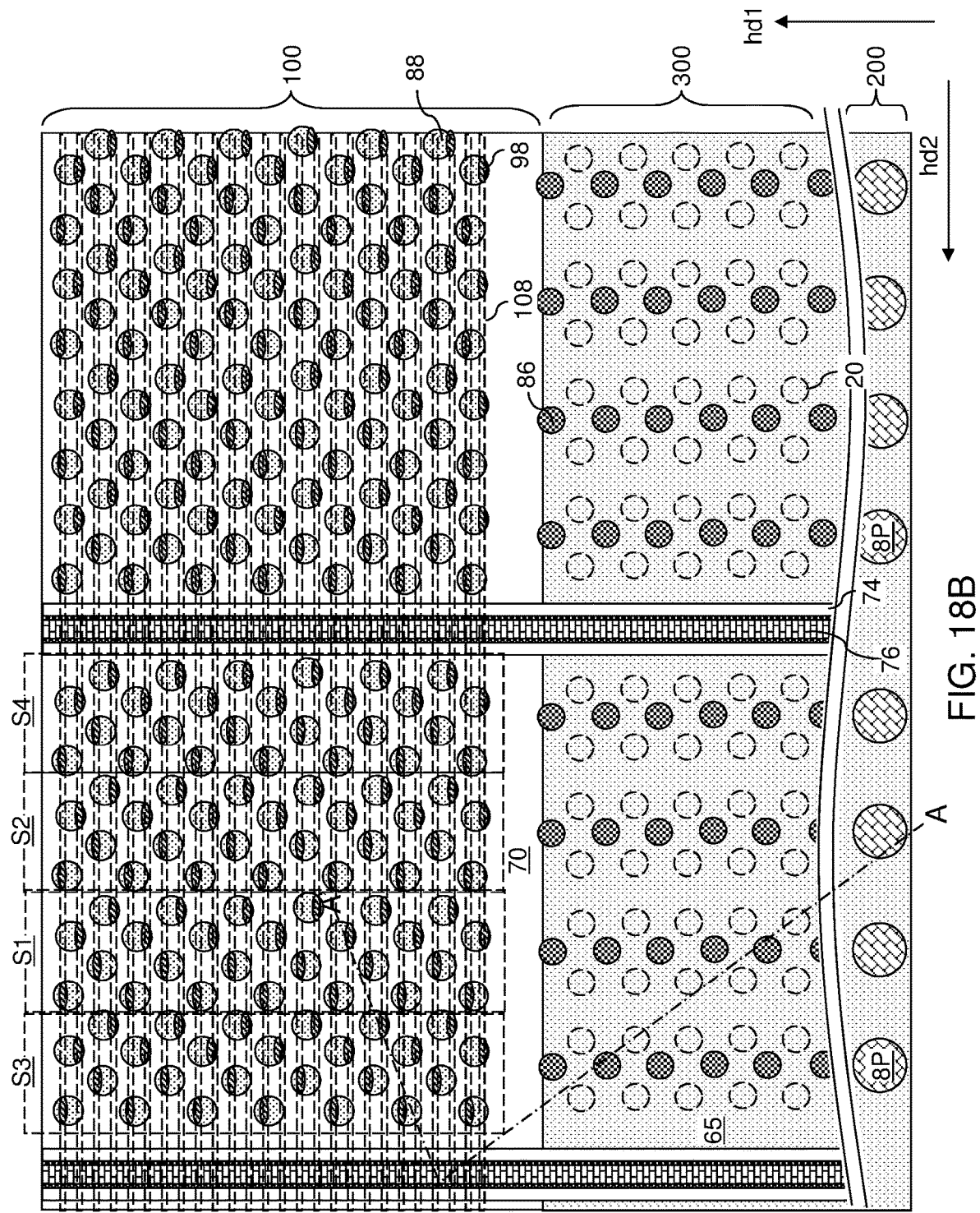
FIG. 18B is a top-down view of the exemplary structure of FIG. 18A. Interconnect via structures and bit lines that can be formed over the exemplary structure of FIG. 18A are schematically illustrated. The vertical plane A-A' is the plane of the schematic vertical cross-sectional view of FIG. 18A.

Referring to FIGS. 18A and 18B, additional contact via structures (88, 86, 8P) can be formed through the contact level dielectric layer 73, and optionally through the dielectric isolation layer 232, the drain-select-level insulating layer 132, the dielectric etch stop material layer 170, the insulating cap layer 70, and the retro-stepped dielectric material portion 65. For example, drain contact via structures 88 can be formed through the contact level dielectric layer 73 on each drain region 63. Word line contact via structures 86 can be formed on the word-line-level electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The exemplary structures can include a three-dimensional memory device. In one embodiment, the three-dimensional memory device comprises a monolithic three-dimensional NAND memory device. The word-line-level electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (e.g., a portion of a charge storage layer 54 at a level of an word-line-level electrically conductive layer 46) in a first device level of the array of monolithic three-dimensional NAND strings can be located over another memory cell (e.g., another portion of the charge storage layer 54 at a level of another word-line-level electrically conductive layer 46) in a second device level of the array of monolithic three-dimensional NAND strings. The silicon substrate can contain an integrated circuit comprising a driver circuit (e.g., a subset of the least one semiconductor device 700) for the memory device located thereon. The word-line-level electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 160, 260), wherein at least one end portion 60 of each of the plurality of semiconductor channels (59, 11, 160, 260) extends substantially perpendicular to a top surface of the substrate (9, 10) and comprising a respective one of the vertical semiconductor channels (160, 260); and a plurality of charge storage elements (e.g., portions of the memory films 50, i.e., portions of the charge storage layer 54). Each charge storage element can be located adjacent to a respective one of the plurality of semiconductor channels (59, 11, 160, 260).

Subsequently, interconnect via structures 98 embedded in an interconnect-via-level dielectric layer (not shown) can be formed on a respective one of the drain contact via structures 88. The interconnect via structures can be laterally elongated along the second horizontal direction to enable tight-pitch wiring for bit lines 108, which are formed on a respective subset of the interconnect via structures 98. The bit lines 108 can be embedded in a bit-line-level dielectric layer (not shown).

FIGS. 19A-19J are sequential vertical cross-sectional views of a region including a pair of drain-select-level openings during formation of drain-select-level pillar structures 158 in an alternative configuration according to an embodiment of the present disclosure.

Figure 19A:
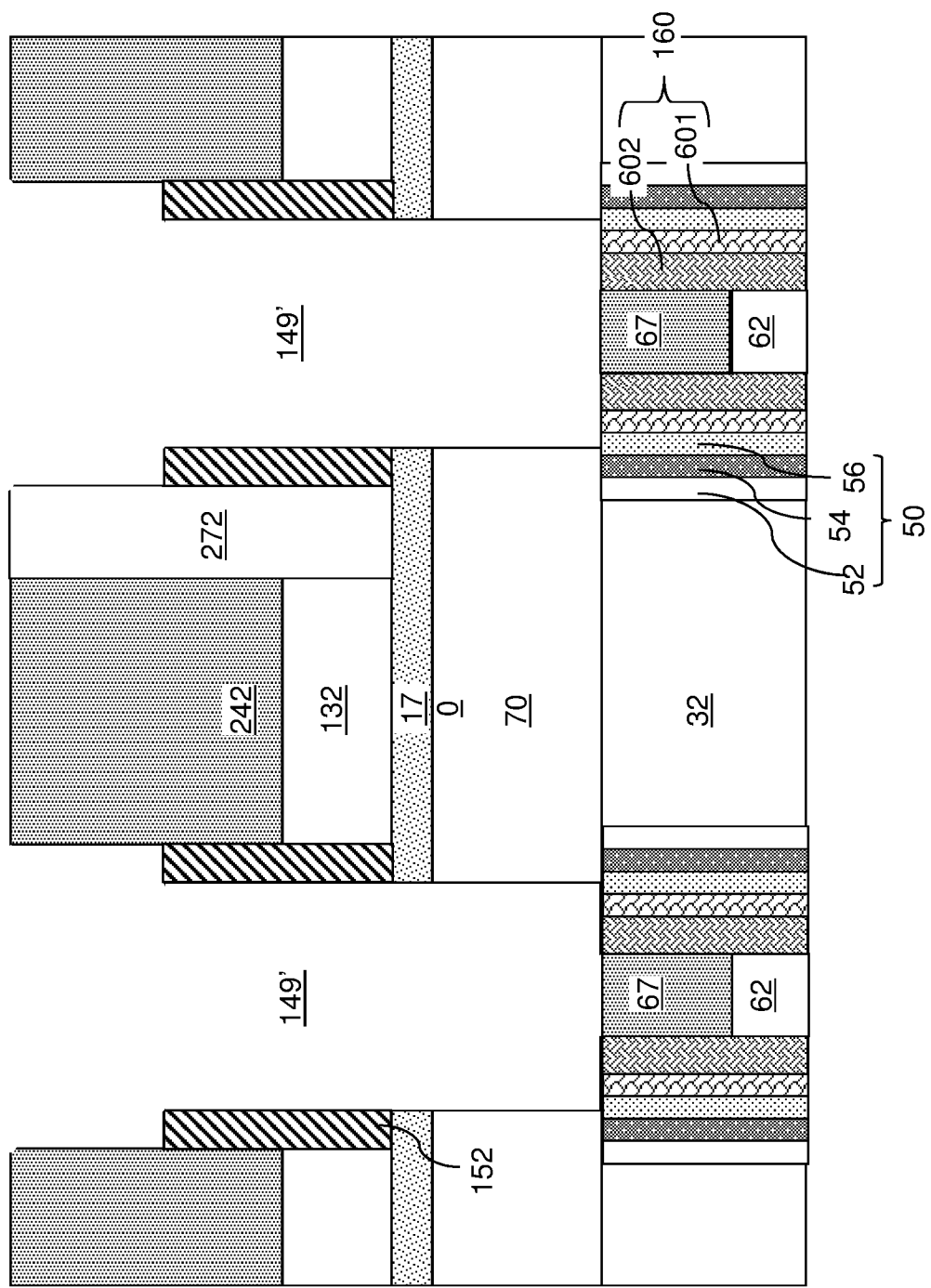
FIGS. 19A-19I are sequential vertical cross-sectional views of a region including a pair of drain-select-level openings during formation of drain-select-level pillar structures in an alternative configuration according to an embodiment of the present disclosure.

Referring to FIG. 19A, an alternative configuration for drain-select-level openings can be derived from the exemplary structure illustrated in FIG. 10A by performing the processing steps of FIG. 10B with a modification to an anisotropic etch chemistry. Cylindrical gate electrodes 152 are formed in an upper portion of the drain-select-level material layers (70, 170, 132, 232, 242), such as at the level of the drain-select-level sacrificial layer 242, the dielectric isolation layer 232, and the drain-select-level insulating layer 132. The materials of the dielectric etch stop material layer 170 and the insulating cap layer 70 can be etched during, or after, recessing of the material of the cylindrical gate electrodes 152 selective to the material of the drain-select-level sacrificial material layer 242. In one embodiment, the chemistry of the anisotropic etch process that etches the material of the cylindrical gate electrodes 152 to sequentially etch through the materials of the dielectric etch stop material layer 170 and the insulating cap layer 70 selective to the material of the drain-select-level sacrificial material layer 242. Alternatively, an etch step can be added after formation of the cylindrical gate electrodes 152 to etch through the materials of the dielectric etch stop material layer 170 and the insulating cap layer 70 selective to the material of the drain-select-level sacrificial material layer 242.

Drain-select-level cavities 149' are formed through the drain-select-level sacrificial material layer 242, the drain-select-level insulating layer 132, the dielectric etch stop material layer 170, and the insulating cap layer 70 by the anisotropic etch process. Each drain-select-level cavity 149' can be formed within an area enclosed by a cylindrical gate electrode 152. A bottom surface of each drain-select-level 149' comprises a top surface of a sacrificial dielectric material portion 67.

Figure 19B:
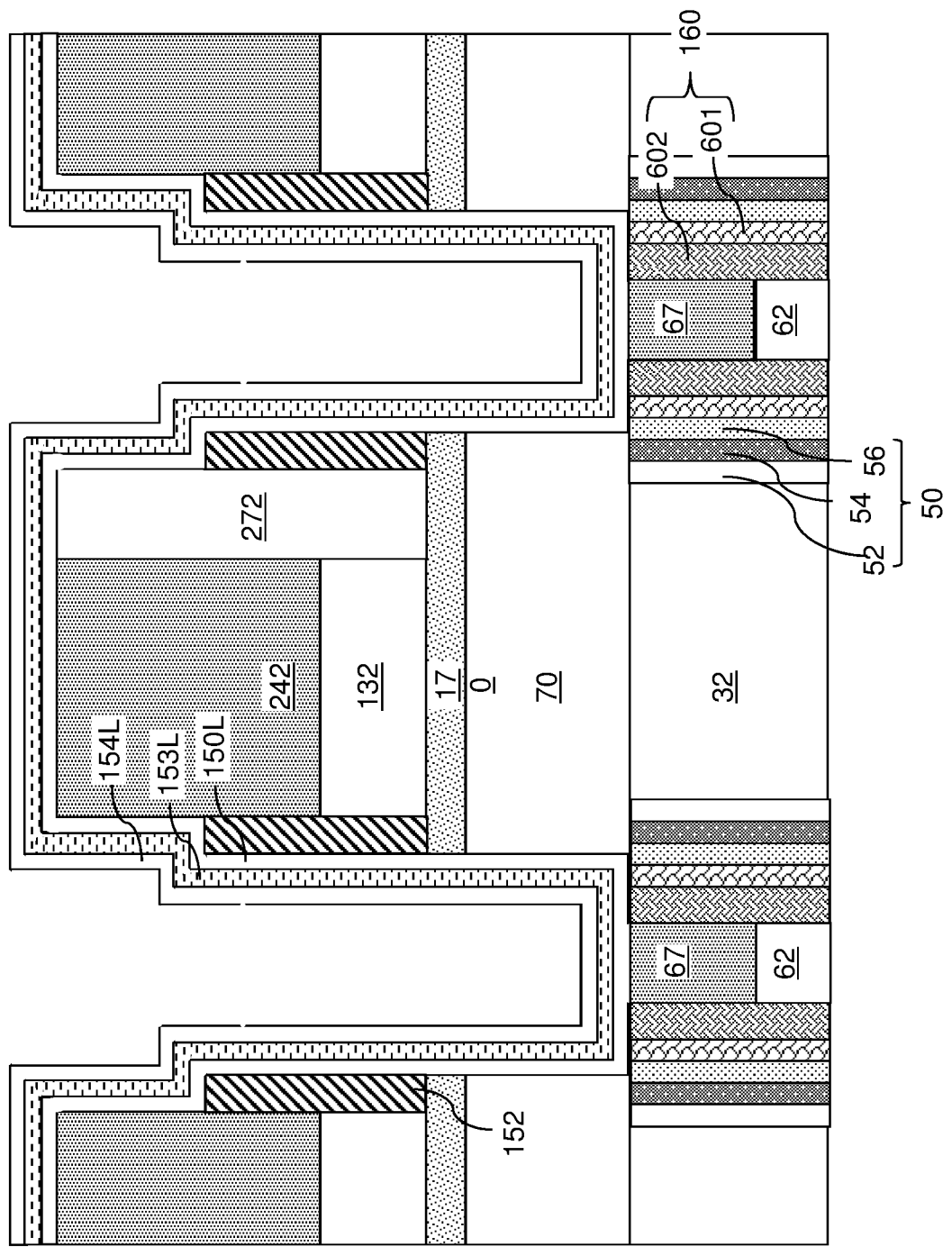

Referring to FIG. 19B, continuous material layers (150L, 153L, 154L) can be sequentially deposited in the drain-select-level cavities 149' and over the drain-select-level sacrificial material layer 242 in the same manner as in the processing steps of FIG. 10C. The gate dielectric layer 150L can be formed within each drain-select-level cavity 149'.

Figure 19C:
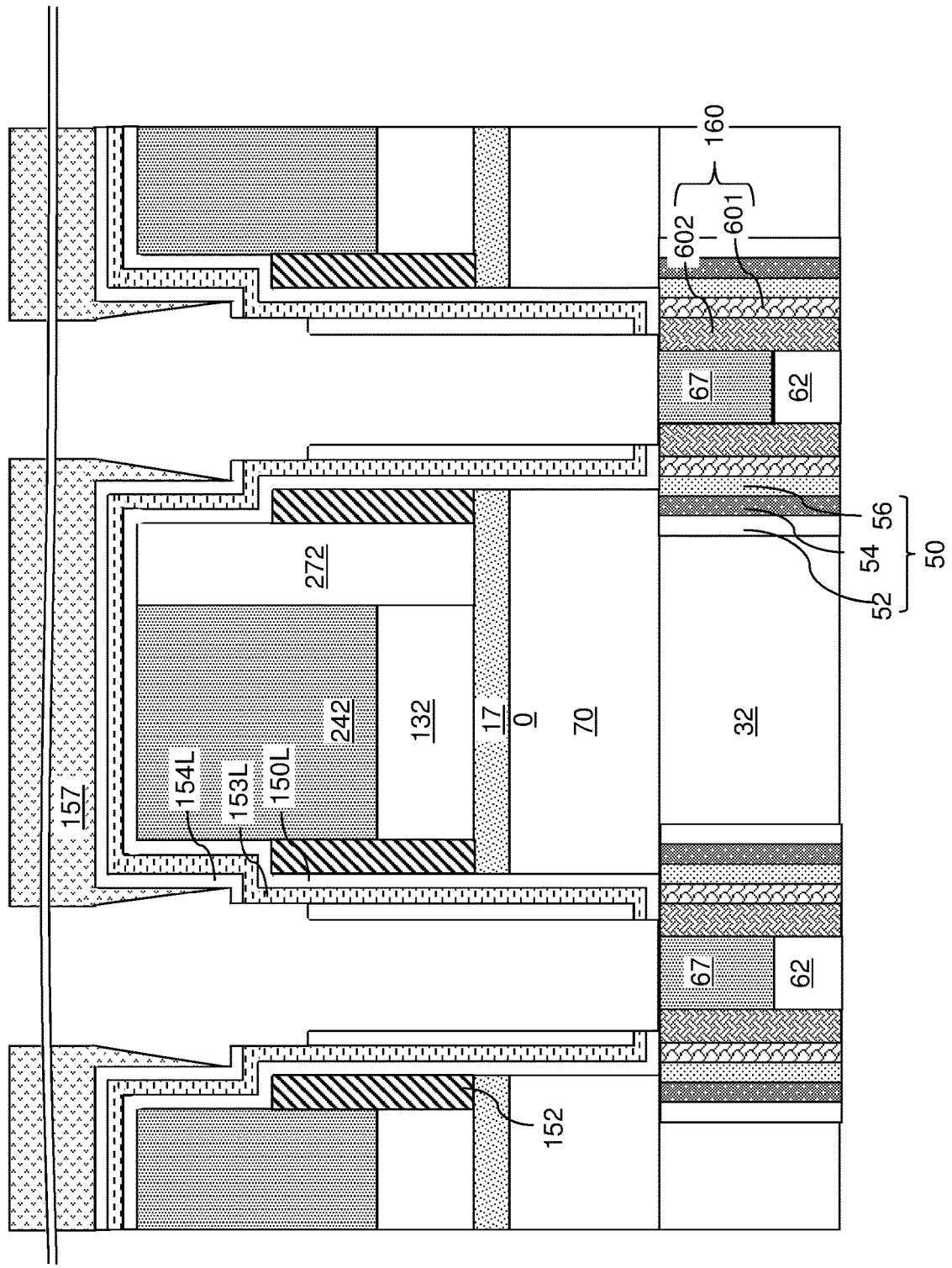

Referring to FIG. 19C, a patterning film 157 can be anisotropically deposited over the exemplary structure in the same manner as in the processing steps of FIG. 10D. An anisotropic etch process is performed to etch through material portions of the patterning film 157, the cover dielectric material layer 154L, the cover semiconductor channel material layer 153L, and the gate dielectric layer 150L located at the bottom of the drain-select-level openings 149. The anisotropic etch process includes a first step that etches through the portions of the patterning film 157 located at the bottom of the drain-select-level openings 149, a second step that etches through the portions of the cover dielectric material layer 154L at the bottom of the drain-select-level openings 149 selective to the material of the patterning film 157, a third step that etches through the portions of the cover semiconductor channel material layer 153L selective to the material of the patterning film 157, and a fourth step that etches through the material of the gate dielectric layer 150L at the bottom of the drain-select-level openings 149 selective to the material of the patterning film 157.

A memory opening fill structure 58 is physically exposed at the bottom of each drain-select-level cavity 149'. A top surface of a sacrificial dielectric material portion 67 is physically exposed underneath each drain-select-level cavity 149'. Each drain-select-level cavity 149' comprises a void that is laterally surrounded by a gate dielectric, which is a vertically extending portion of the gate dielectric layer 150L. In one embodiment, the cover dielectric material layer 154L may be divided into multiple discrete portions depending on the thickness of the cover dielectric material layer 154L and a taper angle of sidewalls of the cover dielectric material layer 154L. The patterning film 157 may be consumed during the anisotropic etch process, or may be removed after the anisotropic etch process, for example, by ashing.

Figure 19D:
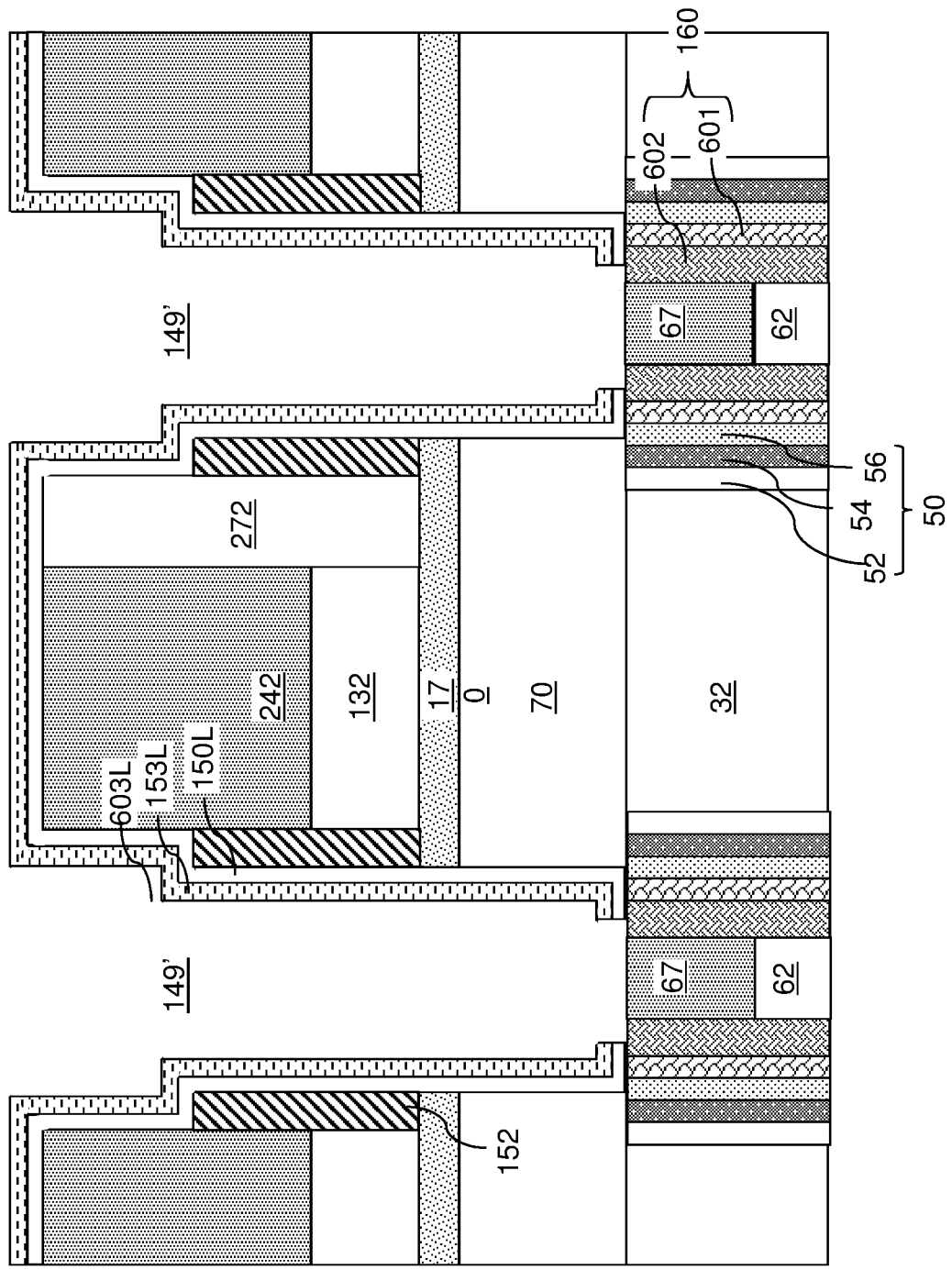

Referring to FIG. 19D, an isotropic etch process can be performed to remove remaining portions of the cover dielectric material layer 154L. For example, if the cover dielectric material layer 154L includes silicon oxide, a wet etch using dilute hydrofluoric acid can be performed to remove the cover dielectric material layer 154L. Surfaces of the cover semiconductor channel material layer 153L can be physically exposed after removal of the cover dielectric material layer 154L.

Figure 19E:
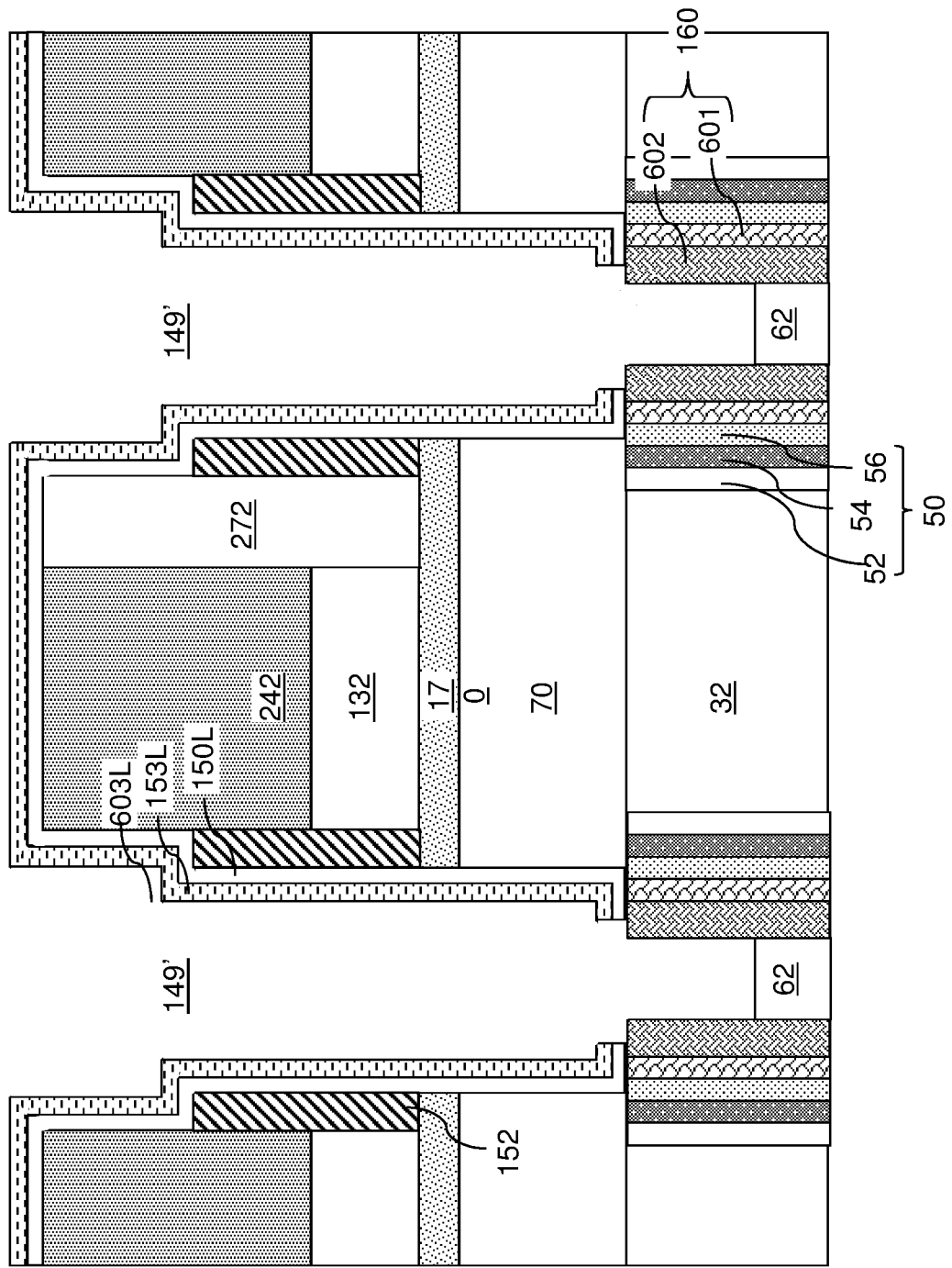

Referring to FIG. 19E, the sacrificial dielectric material portions 67 are removed from underneath the drain-select-level cavities 149' selective to the materials of the word-line-level semiconductor channel portions 160, the cover semiconductor channel material layer 153L, the insulating cap layer 70, and the dielectric etch stop material layer 170 underneath the drain-select-level openings by performing the processing steps of FIG. 10F.

Figure 19F:
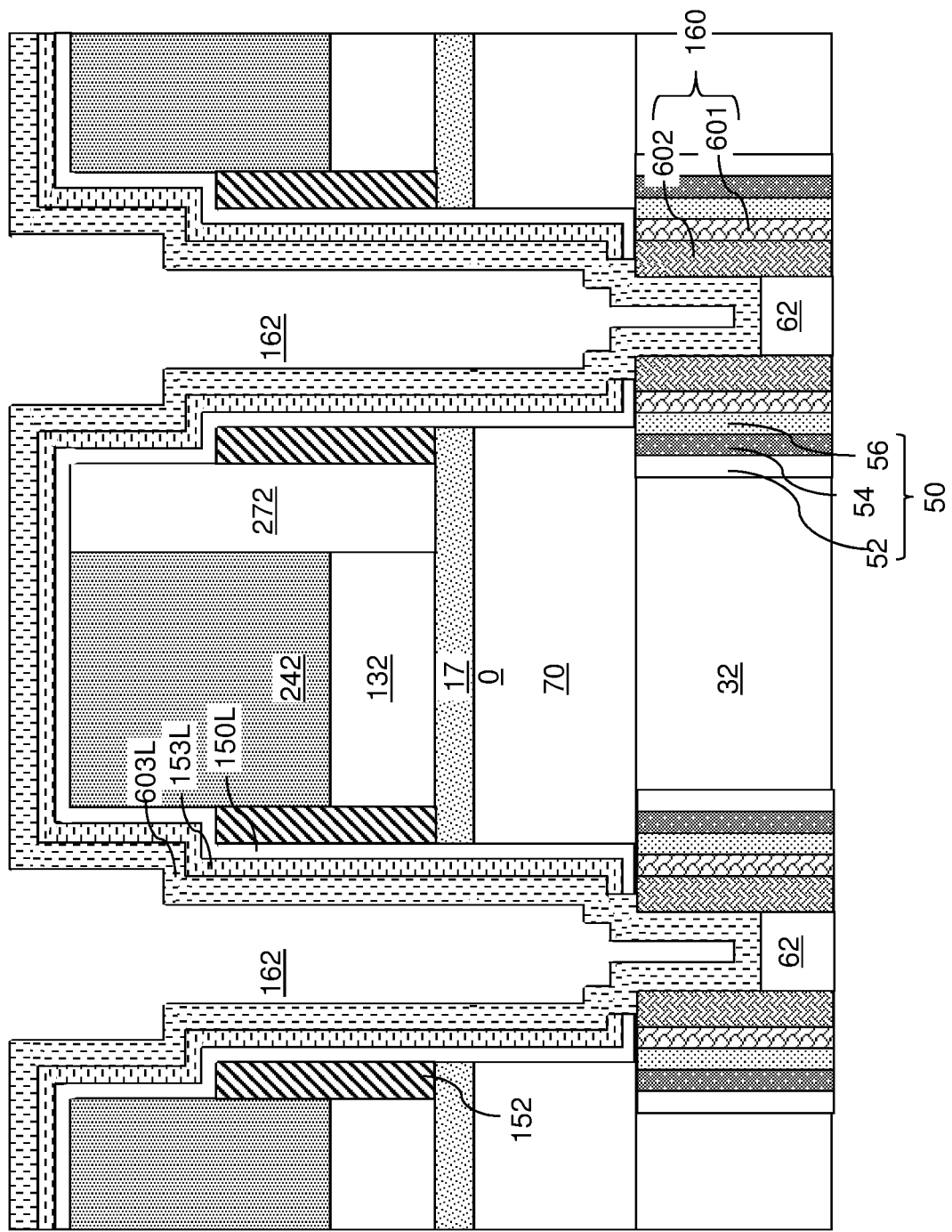

Referring to FIG. 19F, a drain-select-level semiconductor channel layer 603L can be deposited at the periphery of each drain-select-level cavity 149' by a conformal deposition process such as low pressure chemical vapor deposition (LPCVD). The processing steps of FIG. 10G can be performed.

Figure 19G:
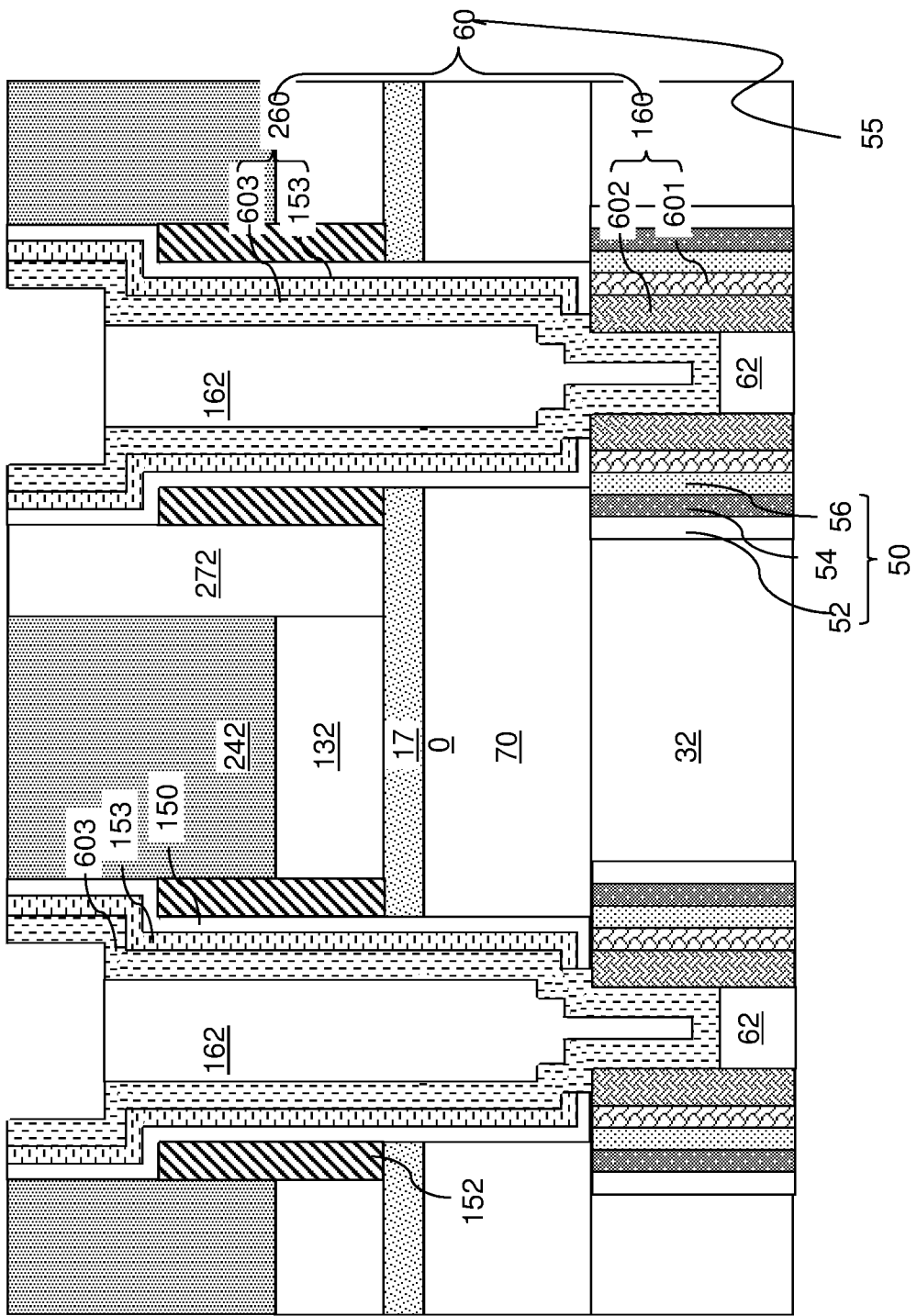

Referring to FIG. 19G, a drain-select-level dielectric core 162 can be formed within each drain-select-level cavity 149' by performing the processing steps of FIG. 10H.

Figure 19H:
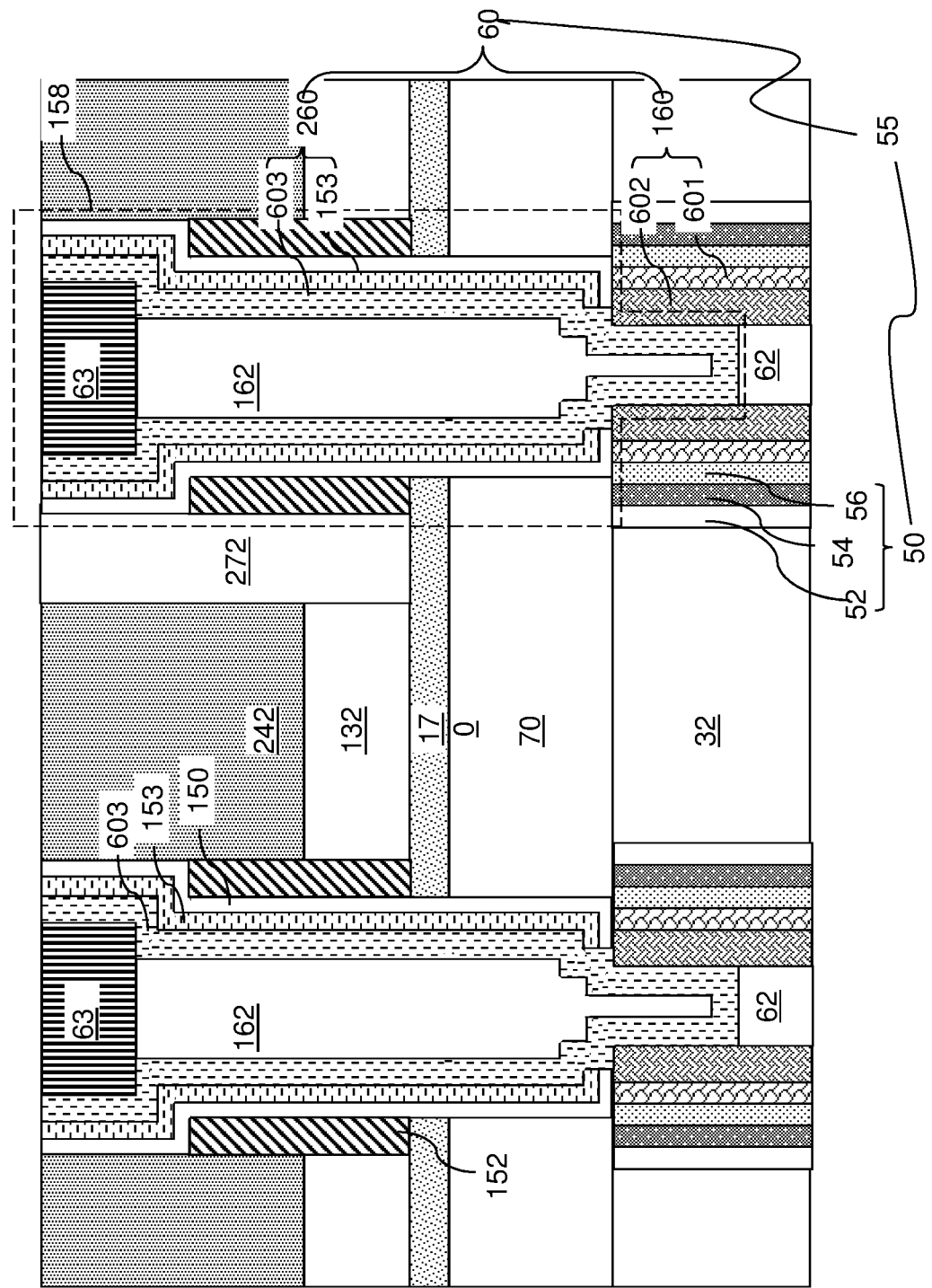

Referring to FIG. 19H, a drain region 63 can be formed over each drain-select-level dielectric core 162 by performing the processing steps of FIG. 10I. A drain-select-level pillar structure 158 is formed within each drain-select-level opening.

Figure 19I:
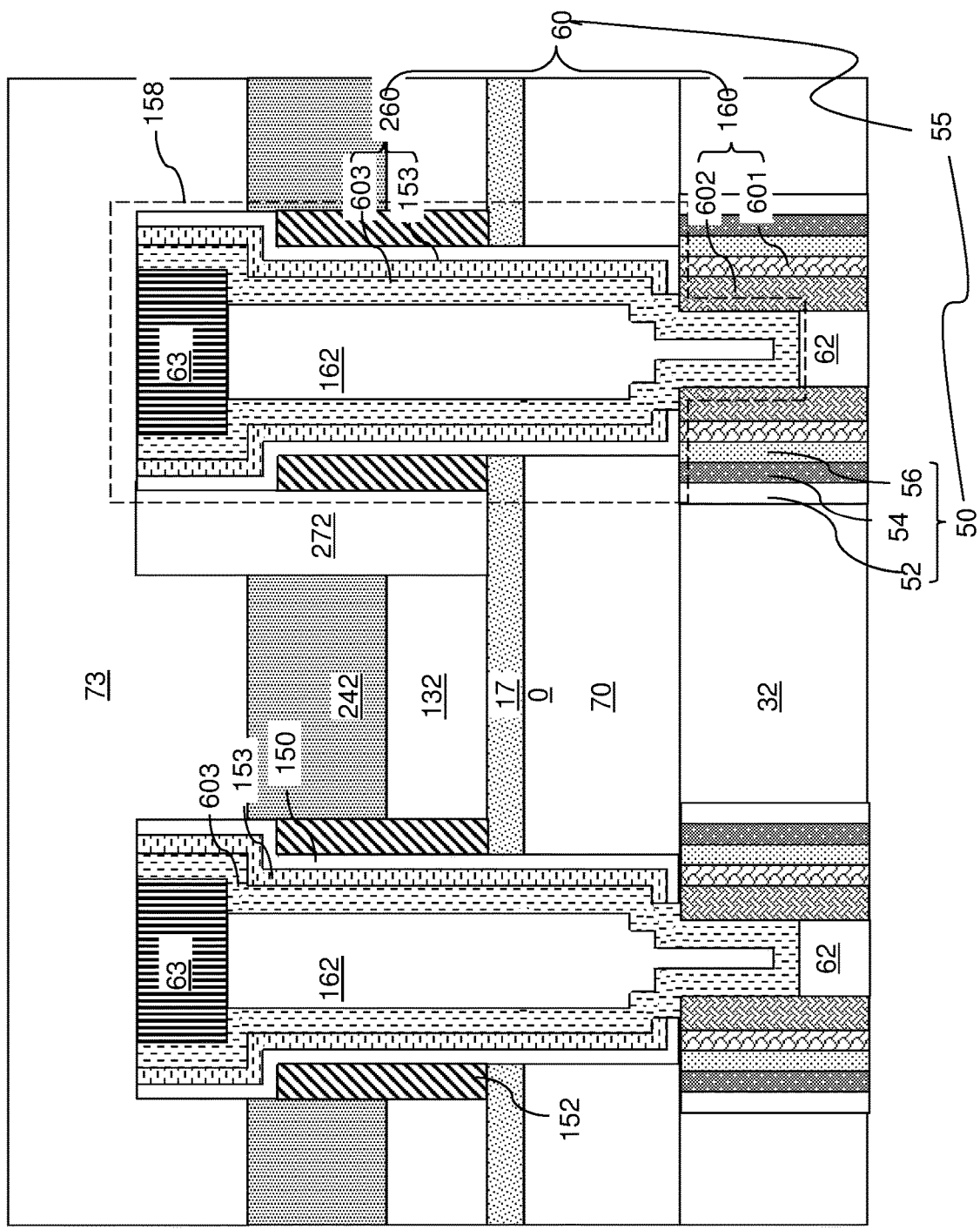

Referring to FIG. 19I, the drain-select-level sacrificial material layer 242 is vertically recessed, and a contact level dielectric layer 73 can be formed over the drain regions 63 by performing the processing steps of FIG. 10J.

Each drain-select-level pillar structure 158 overlies a respective memory opening fill structure 58, and includes a cylindrical gate electrode 152, a gate dielectric 150, a drain-select-level semiconductor channel portion 260, a drain-select-level dielectric core 162, and a drain region 63.

A vertical interface between the drain-select-level semiconductor channel portion 260 and the word-line-level semiconductor channel portion 160 is vertically coincident with an interface between the word-line-level semiconductor channel portions 160 and the word-line-level dielectric core 62 within each vertical stack of a memory opening fill structure 58 and a drain-select-level pillar structure 158. The gate dielectric 150 directly contacts a top surface of the word-line-level semiconductor channel portion 160. A vertical interface between the drain-select-level semiconductor channel portion 260 and a bottom portion of the gate dielectric 150 is laterally offset from the vertical interface between the word-line-level semiconductor channel portion 160 and the word-line-level dielectric core 62. In one embodiment, a region of the drain-select-level semiconductor channel portion 260 laterally surrounded by the bottom portion of the gate dielectric 150 has a greater lateral extent than a region of the drain-select-level semiconductor channel portion laterally surrounded by the word-line-level semiconductor channel portion. The insulating cap layer 70 can contact a topmost one of the insulating layers 32 and can laterally surround the gate dielectric 150. The dielectric etch stop material layer 170 overlies the insulating cap layer 70 and laterally surrounds the gate dielectric 150 and underlies the cylindrical gate electrode 152.

Figure 20:
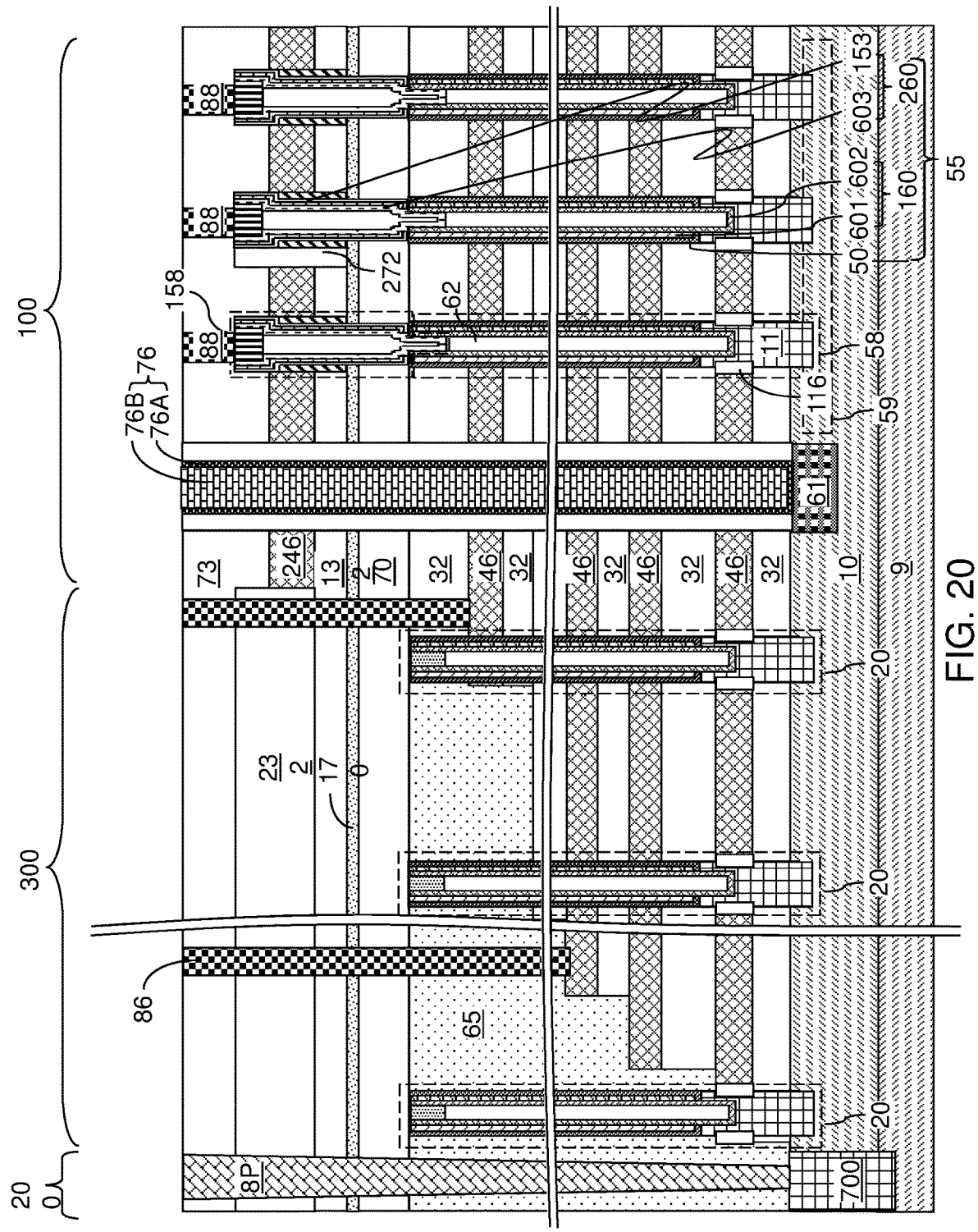
FIG. 20 is a schematic vertical cross-sectional view of the exemplary structure including the drain-select-level pillar structures in the alternative configuration after formation of additional contact via structures according to an embodiment of the present disclosure.

Referring to FIG. 20, subsequent processing steps of FIGS. 11, 12A and 12B, 13, 14A-14D, 15, 16, 17A and 17B, and 18A and 18B can be performed.

Referring to all drawings and according to various embodiments of the present disclosure, a three-dimensional memory device is provided, which comprises: an alternating stack of insulating layers 32 and word-line-level electrically conductive layers 46 located over a substrate (9, 10); a memory opening 49 vertically extending through the alternating stack (32, 46); a memory opening fill structure 58 located within the memory opening 49 and comprising a memory film 50, a word-line-level semiconductor channel portion 160 laterally surrounded by the memory film 50, and a word-line-level dielectric core 62 laterally surrounded by the word-line-level semiconductor channel portion 160; and a drain-select-level pillar structure 158 overlying the memory opening fill structure 58 and comprising a cylindrical gate electrode 152, a gate dielectric 150, and a drain-select-level semiconductor channel portion 260, wherein an interface between the drain-select-level semiconductor channel portion 260 and the word-line-level semiconductor channel portion 160 is vertically coincident with an interface between the word-line-level semiconductor channel portions 160 and the word-line-level dielectric core 62.

In one embodiment, the three-dimensional memory device can comprise an insulating cap layer 70 overlying the alternating stack (32, 46), wherein a vertical interface between the drain-select-level semiconductor channel portion 260 and the insulating cap layer 70 is laterally offset from the interface between the word-line-level semiconductor channel portion 160 and the word-line-level dielectric core 62.

In one embodiment, the drain-select-level pillar structure 158 comprises: a drain-select-level dielectric core 162 that is laterally surrounded by the drain-select-level semiconductor channel portion 260; and a drain region 3 contacting an upper end portion of the drain-select-level semiconductor channel portion 260 and having a doping of an opposite conductivity type than the drain-select-level semiconductor channel portion 260 and the word-line-level semiconductor channel portion 160. At least one drain-select-level electrically conductive layer 246 can laterally contact at least a section of a cylindrical outer sidewall of each cylindrical gate electrode 152. In one embodiment, a drain-select-level isolation structure 272 including a concave cylindrical surface can contact another section of the cylindrical outer sidewall of the cylindrical gate electrode 152.

Referring to all drawings and according to various embodiments of the present disclosure, a method of forming a three-dimensional memory device is provided, which comprises: forming an alternating stack of insulating layers 32 and word-line-level spacer material layers over a substrate (9, 10), wherein the word-line-level spacer material layers are formed as, or are subsequently replaced with, word-line-level electrically conductive layers 46; forming a memory opening 49 through the alternating stack; forming a memory opening fill structure 58 in the memory opening, wherein the memory opening fill structure comprises a memory film 50, a word-line-level semiconductor channel portion 160 laterally surrounded by the memory film 50, a word-line-level dielectric core 62 laterally surrounded by the word-line-level semiconductor channel portion 160, and a sacrificial dielectric material portion 67; forming drain-select-level material layers over the alternating stack and the memory opening fill structure; forming a drain-select-level cavity extending through the drain-select-level material layers and over the memory opening fill structure; removing the sacrificial dielectric material portion 67 selective to the word-line-level semiconductor channel portions underneath the drain-select-level opening; and forming a drain-select-level semiconductor channel portion 260 directly on the word-line-level semiconductor channel portion 160. The method may further comprise: forming a drain-select-level opening at least through an upper portion of the drain-select-level material layers; forming a cylindrical gate electrode at a periphery of the drain-select-level opening; forming a gate dielectric on an inner sidewall of the cylindrical gate electrode, wherein: the drain-select-level cavity comprises a void that is laterally surrounded by the gate dielectric; and the drain-select-level semiconductor channel portion is formed directly on an inner sidewall of the gate dielectric.

In an embodiment, forming the drain-select-level material layers comprises: forming an insulating cap layer over the alternating stack; forming a dielectric etch stop material layer over the insulating cap layer; and forming a drain-select-level sacrificial layer over the dielectric etch stop material layer. Such embodiments may further comprise: forming a drain-select-level isolation structure laterally extending along a horizontal direction through the drain-select-level sacrificial layer; forming a drain-select-level opening through a portion of the drain-select-level isolation structure and a portion of the drain-select-level sacrificial layer, wherein the cylindrical gate electrode and the gate dielectric are formed within the drain-select-level opening; and replacing remaining portions of the drain-select-level sacrificial layer with a plurality of drain-select-level electrically conductive layers. Such embodiments may further comprise: forming a drain-select-level opening through the drain-select-level sacrificial material layer, wherein a bottom surface of the drain-select-level opening comprises a surface portion of the dielectric etch stop material layer; forming the cylindrical gate electrode and the gate dielectric in the drain-select-level opening; and vertically extending a void laterally surrounded by the gate dielectric through the dielectric etch stop material layer and the insulating cap layer using an anisotropic etch process to form the drain-select-level cavity. Such an embodiment may further comprise laterally recessing a portion of the insulating cap layer around the drain-select-level cavity prior to formation of the drain-select-level semiconductor channel portion.

An embodiment further comprises: forming a cylindrical gate electrode in an upper portion of the drain-select-level material layers; forming the drain-select-level cavity through the drain-select-level sacrificial material layer, the dielectric etch stop material layer, and the insulating cap layer using an anisotropic etch process within an area enclosed by the cylindrical gate electrode, wherein a bottom surface of the drain-select-level cavity comprises a top surface of the sacrificial dielectric material portion; depositing a gate dielectric material layer in the drain-select-level cavity; and anisotropically etching bottom portions of the gate dielectric material layer, wherein the gate dielectric comprises a remaining portion of the gate dielectric material layer.

An embodiment further comprises: forming a drain-select-level dielectric core within a volume laterally surrounded by the drain-select-level semiconductor channel portion; and forming a drain region at an upper end portion of the drain-select-level semiconductor channel portion, wherein the drain region has a doping of an opposite conductivity type than the drain-select-level semiconductor channel portion and the word-line-level semiconductor channel portion.

The various embodiments of the disclosure can be used to form various structures including a multilevel memory structure, non-limiting examples of which include semiconductor devices such as three-dimensional monolithic memory array devices comprising a plurality of NAND memory strings. The multi-level self-aligned drain select level isolation structures provided by various embodiments can provide a compact device layout and reduce a chip size without the need to allocate an extra dedicated area to the drain-select-level isolation structure, as well as providing a simpler self aligned fabrication process. Direct contact between the two channel portions reduces contact resistance and increases the cell current for the vertical field effect transistor.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    an alternating stack of insulating layers and word-line-level electrically conductive layers located over a substrate;
    a memory opening vertically extending through the alternating stack;
    a memory opening fill structure located within the memory opening and comprising a memory film, a word-line-level semiconductor channel portion laterally surrounded by the memory film, and a word-line-level dielectric core laterally surrounded by the word-line-level semiconductor channel portion; and
    a drain-select-level pillar structure overlying the memory opening fill structure and comprising a cylindrical gate electrode, a gate dielectric, a drain-select-level semiconductor channel portion, a drain-select-level dielectric core that is laterally surrounded by the drain-select-level semiconductor channel portion, and a drain region contacting an upper end portion of the drain-select-level semiconductor channel portion and having a doping of an opposite conductivity type than the drain-select-level semiconductor channel portion and the word-line-level semiconductor channel portion, wherein an interface between the drain-select-level semiconductor channel portion and the word-line-level semiconductor channel portion is vertically coincident with an interface between the word-line-level semiconductor channel portion and the word-line-level dielectric core, and a lower end portion of the drain-select-level semiconductor channel portion is located between the drain-select-level dielectric core and the word-line-level dielectric core.

2. The three-dimensional memory device of claim 1, further comprising an insulating cap layer overlying the alternating stack, wherein a vertical interface between the drain-select-level semiconductor channel portion and the insulating cap layer is laterally offset from the interface between the word-line-level semiconductor channel portion and the word-line-level dielectric core.

3. The three-dimensional memory device of claim 2, wherein a portion of the drain-select-level semiconductor channel portion laterally surrounded by the insulating cap layer has a greater lateral extent than a portion of the drain-select-level semiconductor channel layer laterally surrounded by the word-line-level semiconductor channel portion.

4. The three-dimensional memory device of claim 3, further comprising a dielectric etch stop material layer overlying the insulating cap layer, wherein a portion of the drain-select-level semiconductor channel portion laterally surrounded by the dielectric etch stop material layer has a lesser lateral extent than the portion of the drain-select-level semiconductor channel portion laterally surrounded by the insulating cap layer.

5. The three-dimensional memory device of claim 3, wherein the gate dielectric and the cylindrical gate electrode are vertically spaced from the word-line-level semiconductor channel portion by the insulating cap layer and the dielectric etch stop material layer.

6. The three-dimensional memory device of claim 1, wherein the gate dielectric directly contacts a top surface of the word-line-level semiconductor channel portion.

7. The three-dimensional memory device of claim 6, wherein:
    an interface between the drain-select-level semiconductor channel portion and a bottom portion of the gate dielectric is laterally offset from the interface between the word-line-level semiconductor channel portion and the word-line-level dielectric core; and
    a region of the drain-select-level semiconductor channel portion laterally surrounded by the bottom portion of the gate dielectric has a greater lateral extent than a region of the drain-select-level semiconductor channel portion laterally surrounded by the word-line-level semiconductor channel portion.

8. The three-dimensional memory device of claim 7, further comprising:
an insulating cap layer contacting a topmost one of the insulating layers and laterally surrounding the gate dielectric; and
a dielectric etch stop material layer overlying the insulating cap layer and laterally surrounding the gate dielectric and underlying the cylindrical gate electrode.

9. The three-dimensional memory device of claim 1, further comprising a dielectric etch stop material layer underlying the cylindrical gate electrode, wherein a region of the drain-select-level dielectric core underlying the dielectric etch stop material layer has a greater lateral extent than a region of the drain-select-level dielectric core that is laterally surrounded by the dielectric etch stop material layer.

10. The three-dimensional memory device of claim 1, further comprising at least one drain-select-level electrically conductive layer laterally contacting at least a section of a cylindrical outer sidewall of the cylindrical gate electrode.

11. The three-dimensional memory device of claim 10, further comprising a drain-select-level isolation structure including a concave cylindrical surface that contacts another section of the cylindrical outer sidewall of the cylindrical gate electrode.

* * * * *